US007489016B2

(12) United States Patent
Williams et al.

(10) Patent No.: US 7,489,016 B2
(45) Date of Patent: Feb. 10, 2009

(54) TRENCH-CONSTRAINED ISOLATION DIFFUSION FOR INTEGRATED CIRCUIT DIE

(75) Inventors: Richard K. Williams, Cupertino, CA (US); Michael E. Cornell, Campbell, CA (US); Wai Tien Chan, Hong Kong (CN)

(73) Assignees: Advanced Analogic Technologies, Inc., Santa Clara, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 345 days.

(21) Appl. No.: 11/204,215

(22) Filed: Aug. 15, 2005

(65) Prior Publication Data

US 2005/0272207 A1    Dec. 8, 2005

Related U.S. Application Data

(62) Division of application No. 10/218,678, filed on Aug. 14, 2002, now Pat. No. 6,943,426.

(51) Int. Cl.
*H01L 23/58* (2006.01)
(52) U.S. Cl. .................................... 257/500
(58) Field of Classification Search ................ 257/500, 257/505–506, 511, E29.201
See application file for complete search history.

(56) References Cited

U.S. PATENT DOCUMENTS

| 4,478,655 | A | 10/1984 | Nagakubo et al. | ............ 148/175 |
| 4,855,244 | A | 8/1989 | Hutter et al. | .................. 437/31 |
| 5,410,175 | A | 4/1995 | Kyomasu et al. | ............ 257/458 |
| 6,417,554 | B1 | 7/2002 | Ahmed | ........................ 257/477 |
| 6,420,771 | B2 | 7/2002 | Gregory | .................... 257/517 |
| 6,657,242 | B1 | 12/2003 | Norstrom et al. | ............ 257/197 |
| 6,657,262 | B2 | 12/2003 | Patti | ........................... 257/370 |

(Continued)

FOREIGN PATENT DOCUMENTS

EP    0589675    3/1994

(Continued)

*Primary Examiner*—Nathan W Ha
(74) *Attorney, Agent, or Firm*—Patentability Associates

(57) ABSTRACT

A semiconductor substrate includes a pair of trenches filled with a dielectric material. Dopant introduced into the mesa between the trenches is limited from diffusing laterally when the substrate is subjected to thermal processing. Therefore, semiconductor devices can be spaced more closely together on the substrate, and the packing density of the devices can be increased. Also trench constrained doped region diffuse faster and deeper than unconstrained diffusions, thereby reducing the time and temperature needed to complete a desired depth diffusion. The technique may be used for semiconductor devices such as bipolar transistors as well as isolation regions that electrically isolate the devices from each other. In one group of embodiments, a buried layer is formed at an interface between an epitaxial layer and a substrate, at a location generally below the dopant in the mesa. When the substrate is subjected to thermal processing, the buried layer diffuses upward, the dopant in the mesa diffuses downward until the two dopants merge to form an isolation region or a sinker extending downward from the surface of the epitaxial layer to the buried layer. In another embodiment, dopant is implanted between dielectrically filled trenches at a high energy up to several MeV, then diffused, combining the benefits of deep implantation and trenched constrained diffusion to achive deep diffusions with a minimal thermal budget.

15 Claims, 53 Drawing Sheets

U.S. PATENT DOCUMENTS

| | | |
|---|---|---|
| 6,737,722 B2 | 5/2004 | Yamamoto et al. .......... 257/500 |
| 6,750,526 B2 | 6/2004 | Nakashima ................. 257/509 |
| 6,943,426 B2 | 9/2005 | Williams |
| 6,977,426 B1 | 12/2005 | Gorni et al. ................. 257/553 |
| 7,067,899 B2 | 6/2006 | Kanda et al. ................ 257/556 |
| 2002/0084506 A1 | 7/2002 | Voldman et al. ........... 257/511 |
| 2003/0132453 A1 | 7/2003 | Greenberg et al. .......... 257/197 |
| 2003/0214011 A1 | 11/2003 | Jianjun et al. ............... 257/500 |
| 2005/0269597 A1 | 12/2005 | Williams |
| 2005/0272230 A1 | 12/2005 | Williams |

FOREIGN PATENT DOCUMENTS

| | | |
|---|---|---|
| GB | 2362508 | 11/2001 |
| JP | 63166268 | 7/1988 |

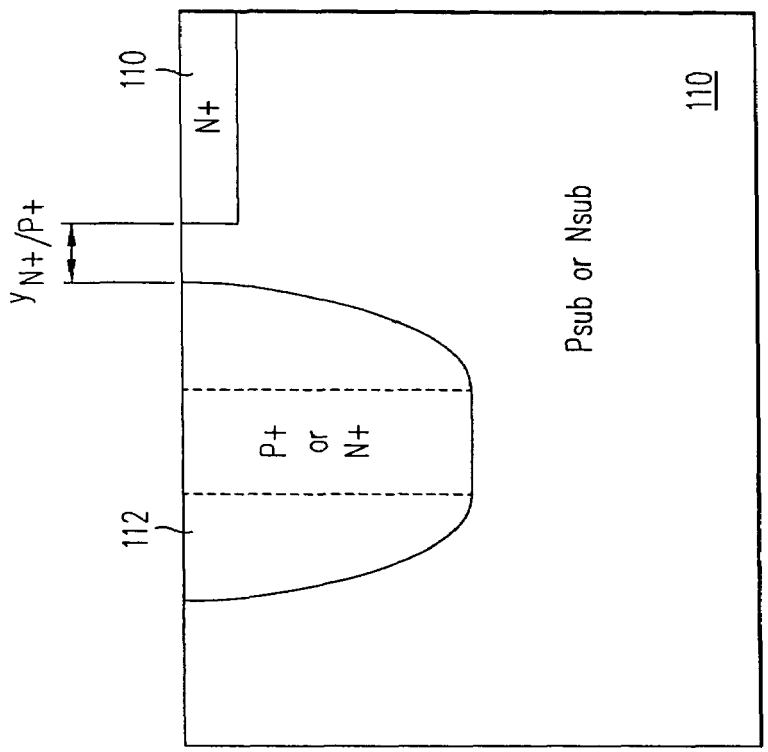
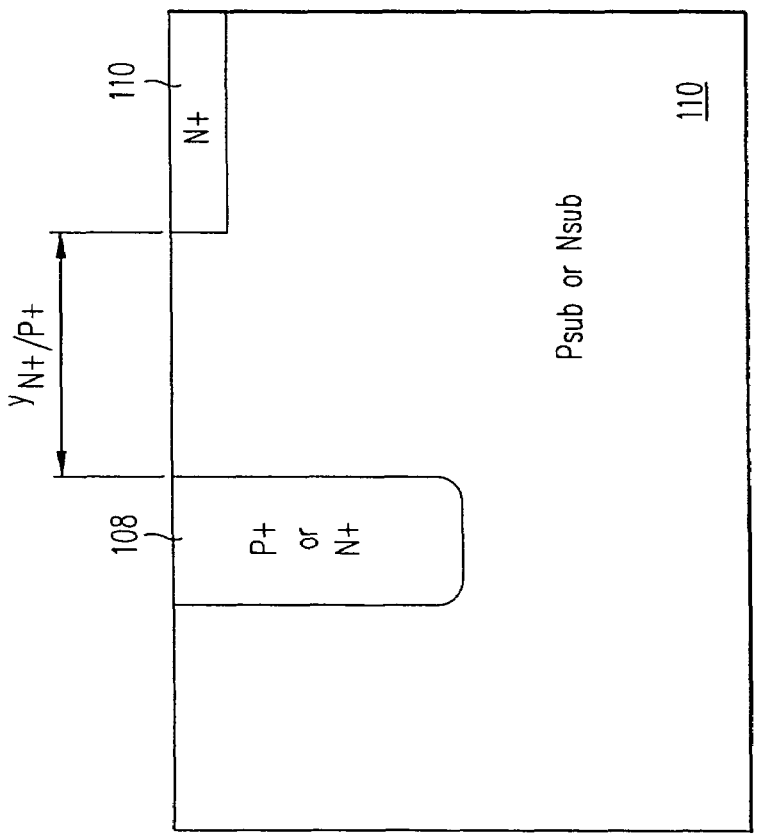
FIG. 3B
(Prior Art)
FIG. 3A
(Prior Art)

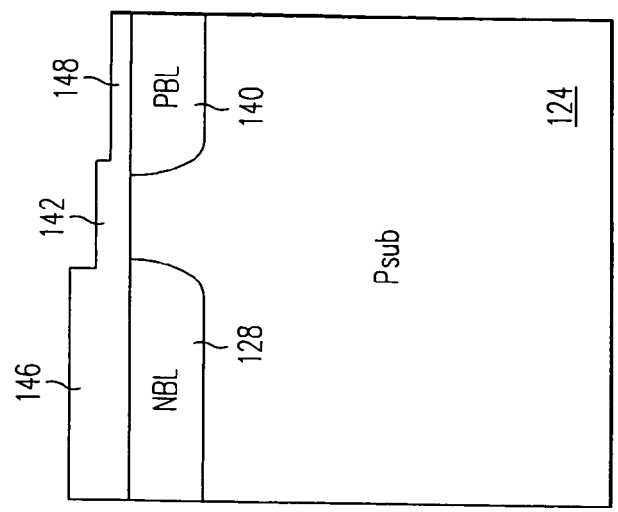
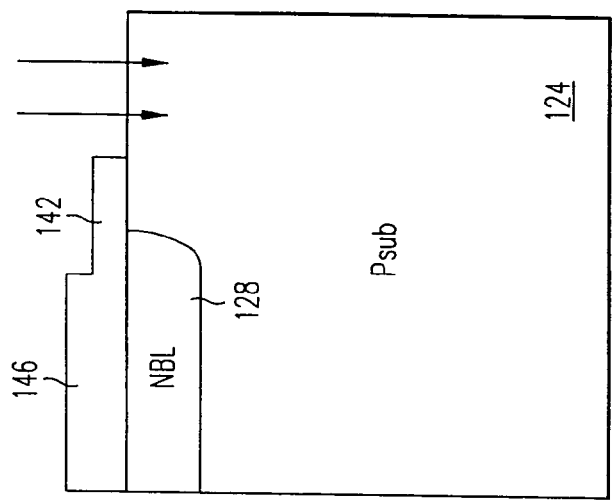
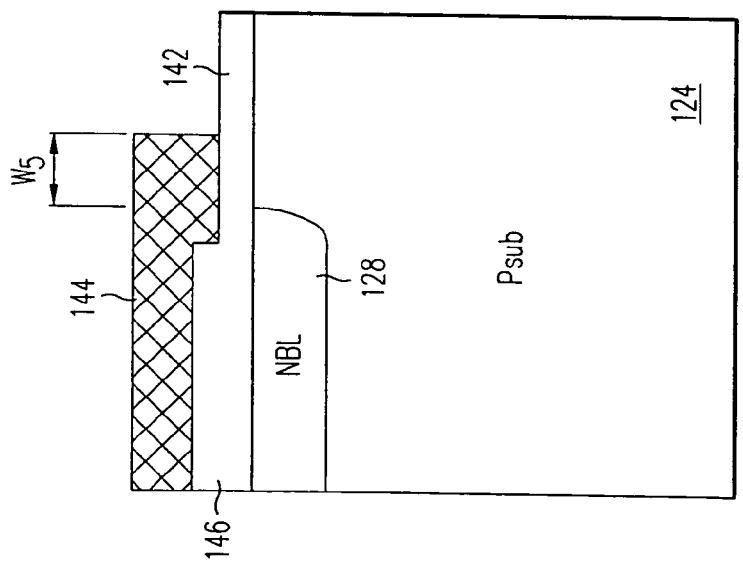
FIG. 7A (Prior Art)
FIG. 7B (Prior Art)
FIG. 7C (Prior Art)

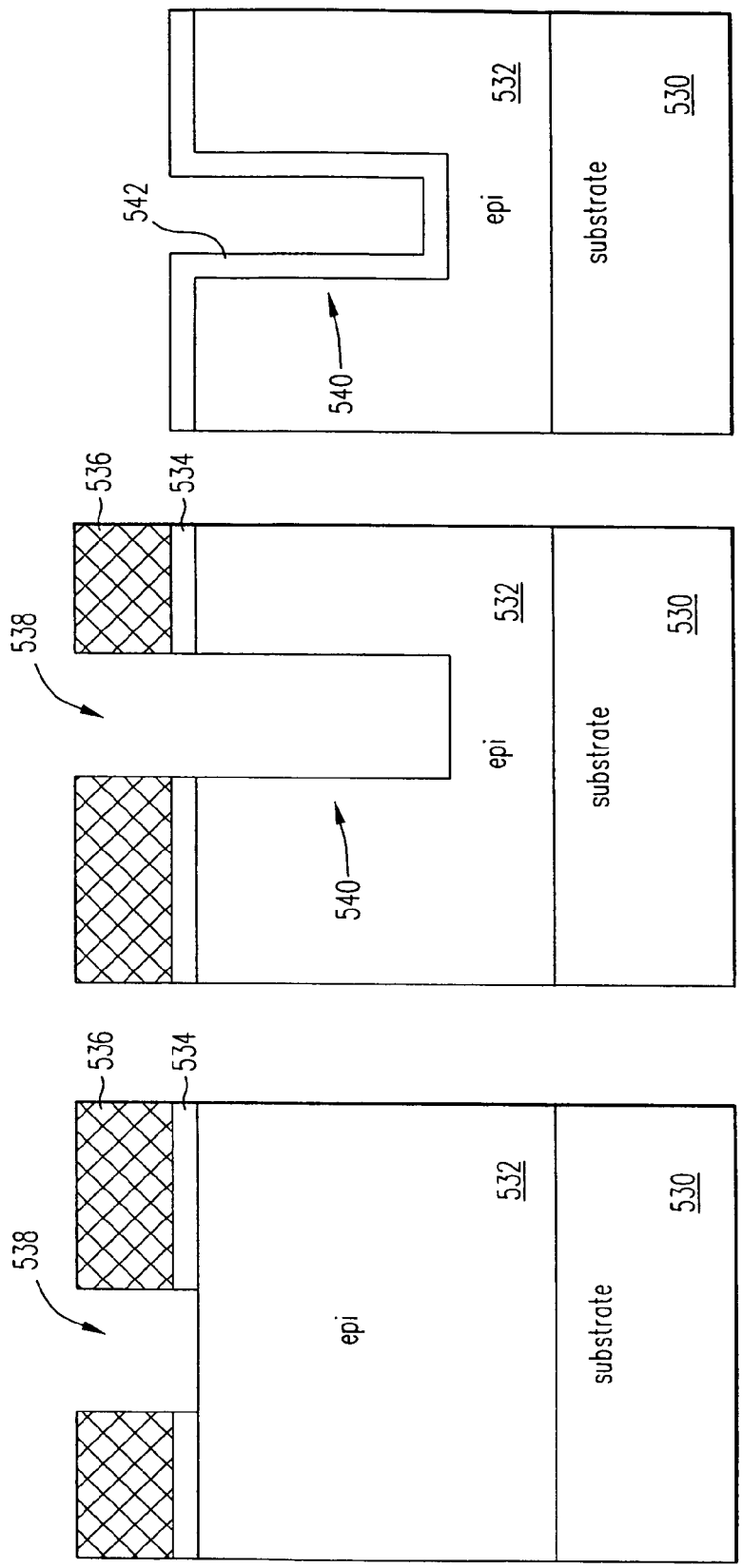

TRENCH-CONSTRAINED ISOLATION DIFFUSION FOR INTEGRATED CIRCUIT DIE

This application is a divisional of application Ser. No. 10/218,678, filed Aug. 14, 2002, which is incorporated herein by reference in its entirety.

FIELD OF THE INVENTION

This invention relates to an isolation structure for junction-isolated integrated semiconductor devices, and in particular complementary analog bipolar (CAB) transistors, and a method of forming the same.

BACKGROUND OF THE INVENTION

As the minimum feature sizes in integrated circuits become smaller, it becomes necessary to increase the packing density of the devices on the integrated circuit (IC) chip. The benefits of smaller devices are largely forfeited if the distance between devices cannot also be decreased.

FIGS. 1-11 illustrate prior art processes and structures and some of the problems that are inherent in those processes and structures.

FIG. 1A illustrates a common method of fabricating a semiconductor device. A dopant is introduced in an N or P substrate 100 through an opening formed in a mask layer 102, which could be an oxide, a nitride, photoresist, or some combination thereof. The dopant could be introduced by ion implantation or by a high-temperature predeposition (i.e. a shallow diffusion where a source of doping from a gaseous or solid source is introduced into the semiconductor). The dopant may then be diffused by heating to form a shallow region 104 as shown in FIG. 1B, or the dopant may diffused at a higher temperature or for a longer time to form a much deeper region 106, as shown in FIG. 1C. Region 104 could be 0.5 to 2 µm deep and region 106 could be 2 µm to 10 µm deep. FIG. 1D is a view of the left side of region 106, showing in detail the lateral spreading of region 106 during the thermal diffusion process. As indcted, the junction dopant spreads laterally as well as vertically during the diffusion. As a general rule, the lateral spreading from the point (0,0) at the edge of the mask opening is equal to about 0.8 times the vertical depth ($x_j$) of the junction. This lateral spreading of dopant limits the horizontal spacing and packing density of devices formed using a conventional thermal diffusion process.

FIGS. 2A and 2B illustrate another problem with diffusion processes, i.e., the depth of the junction can be a function of the width of the mask opening. FIG. 2A shows the results of a diffusion performed after an implant through a mask opening $W_1$, and FIG. 2B shows the results of a diffusion performed after an implant through a mask opening $W_2$, where $W_1 > W_2$. The final depth of the junction in FIG. 2B is less than the depth of the junction in FIG. 2A by a factor η, which is less than one. This phenomenon occurs because the lateral spreading of the dopant when the mask opening is relatively small reduces the surface concentration and the gradient of the doping concentration in a vertical direction more than when the mask opening is large. Thus the dopant diffuses downward more slowly when the mask opening is small, an effect referred to as "starved diffusion". Therefore, the mask opening must be relatively large in order get a deep junction, for example, to create a sidewall isolation region for a thick layer. Again, the necessity of a large mask opening limits the packing density of the semiconductor devices.

FIGS. 3A and 3B exemplify some of the impacts of these problems. Ideally, one would like to form a deep diffusion 108 separated from a shallow diffusion 110 by a distance $Y_{N+/P+}$, as shown in FIG. 3A. In reality, because of lateral spreading, a deep diffusion 108 of the form shown in FIG. 3A is not possible. Instead, the result is a much wider diffusion 112 shown in FIG. 3B, which is separated from diffusion 110 by a much smaller distance $Y_{N+/P+}$, despite having the same spacing between the mask features of both N+ and P+ junctions.

A similar problem occurs in the formation of vertical isolation regions and buried layers. FIG. 4A shows an ideal structure that includes a vertical P isolation region 114 extending through an N-epi layer 116 to a P substrate 120. An N buried layer (NBL) 118 is formed at the interface between N-epi layer 116 and P substrate 120. Both P isolation region 114 and N buried layer 118 are sharp, well defined regions with vertical edges, separated by a distance $W_3$. In reality, what happens with a conventional diffusion process is shown in FIG. 4B. N buried layer 118 expands horizontally during the growth of N-epi layer 116 and the subsequent driving-in of P isolation region 114, and P isolation region 114 likewise expands laterally, reducing the separation between N buried layer 118 and P isolation region 114 to a distance $W_4$ that is much less than $W_3$. As a result the breakdown voltage between N buried layer 118 and P isolation region would be reduced and to obtain the breakdown voltage of the structure shown in FIG. 4A, one would have to significantly widen the separation between N buried layer 118 and P isolation region 114.

FIGS. 5A-5F show the steps of a conventional process junction-isolation, i.e., isolation extending downward from the top surface (also known as "down-only" junction isolation.). In FIG. 5A, a thick oxide layer 122 (e.g., 1 to 5 µm thick) has been grown on a P substrate 124. In FIG. 5B, a photoresist layer 126 has been formed on top of oxide layer 122 and oxide layer 122 has been etched through an opening in photoresist layer 126. A thin oxide layer 130 is formed in the opening and a slow-diffusing N-type dopant such as antimony or arsenic is implanted through the opening to form an N buried layer 128, shown in FIG. 5C.

To prepare for the subsequent growth of an overlying epitaxial layer, the surface concentration of dopant in N buried layer 128 must be reduced. This is necessary to reduce the outgasing of dopant into the epitaxial reactor during the growth of the epi layer. To accomplish this, N buried layer 128 is driven in at a high temperature for an extended period of time, e.g., 1100 to 1250° C. for 5 to 20 hours. The length and temperature of this thermal process is made necessary by the fact that for purposes of later processing the dopant used to form N buried layer 128 is one that diffuses slowly, so diffusing it away from the silicon surface prior to epitaxy necessarily takes high temperatures and long times.

FIG. 5D shows the structure after the growth of an N epi layer 132 on P substrate 124. As indicated, N buried layer 128 has diffused upward into N epi layer 132.

As shown in FIG. 5E, an oxide layer 134 is formed on the surface of N epi layer 132 and an opening is etched in oxide layer 134 using a photoresist mask layer 136. A P-type dopant such as boron is implanted through the opening in oxide layer 134 to form P isolation region 136. The entire structure is then subjected to a thermal process, which causes P isolation region 136 to diffuse downward through N epi layer 132 to P substrate 124, at the same time forming a thin oxide layer 138. N buried layer 128 diffuses upward and laterally during this thermal process. Since N buried layer 128 is formed of a slow-diffusing dopant, it diffuses more slowly than the boron in P isolation region 136, and thus N buried layer 128 remains separated from P isolation region 136. Nonetheless, to guarantee this separation, N epi layer 132 must be made thicker than would otherwise be desirable.

FIG. 6 illustrates a way of reducing this problem by forming a P buried layer 140 directly below P isolation region 136. P buried layer 140 diffuses upward during the thermal process and meets the down-diffusing P isolation region 136 sometime near the middle of N epi layer 132, thereby reducing the amount of thermal processing required and the lateral diffusion of N buried layer 128. Nonetheless, such lateral diffusion does occur and wafer space is therefore still wasted.

FIGS. 7A-7F illustrate a process for forming the structure of FIG. 6. FIG. 7A shows the structure after N buried layer 128 has been implanted and thermally diffused to reduce the surface dopant concentration before the growth of an epitaxial layer. During the thermal diffusion process a thick oxide layer 146 is formed. In the event that a high concentration of arsenic is used to form the buried layer, the oxide atop the NBL may grow to a slightly greater thickness than those portions growing over the more lightly doped P-type substrate(an effect known as "concentration enhanced oxidation"). The result may be an oxide layer 142 that has a thickness less than the thickness of oxide 146 despite having the same oxidation time. The phenomena may also occur using antimony as the dopant species, but with a reduced magnitude effect. A photoresist layer 144 is deposited on top of oxide layers 142 and 146 and patterned for the implant of boron ions to form P buried layer 140. The edge of the opening in photoresist layer 144 is spaced a lateral distance $W_S$ from the edge of N buried layer 128 to ensure that N buried layer 128 and P buried layer 140 do not merge during subsequent thermal processing.

As shown in FIG. 7B, oxide layer 142 is etched through the opening in photoresist layer 144, and boron (or another P-type dopant) is implanted through the opening to form P buried layer 140. The structure is again annealed to reduce the surface concentration of P buried layer 140, forming a thin oxide layer 148, as shown in FIG. 7C.

Next, N epi layer 132 is grown on top of P substrate 124 using epitaxial deposition, as shown in FIG. 7D. Normally vapor phase epitaxial (VPE) deposition is preferred over liquid phase epitaxy, especially in the deposition of silicon. VPE, however, requires the substrate to be heated to a high temperature, typically above 1200° C. During the growth of N epi layer 132, N buried layer 128 and P buried layer 140 spread both vertically and laterally, reducing the separation between these two buried layers.

As shown in FIG. 7E, an oxide layer 150 is formed on the surface of N epi layer 132. Oxide layer 150 is patterned using common photolithographic techniques to form an opening through which boron is implanted to form P isolation region 136. As shown in FIG. 7F, the structure is then annealed once again to cause P buried layer 140 to diffuse upward and P isolation region 136 to diffuse downward until these two diffusions merge somewhere within N epi layer 132. N buried layer 128 and P buried layer 140 diffuse laterally during this anneal until the separation between them becomes quite small. Absent the separation $W_S$ shown in FIG. 7A, these two buried layers would in fact merge, and therefore the separation $W_S$ is in effect the "penalty" that must be paid to assure that in the final structure P buried layer 140 is spaced sufficiently from N buried layer 128 to provide the required breakdown voltage.

As is evident, this is a complicated, time-consuming process which can lead to the warping of the wafer, particularly with larger wafers, and to lower yields. Up-diffusion of the NBL during the isolation diffusion also reduces the "flat" concentration portion of N epi layer 132, requiring a thicker epitaxial layer than would be needed if up-diffusion did not occur.

FIG. 8 shows a way of avoiding this problem by etching a trench 152 all the way through the N epi layer 132 and filling trench 152 with a dielectric 154. Trench 152 might have to be very deep to extend entirely through N epi layer 132, since N epi layer could be anywhere from 5 μm to 20 μm thick, for example.

A process for forming the structure of FIG. 8 is shown in FIGS. 9A-9F. After N epi layer 132 has been formed, an oxide or other hard mask layer 156 is deposited on N epi layer 132 and patterned with a photoresist layer 158, as shown in FIG. 9A. An opening 160 is thereby formed in layer 156, as shown in FIG. 9B, and trench 152 is etched through N epi layer 132, as shown in FIG. 9C. This is typically done by a reactive ion etch (RIE).

After trench 152 has been formed, hard mask layer 156 is removed, and a sacrificial oxide layer (not shown) is grown in trench 152 to repair crystalline damage caused by the RIE process. The sacrificial oxide layer is removed and another oxide layer 162 is grown in the walls of trench 152 and top surface of N epi layer 132, as shown in FIG. 9D. Trench 152 is filled with a dielectric material 164 which overlaps the top surface of N epi layer 132, as shown in FIG. 9E, and dielectric material 164 is planarized as shown in FIG. 9F, so that the top surface of dielectric material 164 is level with the top surface of oxide layer 162.

Since trench 152 does not expand or spread significantly during this process, and since it does not form a PN junction to the epitaxial layer, trench 152 can be located closer to N buried layer 128 than, for example, P buried layer 140 at the stage shown in FIG. 7C. Nonetheless, this process has several problems and risks. Because trench 152 can be very deep, it may be difficult to fill. As shown in FIG. 1A, if trench is under filled, a narrow gap may be left extending downward from the top surface of dielectric material 164 conformal to the trench itself, as shown in FIG. 10A, or a narrow void may be left in the trench, as shown in FIG. 10B. If the trench has a narrow mouth, a void may be left in the bottom portion, as shown in FIG. 10C, or if the RIE is somewhat less anisotropic producing a trench with a wide mouth, the dielectric 164 may be removed from the inside of the trench during the etchback leaving only a small portion in the bottom of the trench, as shown in FIG. 10D. In conclusion deep trench isolation and re-fill remains a challenging process for high volume manufacturing FIGS. 11A-11E illustrate several semiconductor devices formed using prior art diffusion techniques.

FIG. 11A shows an NPN transistor 234 and a PNP transistor 236 that are formed in an N epi layer 202 grown on a P substrate 200. The emitter of NPN transistor is an N+ region 208, the base includes a P+ region (the base contact, or extrinsic base) 210 and a dedicated P-base region (the active transistor or intrinsic base regions) 206, and the collector includes an N+ region 212 (collector contact region), a portion of N epi layer 202 (the collector), and an N buried layer 204A (a so-called sub-collector region). N buried layer 204A isolates transistor 234 from P substrate 200 and lowers the resistance of the collector.

In PNP transistor 236, the emitter is a P+ region 226, the base includes an N+ extrinsic base contact region 224 and a dedicated intrinsic base region 222, and the collector includes a P+ collector contact region 228, a P-well 220, and a P buried layer sub-collector 218. PNP transistor 236 is isolated from P substrate 200 by an N buried layer 204B. N buried layer (NBL) 204B and P buried layer (PBL) 218 are formed at the interface of N epi layer 202 and P substrate 200. N buried layer 204B may be formed with a relatively slow-diffusing dopant such as antimony or arsenic, and P buried layer 218 may be formed with a fast diffusing dopant such as boron. As a result, P buried layer 218 extends above N buried layer 204B, and in some cases may extend both above and below the NBL.

NPN transistor 234 is isolated from PNP transistor 236 by a P isolation region 214, which extends from the surface of N epi layer 202 into P substrate 200. P isolation region 214 also provides a means of setting the potential of P substrate 200 through a P+ contact region 216, and is often biased at the most negative on-chip potential or ground. The potential of the portion of N epi layer 202 in PNP transistor 236 can be set through an N+ contact region 230, where the NBL 204B must be biased at a potential equal to or more positive than P substrate 200 and equal to or more positive than PBL 218. Common practice often involves biasing NBL at the positive supply rail (e.g. Vcc) or shorting PBL 218 and NBL 204B to the same potential (a zero biased junction).

FIG. 11B shows a lateral double-diffused N-channel MOSFET 238 (also known as an LDMOSFET) and an isolated CMOS pair that includes a PMOSFET 240 and an NMOSFET 242. Again, the devices are formed in N epi layer 202. In N-channel LDMOSFET 238, the source is an N+ region 246, the body comprises a P+ contact region 244 and a dedicated P-body diffusion 248 (or P-well 265), and the drain is an N+ region 249 and a portion of N epi layer 202 acting as a lightly doped drain extension. The channel portion of P-body (or P well) 248 underlies a gate 247, setting the threshold voltage of the MOSFET and preventing punch-through breakdown between the source and the drain (by forcing the majority of the depletion spreading of the P-body to N-epi junction into the epitaxial drain side of the device). Unlike conventional MOSFETs whose channel length is determined by the length of the gate region, in this device the difference in junction depth between the body 248 and the source 246 along the surface, i.e. laterally, sets the channel length of the LDMOSFET. In the self-aligned version of the device, P-body 248 is implanted after the gate electrode of the device is formed, after which the junction is diffused for a long time and at high temperatures (e.g. 1100° C. for 14 hours) to achieve a sufficient junction depth and channel length. Since both source and body junction are formed after the gate, the device is self aligned. In the lower cost version of the LDMOSFET, P-well diffusion 265 (used in the CMOS) is used as the body of the device. Since the well is formed prior to the gate it is not self-aligned to the gate, making punchthrough and threshold voltage dependent on mask alignment. A section of N epi layer 202 that separates the channel from N+ region increases the breakdown potential of the device provided it also is adequately spaced from both the P-body region 248 and spaced from isolation diffusion 250.

In PMOSFET 240, the source is a P+ region 256, the body includes an N+ contact region 254 and a portion of N epi layer 202, and the drain is a P+ region 258. The channel portion of N epi layer 202 underlies a gate 260. In NMOSFET 242, the source is an N+ region 264, the body includes a P+contact region 262 and a P well 265, and the drain is an N+ region 266. The channel portion of P well 265 underlies a gate 268. The CMOS pair and lightly-doped drain NMOSFET 238 are separated from each other by a P isolation region 250. Contact to P substrate 200 is made through P isolation region 250 and a P+ contact region 252. NBL 204 isolates P-well 265 from substrate P substrate 200.

FIG. 11C shows an N-channel quasi-vertical DMOSFET 270, another variant of an N-channel lateral DMOSFET 272, and a fully isolated PMOSFET 274. Quasi-vertical DMOSFET 270 is built as a matrix of cells bordered by gates 276A, 276B and 276C. Each cell of DMOSFET 270 includes an N+ region 280 that functions as a source, and a P+ region 282 and P-body 278 that together function as a body. The source and body are shorted together. The current flows from the source, through a channel under the gates 276A, 276B, 276C, through N epi layer 202, down to N buried layer 204D and then up through an N sinker 284 and an N+ region 286 to the drain terminal (hence the nomenclature quasi-vertical). DMOSFET 270 is isolated from P substrate 200 by N buried layer 204D, which also lowers the resistance of the device.

N-channel Lateral DMOSFET 272 includes an N+ region 298 that functions as a source, and a P+ region 294 and P-body 292 that together function as a body. The current flows from N+ region 298, through a channel under a gate 296, down to an N buried layer 204E and along the surface in N epi layer 202, and then up through an N sinker 300 and an N+ region 302 to the drain terminal. N-channel LDMOSFET 272 is isolated from P substrate 200 by N buried layer 204E and from DMOSFET 270 by a P isolation region 288 and a P buried layer 290.

Isolated PMOSFET 274 includes P+ region 310 that functions as the source and a P+ region 312 that functions as the drain. The body is a portion of N epi layer 202 and is contacted by an N+ contact region 308. The current flows from P+ region 310 to P+ region 312 through a channel that underlies a gate 314. PMOSFET 274 is isolated from P substrate 200 by N buried layer 204F and from NMOSFET 272 by a P isolation region 304 and a P buried layer 306.

FIG. 11D shows another N-channel lateral DMOSFET variant 308, a lateral NMOSFET 310, and a vertical PNP bipolar transistor 312. N-channel LDMOSFET 308 is similar to NMOSFET 238 shown in FIG. 11B (similar components are similarly numbered), except that gate 314 steps up over a field oxide layer and lightly-doped NMOSFET 308 is isolated from P substrate 200 by an N buried layer 204G. N-channel lateral DMOSFET 310 is similar to N-channel LDMOSFET 242 shown in FIG. 11B, except that NMOSFET 310 does not include N buried layer 204

In vertical PNP transistor 312, a P+ region 314 serves as the emitter, an N-base 316, an N+ region 318, and a portion of N epi layer 202 serve as the base, and a P buried layer 320 and a P sinker 322 serve as the collector. PNP transistor 312 is isolated from P substrate 200 by an N buried layer 204H.

N-channel lateral DMOSFET 308 is isolated from lateral NMOSFET 310 by a P isolation diffusion 324 and a P buried layer 326, and lateral NMOSFET 310 is isolated from vertical PNP bipolar transistor 312 by a P sinker 328 and a P buried layer 330.

FIG. 11E shows devices formed in a P epi layer 342 that is grown on a P substrate 340. A CMOS pair includes a PMOSFET 344 and an NMOSFET 346. PMOSFET 344 and NMOSFET 346 are similar to PMOSFET 240 and NMOSFET 242 shown in FIG. 11B except that PMOSFET 344 is formed in an N well 350 and NMOSFET 346 is formed in P epi layer 342. PMOSFET 344 and NMOSFET 346 are isolated from P substrate 340 by an isolation structure that includes an N buried layer 356 and N isolation diffusions (NI) 352 and 354. The bias of the isolation structure can be set via an N+ region 358 and is often biased at the most positive supply voltage that power the CMOS devices.

An N-channel lightly-doped lateral DMOSFET 348 includes an N+ region 360 as the source, a P+ region 364, a P-body 362 and a portion of P epi layer 342 as the body, and an N− lightly doped drain region 366, and N well 368 and an N+ region 370 as the drain. A channel is formed in P well 362 and P epi layer 342 under a gate 372. NMOSFET 348 is not isolated from P substrate 340.

A common feature of the devices shown in FIGS. 11A-11E is that they generally require lengthy thermal diffusions in order to make connections through the epi layer. These connections may be required to form isolation regions or to connect to buried layers which function as integral components of the devices. Providing high breakdown voltages generally requires a thicker epi layer and more lengthy thermal processes. The thermal processes all produce lateral as well as vertical dopant spreading, both in the isolation regions that are implanted from above and the buried layers that up-diffuse from below. This lateral dopant spreading limits the spacing and packing density that is achievable with these prior art processes.

Thus, as the feature sizes of the devices themselves decrease, there is a corresponding need for a process that permits the devices to be more densely packed on the surface of the wafer.

SUMMARY OF THE INVENTION

In accordance with this invention, the lateral spreading of dopant during a thermal diffusion process is constrained by forming a trench on one or several sides of a diffusion (prior to the diffusion) and filling the trench with an oxide or other dielectric material. Preferably, the lateral spreading of the dopant is constrained in several directions by forming trenches on two or more sides of the dopant, especially on the more deeply diffused junctions in a process.

In general, the trenches constraining diffusions have a sufficient depth that the mostly highly-doped surface portion of the diffusion is constrained by the trench, the trench having a depth preferably at least 15 to 20% of the final depth of the junction. In some cases the trench constrains diffusion in its entirety, i.e. the trench being deeper than the final junction depth. The trench may be in the range of 0.5 µm to 5 µm deep, for example, but typically the depth of the trench would be in the range of 1 µm to 3 µm. In one preferred embodiment, the trenches are of sufficient depth to constrain the more highly doped-portion of a diffusion and sufficiently shallow to easily fill and planarize.

In embodiments that involve an epitaxial layer, the trench extends into the epitaxial layer but does not extend through the epitaxial layer and into the underlying substrate. In one preferred embodiment devices are isolated by deep junction isolations where a substantial portion of the isolating junctions are constrained by dielectric-filled trenches. In other embodiments an updiffusing buried layer overlaps the trench-constrained down-diffusing diffusion to complete the isolation structure.

This process is particularly useful in constructing relatively high-voltage devices in an epitaxial layer. Bipolar transistor devices, rated for reliable operation at a 20V operating voltage, for example, which would typically require a breakdown voltage in the range of 60V to 70V. This requires a relatively thick epitaxial layer and deep diffusions extending through the epitaxial layer to isolate the devices electrically from the substrate or from each other. The isolation is provided by a reverse-biased PN junction. In conventional technology, these deep diffusions require a substantial thermal budget (a product of temperature and time), which also causes the diffusions to spread laterally and increases the size of the devices, limiting the number of devices that can be placed in a given area of the wafer.

Using the principles of this invention, the lateral expansion of the diffusion is limited because the diffusivity of the dopant in the dielectric material in the trench is typically less than the diffusivity of the dopant in the semiconductor substrate or epitaxial layer. Furthermore the dopant after having diffused into the dielectric of the trench, is not electrically active and does not affect or influence the junction breakdown of neighboring junctions or devices. Moreover, even if dopants of opposite conductivity do come into contact with each other in the region below the trench, typically the doping concentration of the diffusion in this locale is sufficiently low that the breakdown voltage of the PN junction is relatively high. Thus, use of this invention allows a higher packing density and provides a far more efficient use of the available space on the wafer. For example, devices may be spaced only one micron apart instead of tens of microns.

The principles of this invention apply not only to diffusions or regions that are used for isolation purposes but also to "sinker" diffusions that are used to provide an electrical connection to a buried layer or to the substrate. Such sinker diffusions may be formed in material that is either of the same conductivity type or opposite conductivity type as the diffusion itself. So unlike a conventional deep-trench oxide isolation, which only provides isolation (and is difficult to manufacture), trench constrained diffusions are capable of providing a low-resistance electrical contact from a wafer's top surface to a junction deep within the silicon using a process that is easy to manufacture (i.e. since it does not require difficult trench filling and planarization steps).

According to another aspect of the invention, a dielectric-filled trench extends from the surface of an epitaxial layer or substrate into a submerged region. The submerged region can be either a buried layer formed at the interface between an epitaxial layer and a substrate of a deep region formed by implanting dopant at a relatively high energy into a substrate.

BRIEF DESCRIPTION OF THE DRAWINGS

FIGS. 3A and 3B summarize the problems shown in FIGS. 1A-1D and 2A-2B.

FIGS. 7A-7F illustrate the steps of a process of forming the structure shown in FIG. 6.

FIGS. 27A-27I illustrate a process of forming a dielectric-filled trench.

DESCRIPTION OF THE INVENTION

Figure 12:
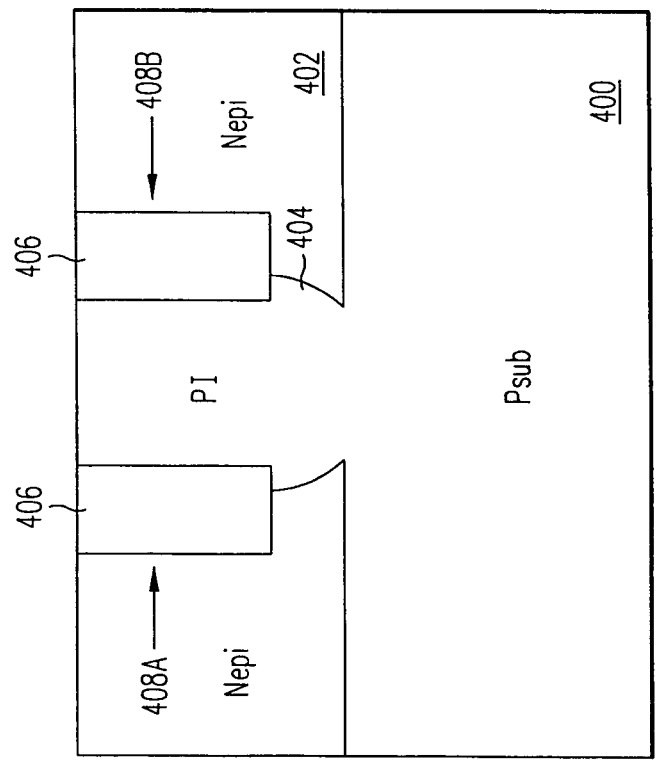
FIG. 12 illustrates a basic trench-constrained isolation diffusion formed in an epitaxial layer of an opposite conductivity type to that of the isolation diffusion.

FIG. 12 illustrates a basic example of the structure and process of this invention. An N epi layer 402 has been grown on a P substrate 400, and a P-type dopant, such as boron, has been implanted through the top surface of N epi layer 402 to form a P isolation region 404. Trenches 408A and 408B have been formed in N epi layer 402 on opposite sides of P region 404. Trenches 408A and 408B are filled with a dielectric material 406, which may be an oxide, nitride or multiple layers of different types of dielectrics.

During a thermal process, as the P-type dopant in isolation region 404 diffuses downward, trenches 408A and 408B act as barriers to the lateral spreading of the dopant. The diffusivity of the dopant is generally lower in dielectric material 406 than in N epi layer 402. This limits the lateral spreading of the dopant. In turn, the resulting increased concentration of P-type dopant between trenches 408A and 408B tends to increase the gradient of the dopant concentration in a vertical direction, and this tends to make the dopant diffuse downward more rapidly than if trenches were not present. Thus less thermal processing is necessary to achieve a given depth of diffusion.

In addition to reducing the time needed to perform isolation diffusion, the method allows a more narrow isolation feature size to be used without suffering the limitations of starved diffusion (an effect leading to undesirably shallower junctions than expected for a given amount of diffusion time). The onset of starved diffusion occurs later using trench-constrained diffusion because the lower diffusion rate laterally keeps the surface concentration and vertical gradient higher, causing vertical diffusion to proceed at a more rapid rate. Of course, the rate drops after the bottom of the junction reaches the bottom of the trench, but by then the diffusion rate has already slowed substantially anyway.

In the process as described, the dopant is introduced near the surface using conventional low energy implants, e.g. under 140 keV, having an implant dose which may range from $5E12\ cm^{-2}$ to $5E15\ cm^{-2}$ (but more typically in the range of $2E13\ cm^{-2}$ to $2E14\ cm^{-2}$), or formed by predeposition (doped from a high temperature diffusion in the presence of a gaseous or solid dopant source). The junction depth prior to diffusion is commonly less than 0.5 μm.

Alternatively, the implant may be formed at a deeper depth initially, e.g. with its peak concentration located 0.5 to 2.0 μm into the silicon, before any high temperature diffusion time. Deeper implants need less diffusion time to reach their full targeted depth, but require the use of high-energy (i.e. million volt) ion implantation. Implant energies range from 300 keV up to 3 MeV, with implants of 1 MeV to 2 MeV generally being preferable for achieving high manufacturing throughput. The thickness of photoresist needed to block the implant from other areas must be increased accordingly, typically to a thickness of 2 to 4 μm.

Isolation diffusion as a rule needs to be performed to a junction depth deeper than the epitaxial layer being isolated, and generally no less than 120% of the epi thickness to guarantee that variations in the thickness of the epi layer do not lead to incomplete isolation (meaning the ion implant does not overlap onto the substrate). For a 4 μm layer a diffusion depth of 4.8 μm to 5.2 μm is common. Such diffusions may be performed at 1050° C. to 1200° C. but more preferably at 1100° C. to 1150° C. to maximize the diffusion rate without damaging the diffusion furnaces and causing wafer warpage.

In the example shown trench depths may typically be etched to roughly half the epi thickness, e.g. 2 μm and typically from 30% to 70% of the depth of the layer being isolated, but may range from 10% to 90% of the epi layer. Trenches deeper than 5 μm in depth become progressively harder to fill and planarize.

Trench widths may range from 0.1 μm to 2 μm with trench dimensions around 0.5 to 1 μm being preferable. The mesa between the trenches may be from 0.5 μm to 10 μm in width, with widths of 1.5 to 5 μm being preferable. Trenches may constrain a diffusion only one side, and preferably on two sides (as stripes or rings), but may also constrain a diffusion on three sides or on four sides or completely surrounding a diffusion on all sides (concentric).

In an alternative invention the trench also may be etched and filled after the diffusion, or after part of the diffusion, but in so doing, the process loses some of its advantage in controlling the lateral spread of dopant. By diffusing before trench etching, the trench locations must be spaced wider apart to intersect the more widespread lateral diffusion of region 404. Such a method eliminates the benefit of forming a narrow yet deep junction.

Figure 1A:
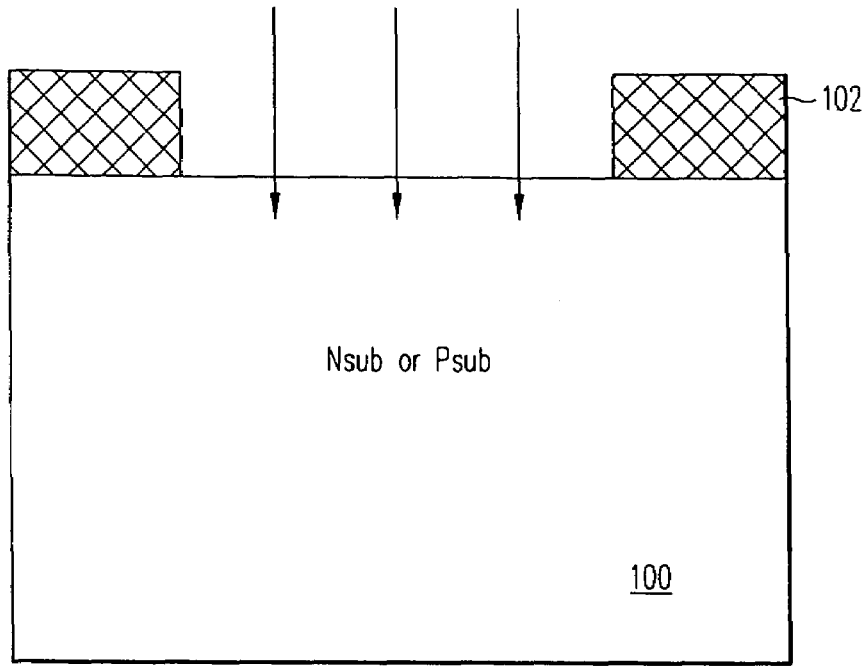
FIGS. 1A-1D illustrate a common process for forming a diffused region in a semiconductor device, and in particular the lateral dopant spreading that occurs during thermal processing.
Figure 1B:
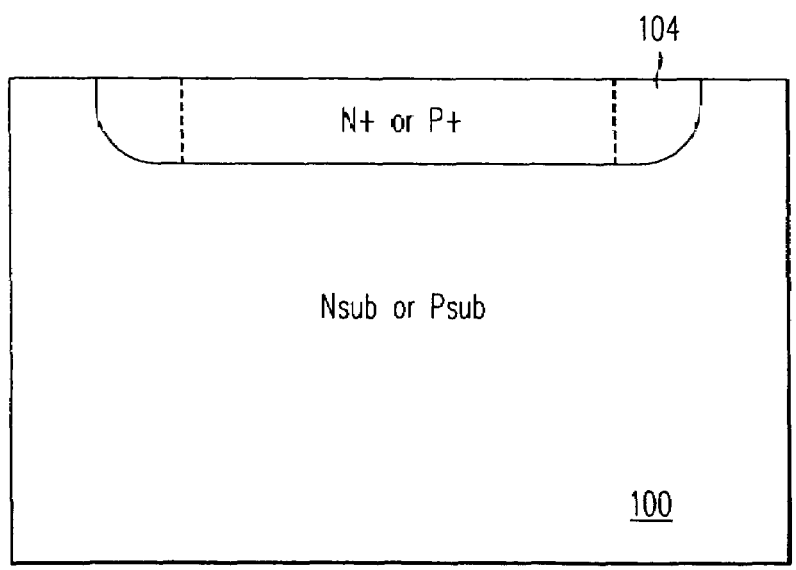
Figure 1C:
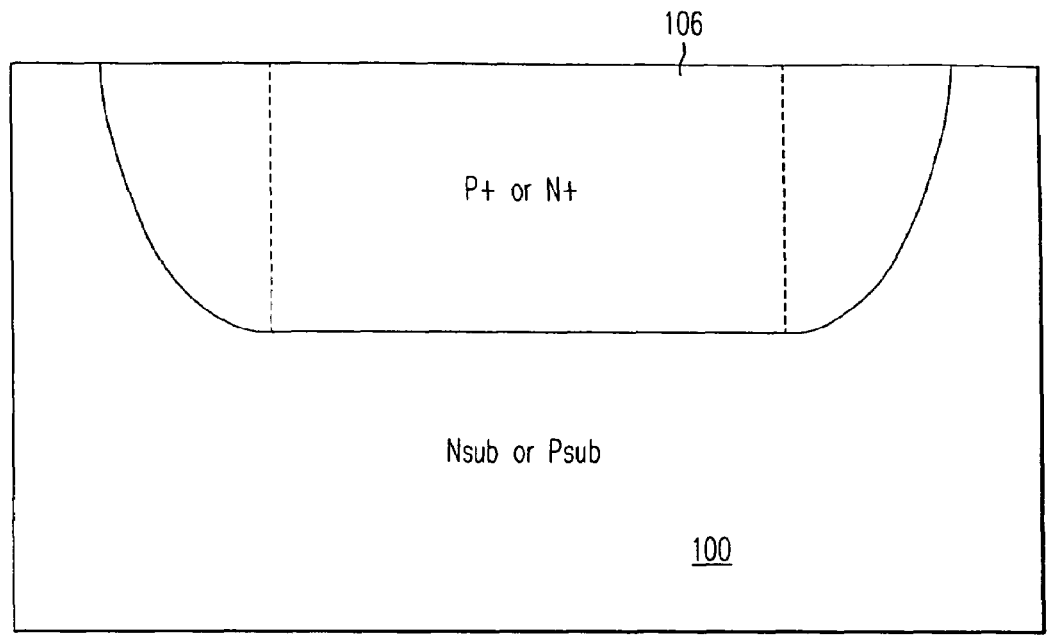
Figure 1D:
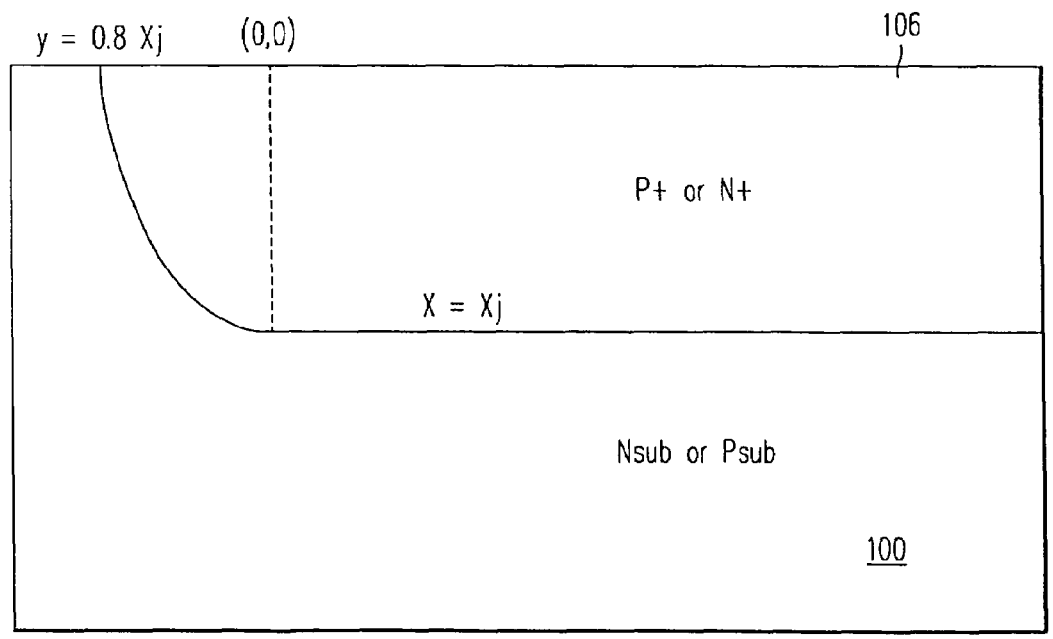
Figure 2A:
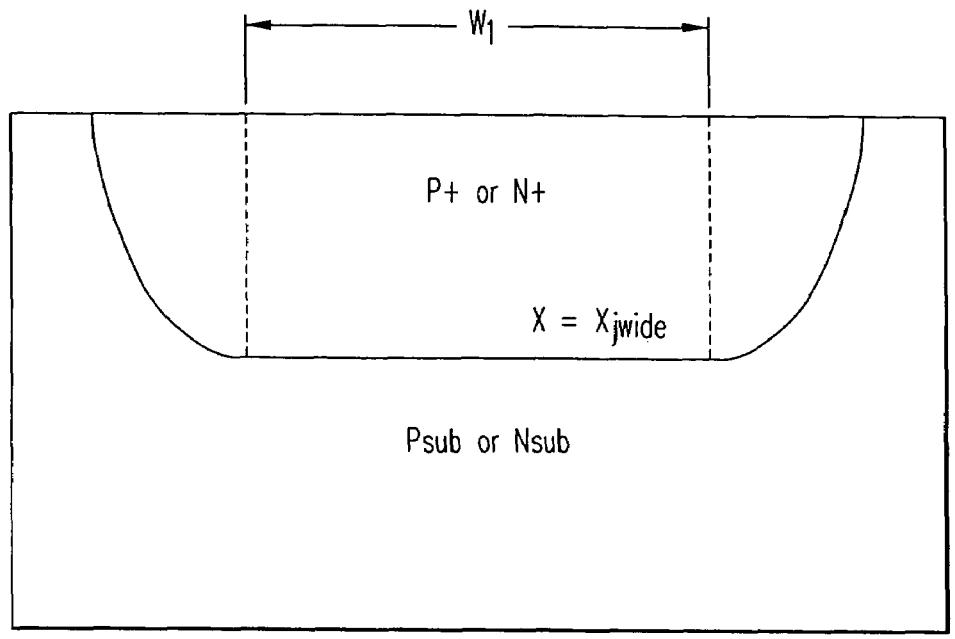
FIGS. 2A and 2B illustrate how the depth of a diffused area varies with the width of the mask opening through which the dopant is implanted.
Figure 2B:
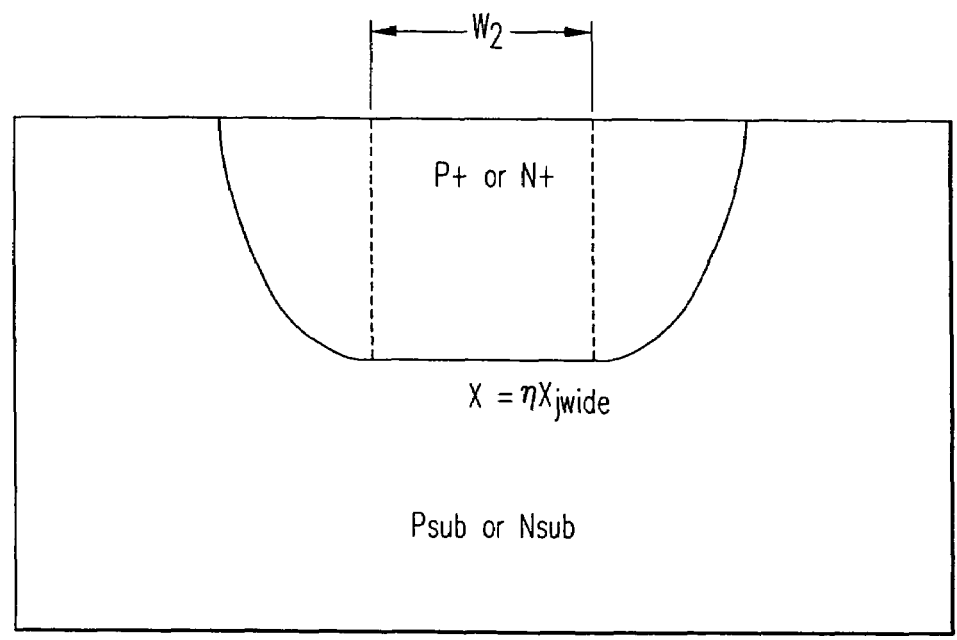
Figures 4A, 4B:
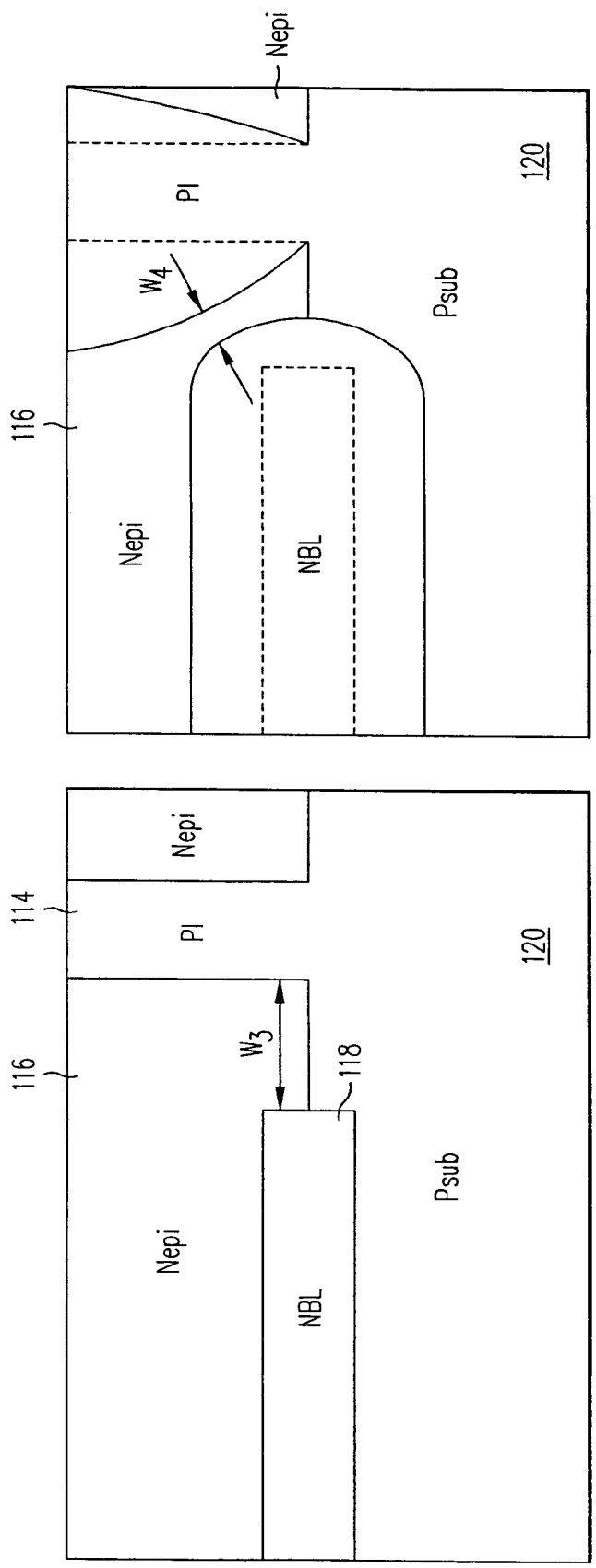
FIGS. 4A and 4B illustrate the problem of maintaining separation between a buried layer and a vertical isolation region during thermal processing.
Figure 5C:
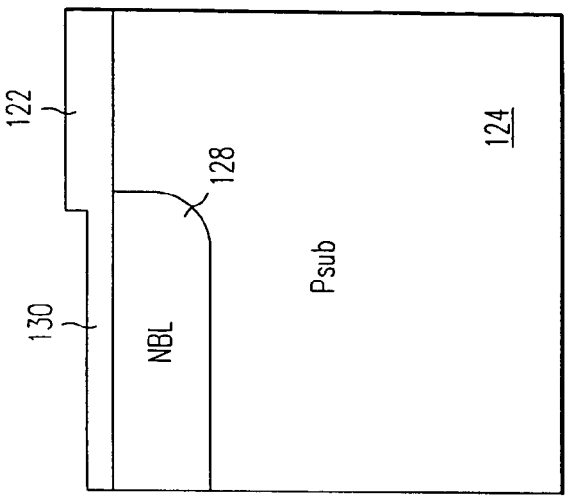
FIGS. 5A-5F illustrate the steps of a process for forming the structure shown in FIG. 4B.
Figure 5B:
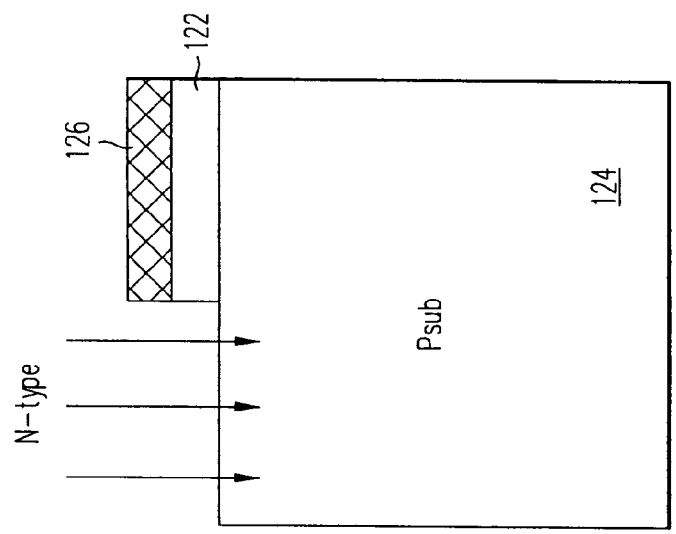
Figure 5A:
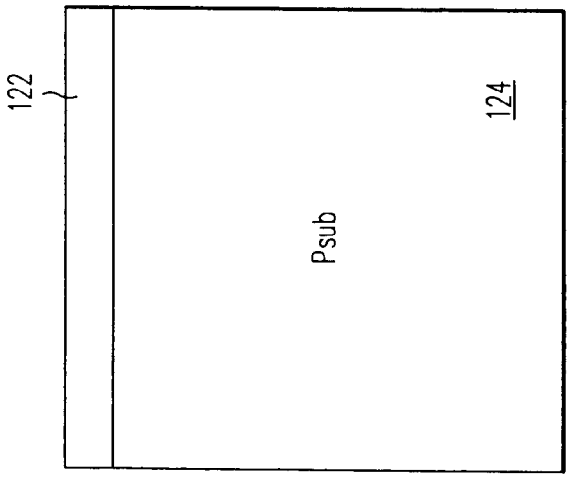
Figure 5F:
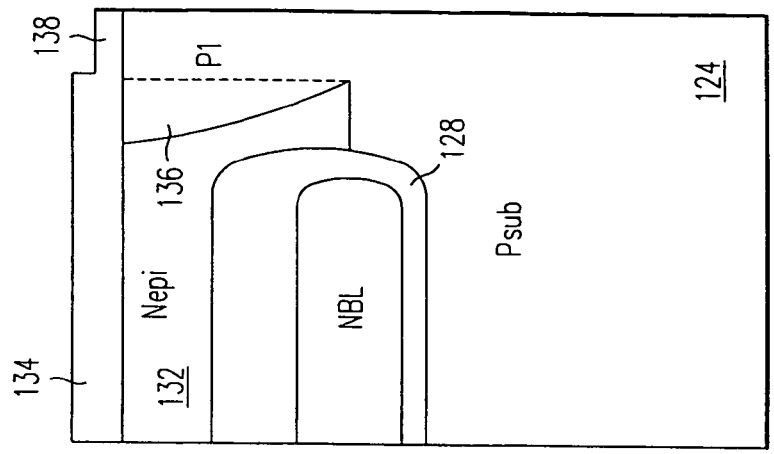
Figure 5E:
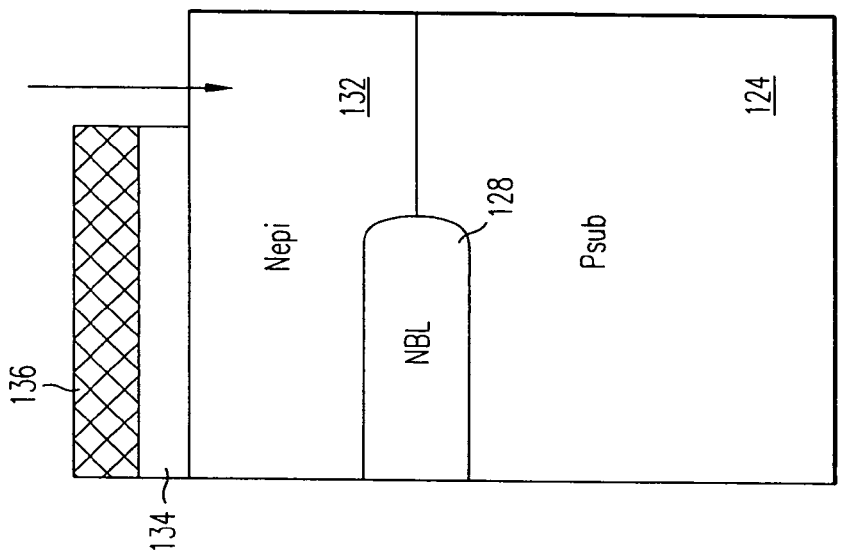
Figure 5D:
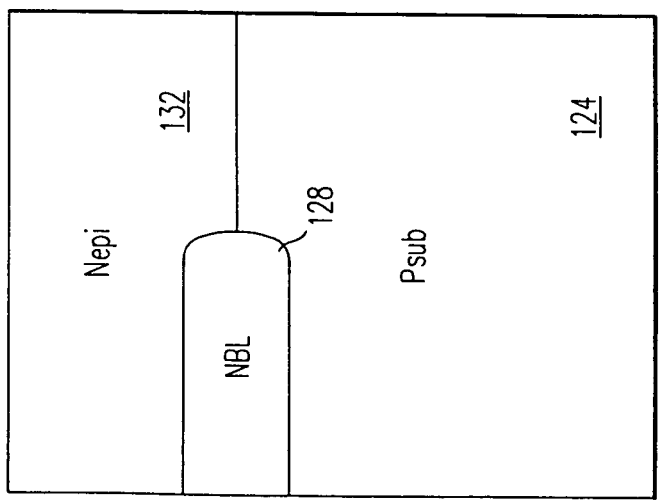
Figure 6:
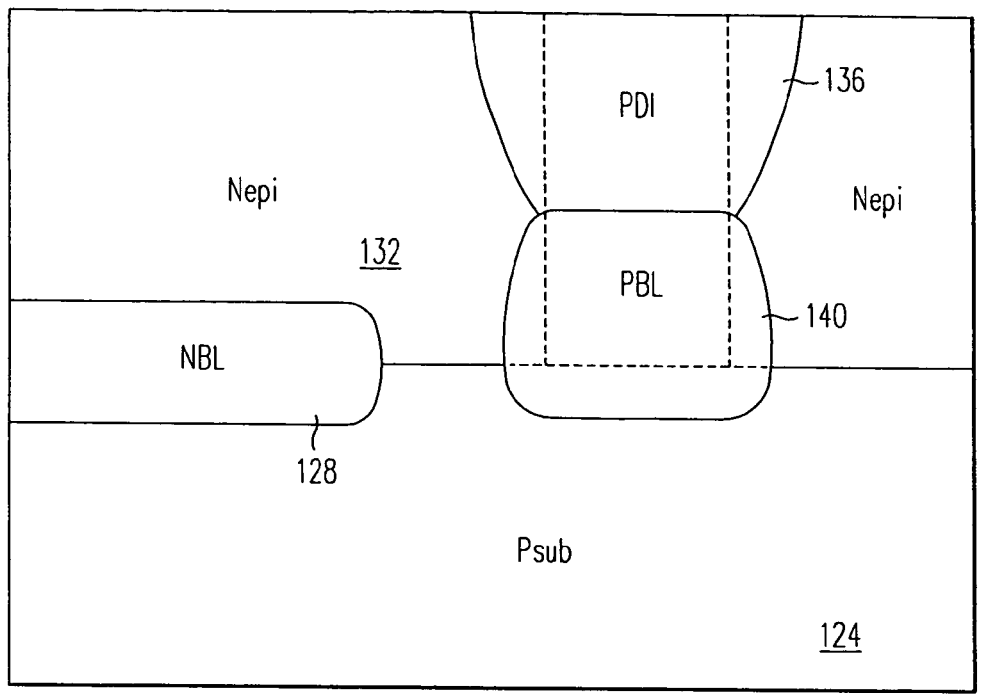
FIG. 6 illustrates the use of an up-diffusing buried layer beneath the isolation region as a technique of reducing the thermal budget and amount of lateral dopant spreading.
Figure 8:
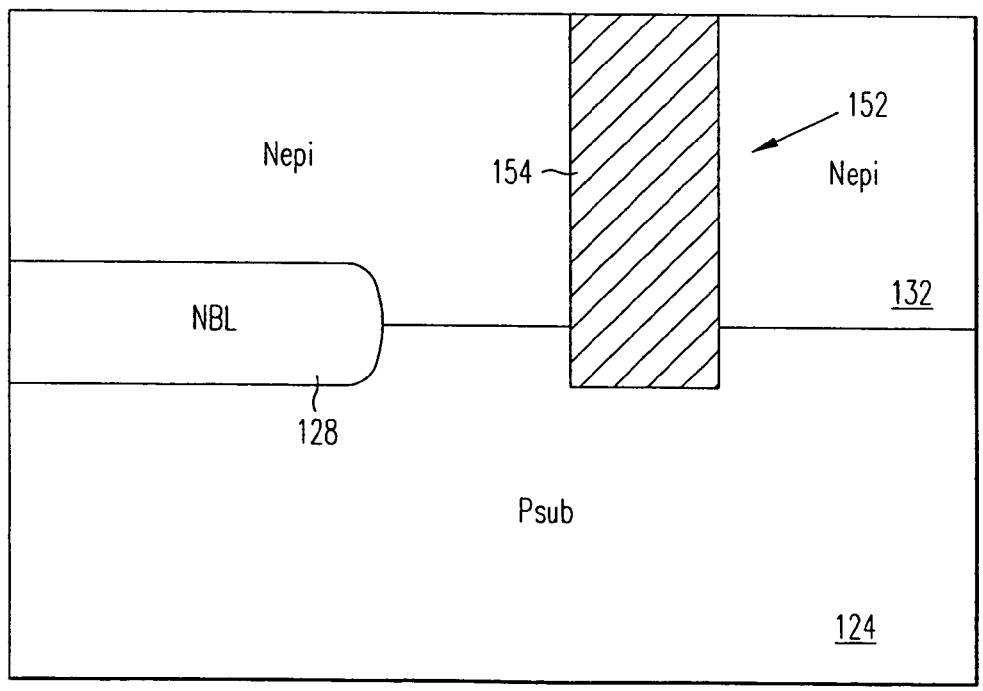
FIG. 8 illustrates an isolation structure that includes a trench filled with a dielectric.
Figure 7F:
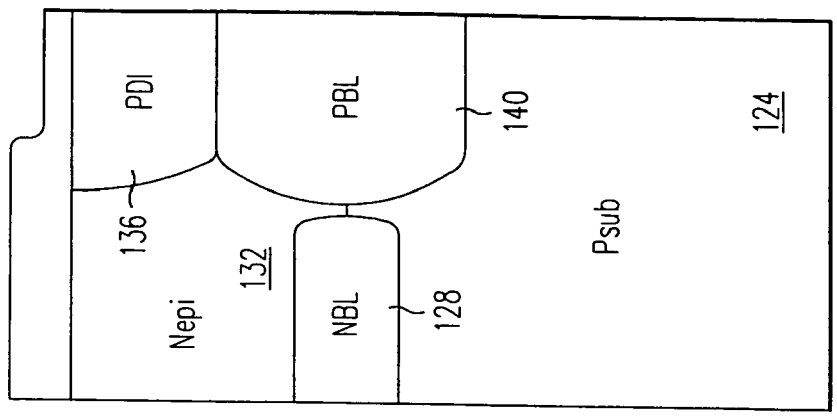
Figure 7E:
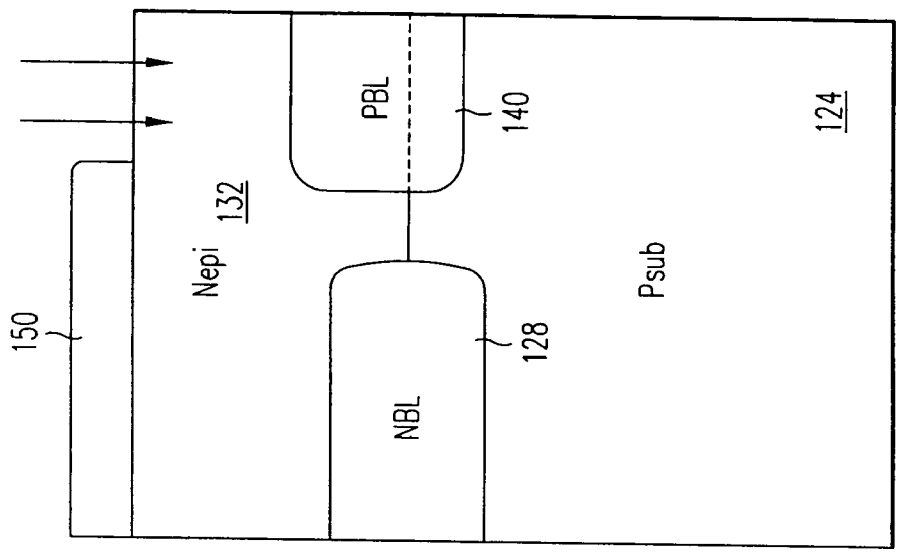
Figure 7D:
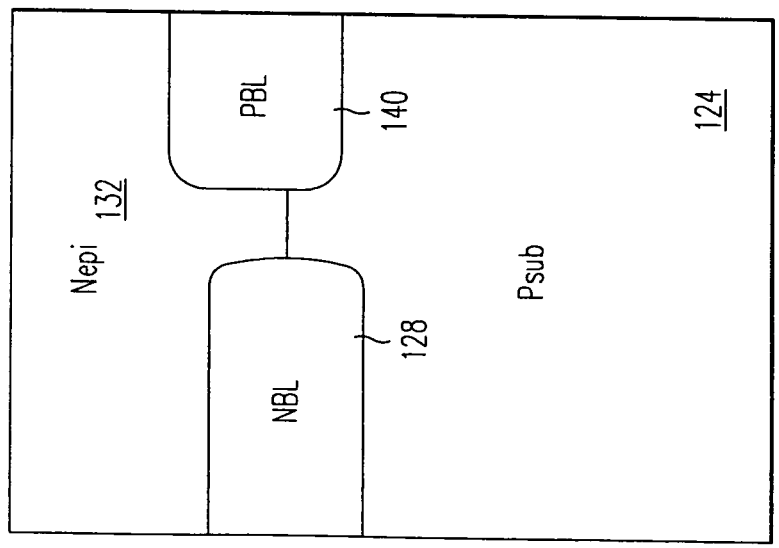
Figure 9B:
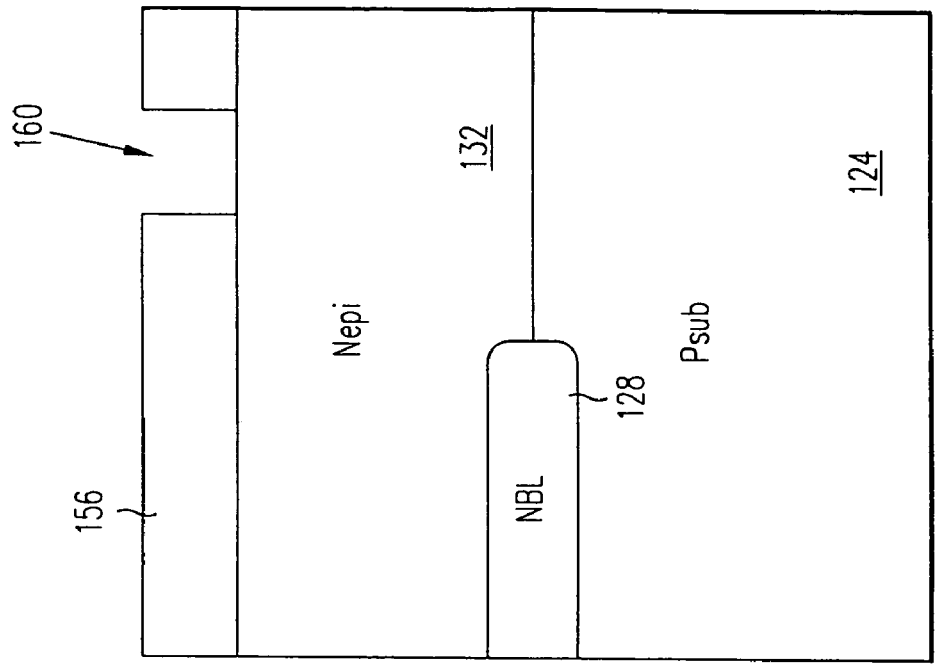
FIGS. 9A-9F illustrate a process for fabricating the isolation structure shown in FIG. 8.
Figure 9A:
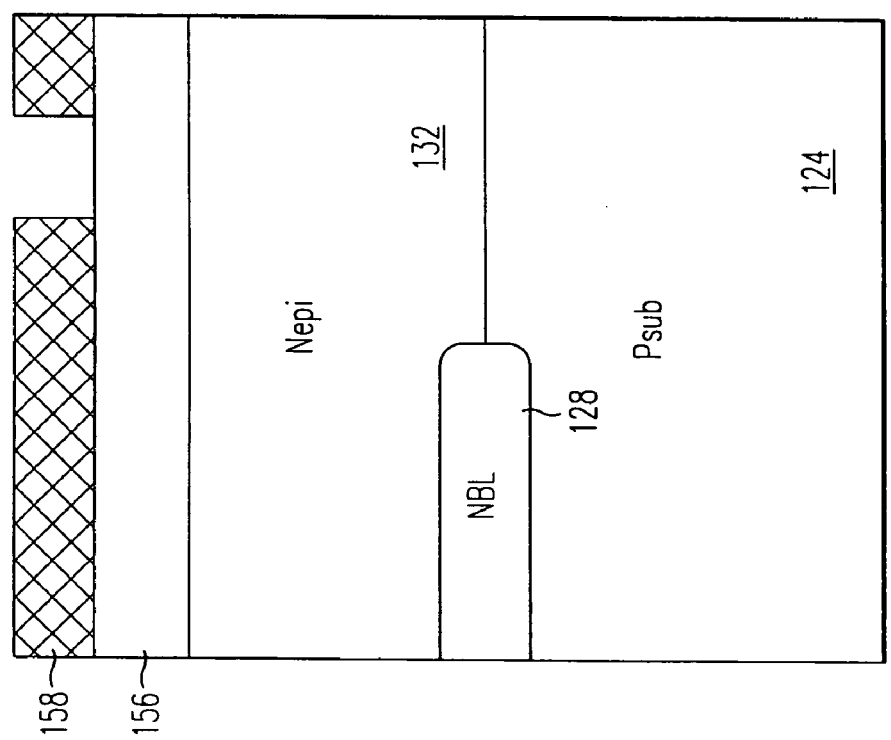
Figure 9D:
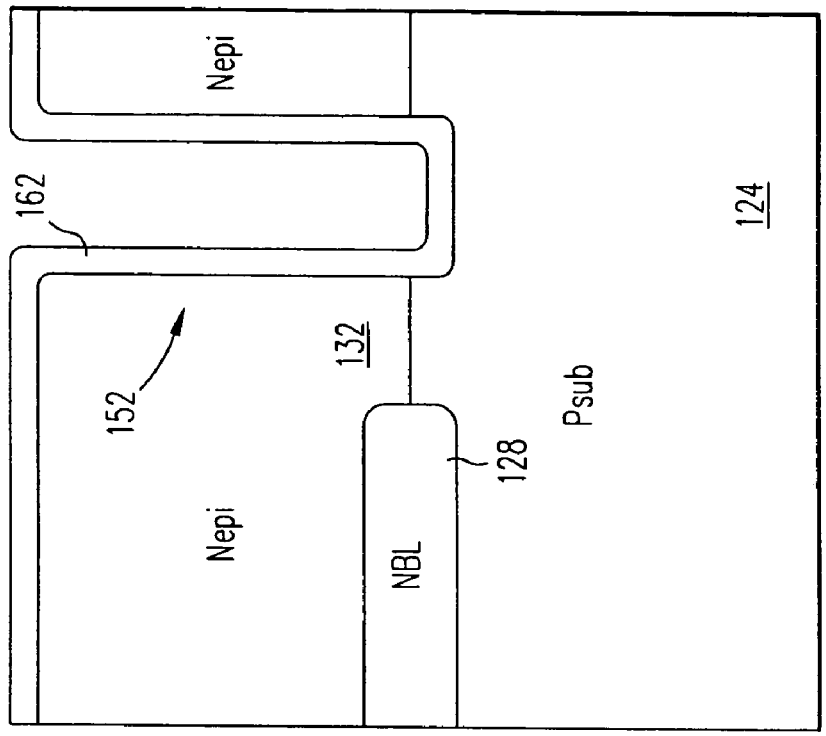
Figure 9C:
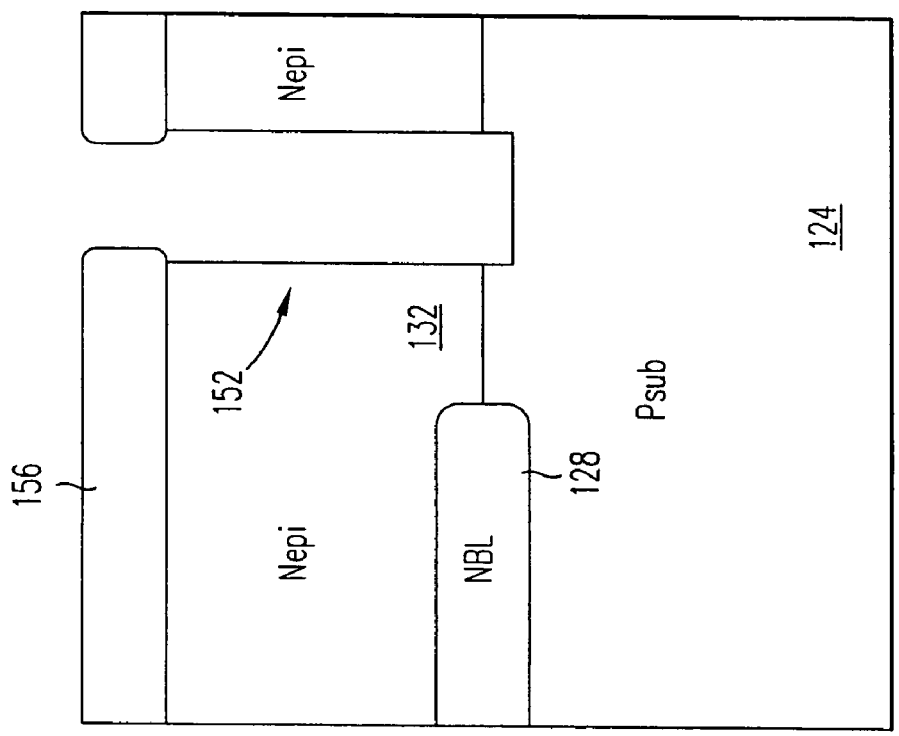
Figure 9F:
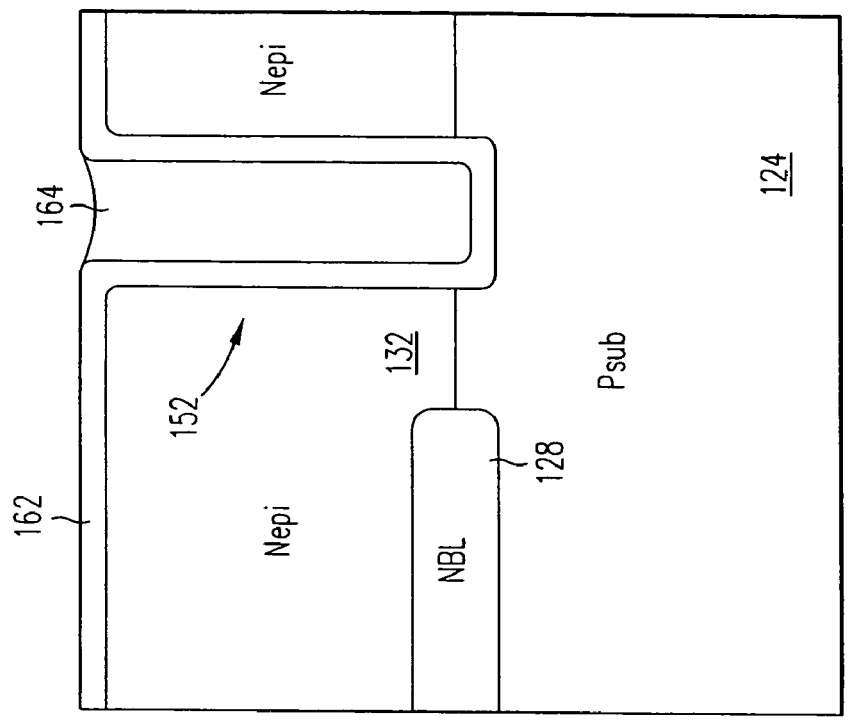
Figure 9E:
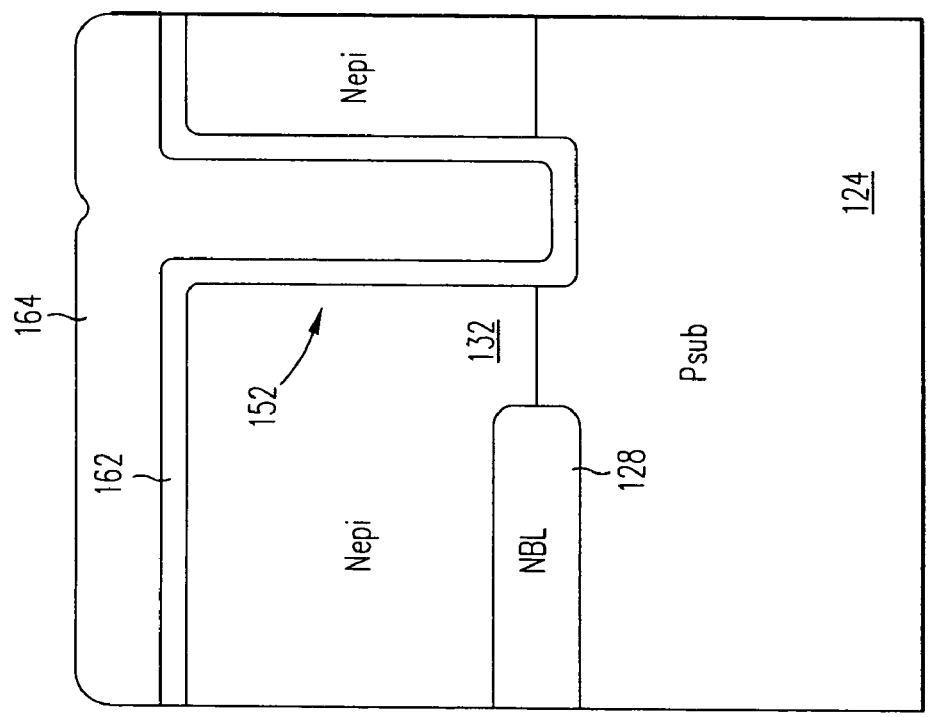
Figure 10B:
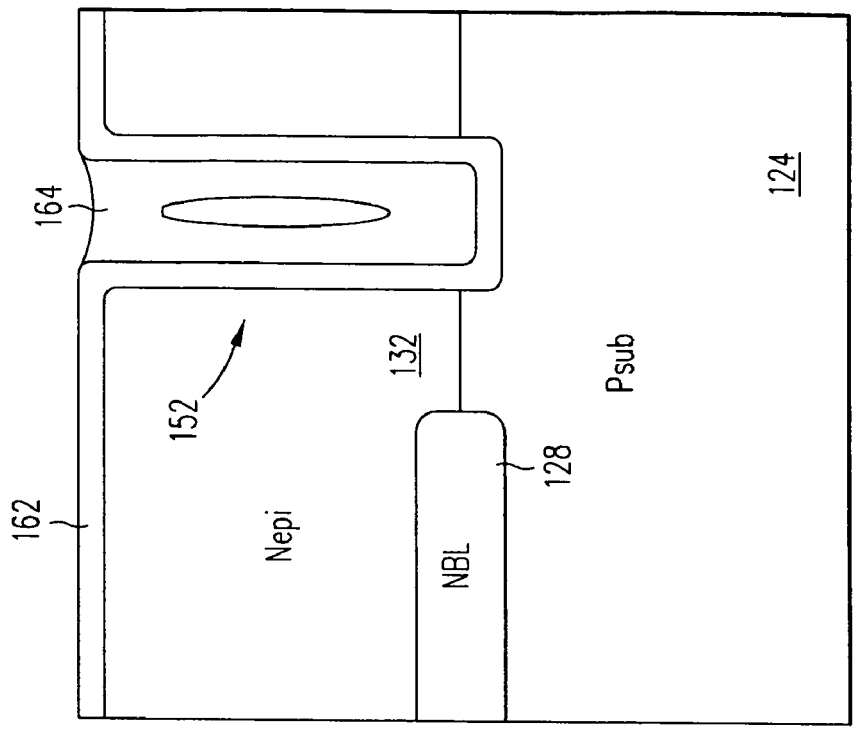
FIGS. 10A-10D illustrate problems that can occur in filling the trench of the isolation structure shown in FIG. 8.
Figure 10A:
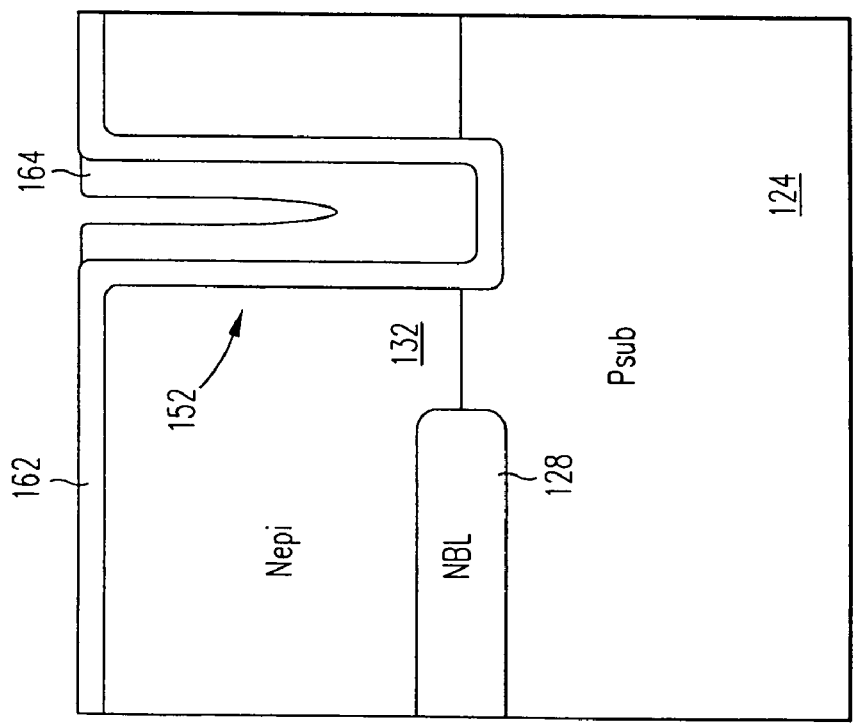
Figure 10D:
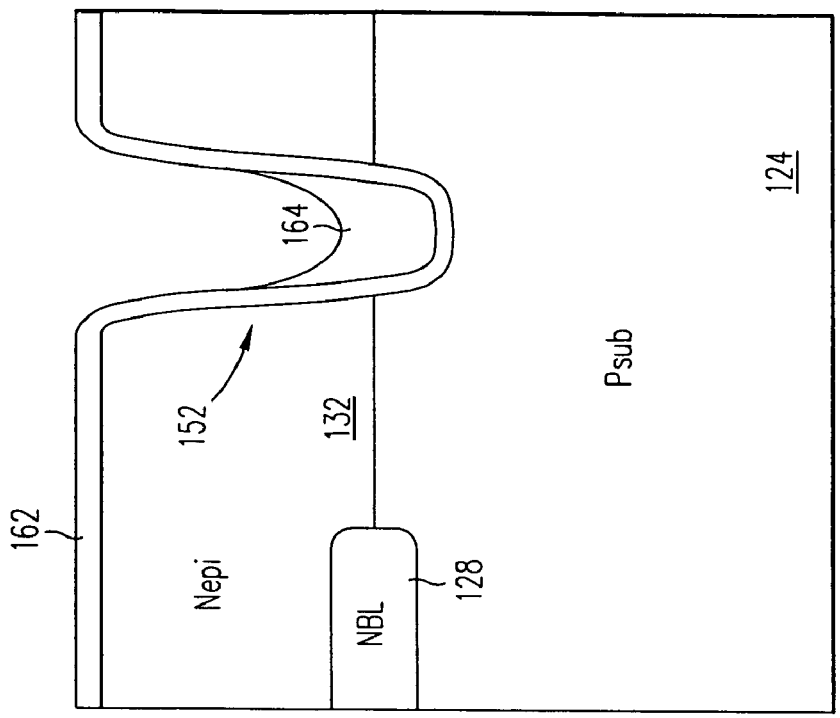
Figure 10C:
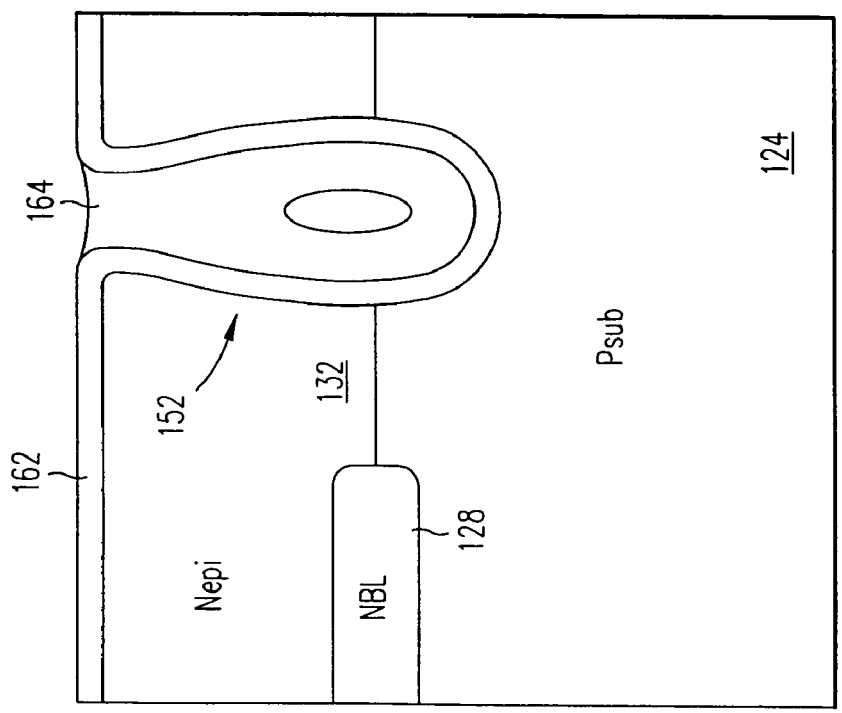
Figure 11A:
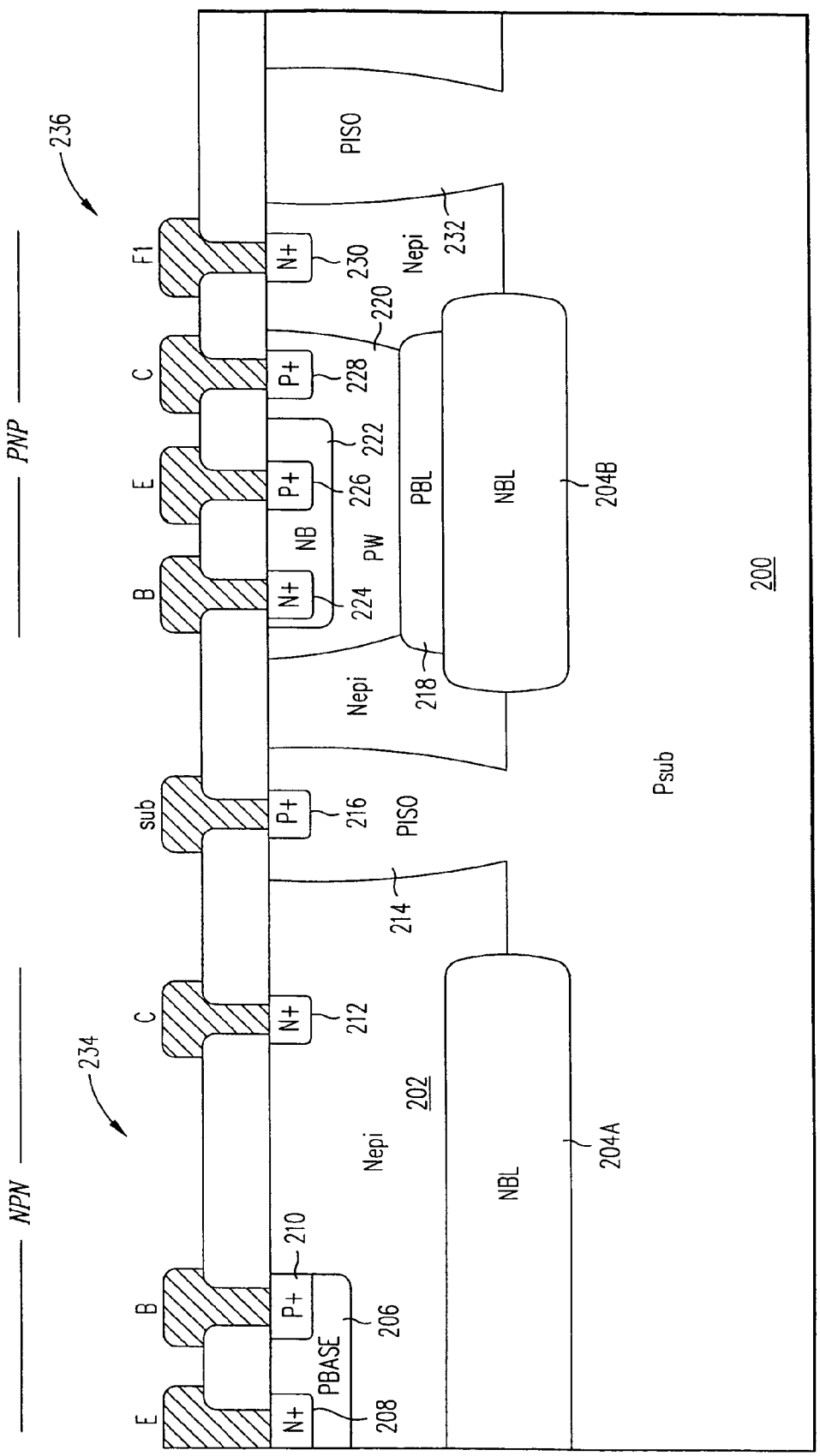
FIGS. 11A-11E illustrate several semiconductor devices formed using prior art diffusion techniques.
Figure 11B:
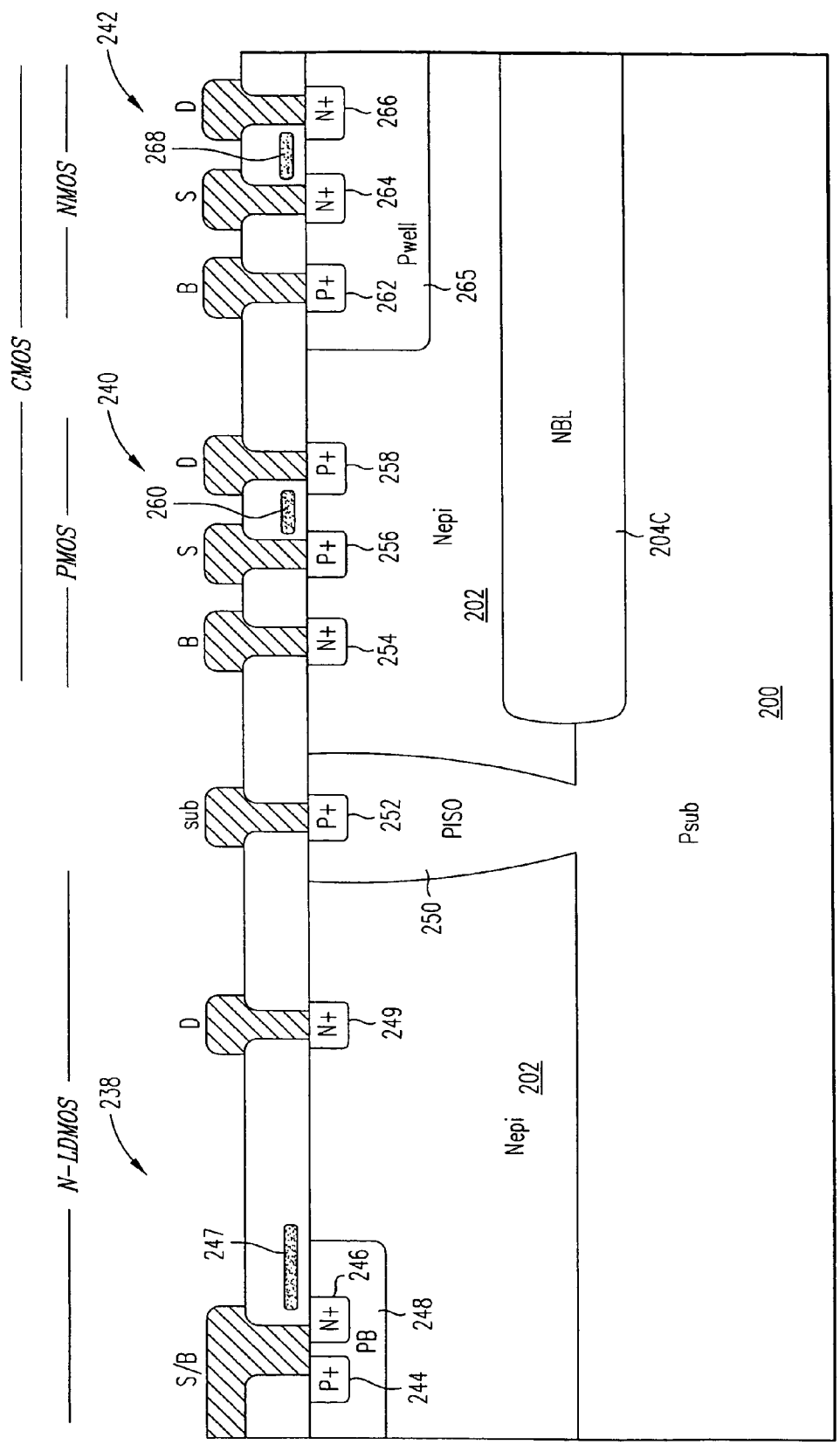
Figure 11C:
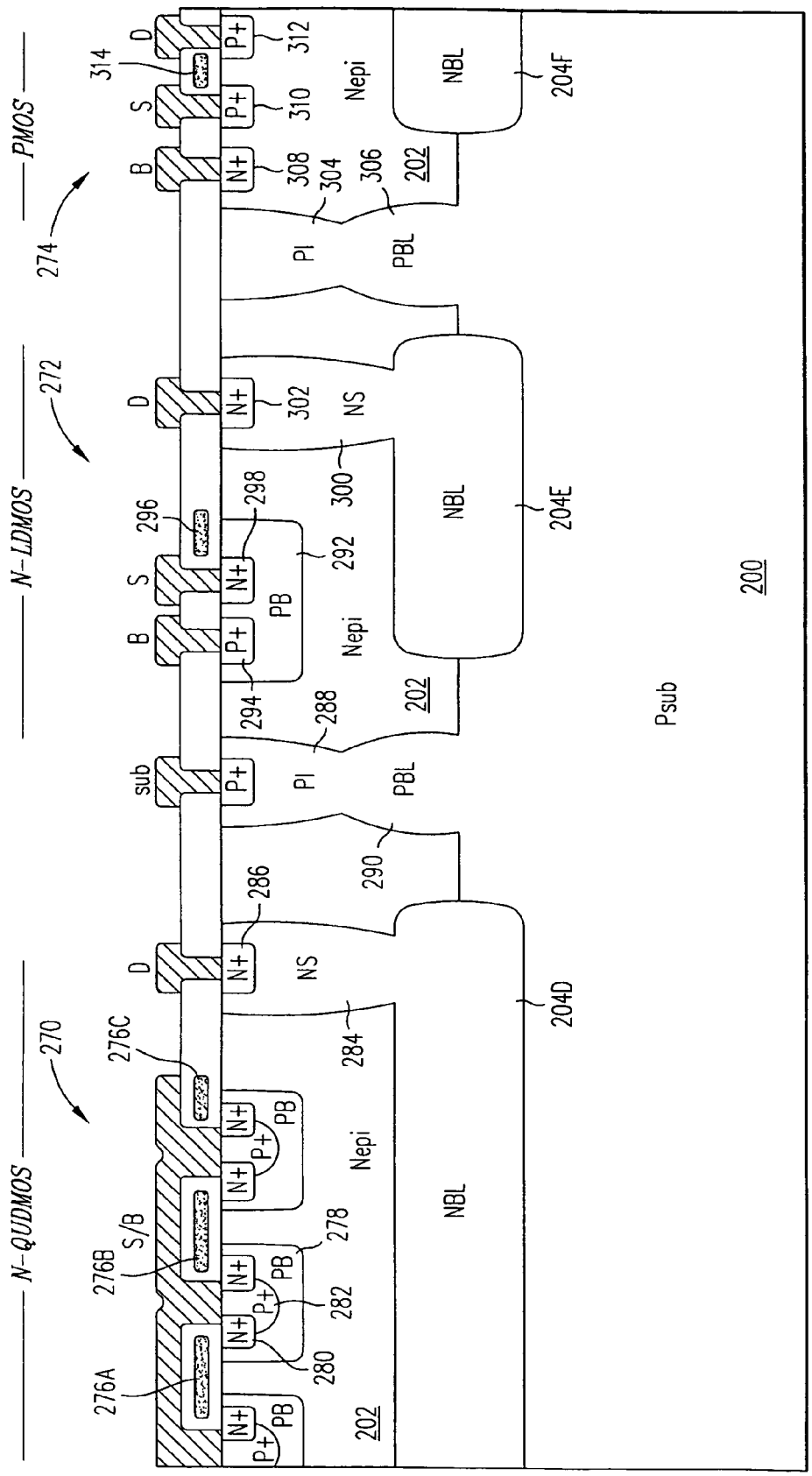
Figure 11D:
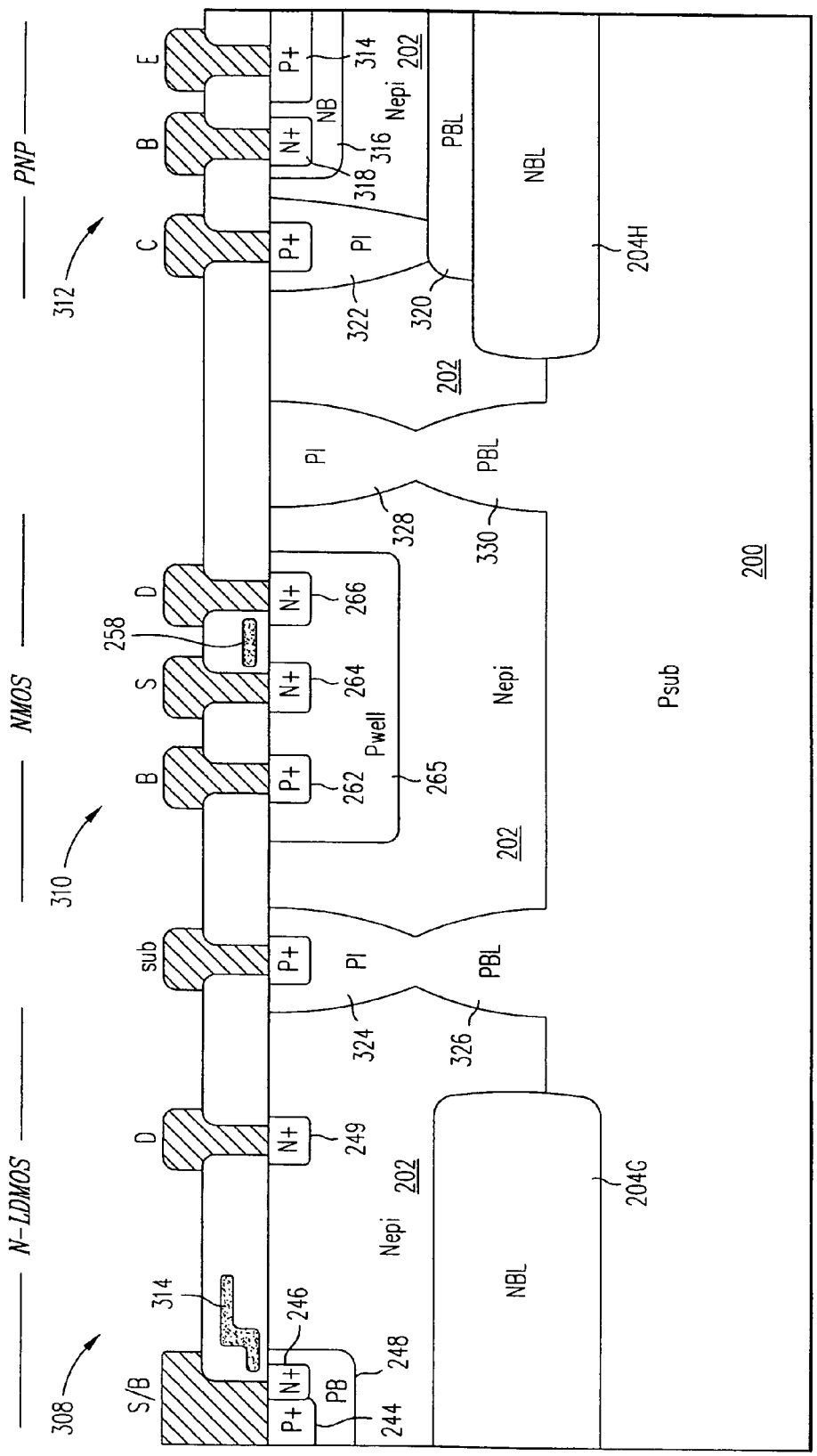
Figure 11E:
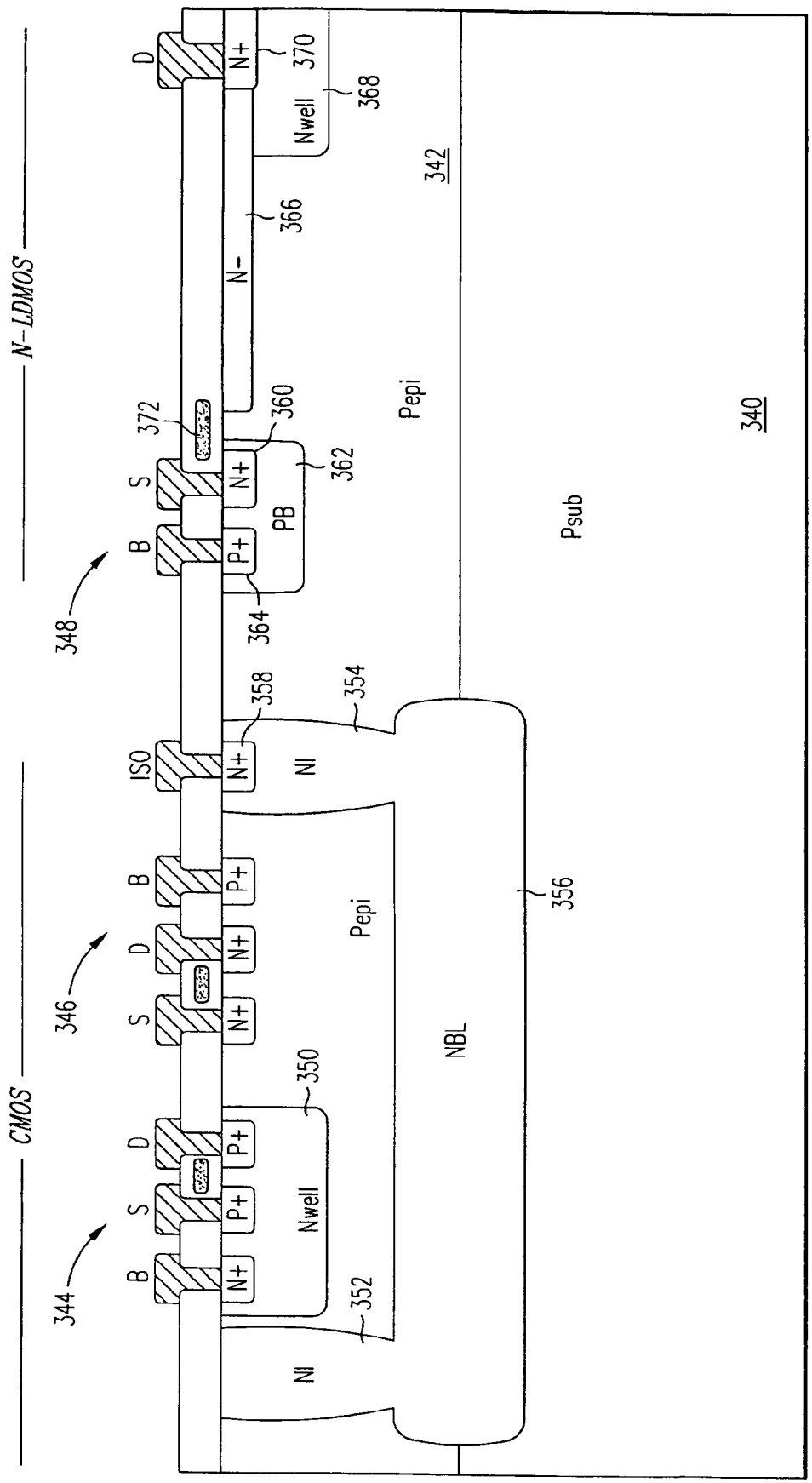
Figure 13A:
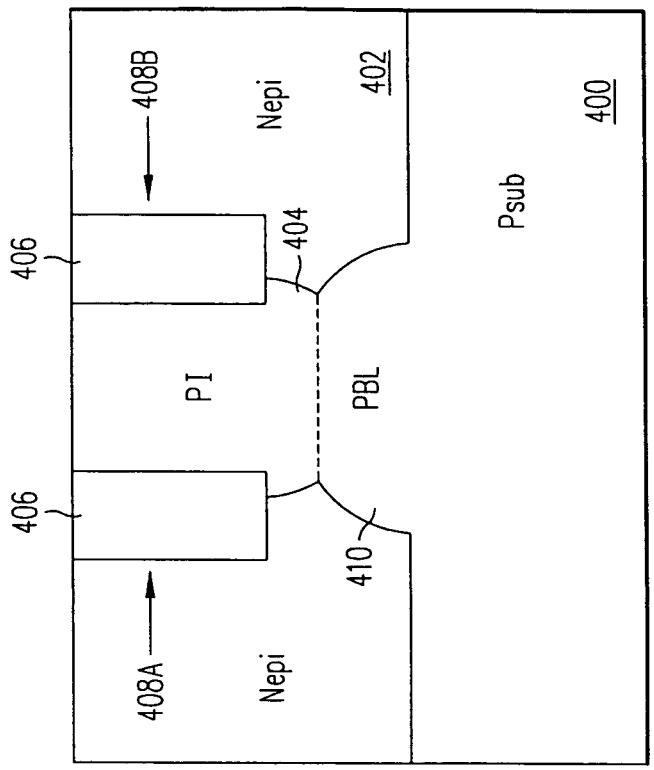
FIGS. 13A-13D illustrate several variations of the trench-constrained isolation diffusion shown in FIG. 12.
Figure 13C:
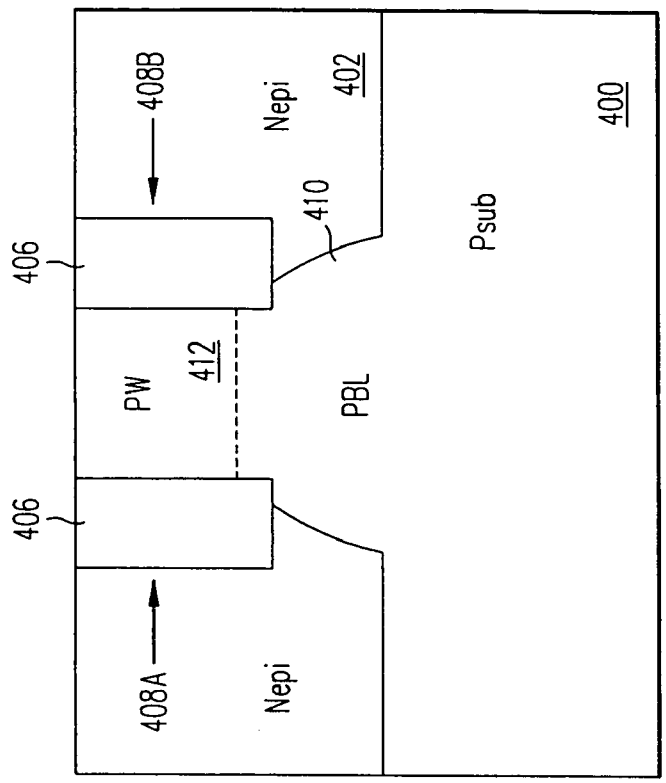
Figure 13B:
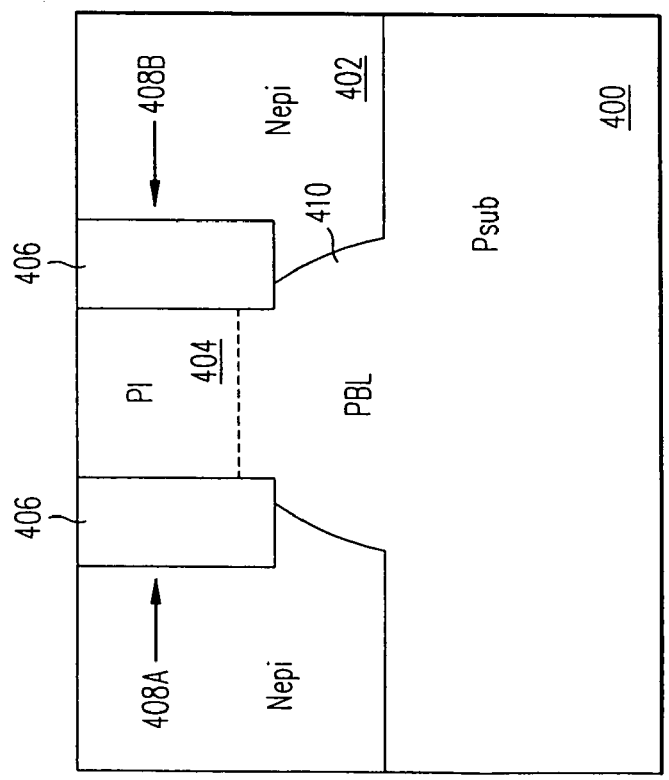

An alternative is to form a buried layer below the implant. In FIG. 13A, for example, a P buried layer 410 has been formed below P isolation region 404. For a P-type isolation column the P-type buried layer may comprise boron (or implanted aluminum), introduced prior to epitaxial growth at a dose of $1E12^{-2}$ to $4E14$ cm$^{-2}$ but preferably at a dose of $2E13^{-2}$ to $2E14^{-2}$ and at an energy typically under 120 keV, e.g. at 80 keV (but potentially as high as 300 keV). During the thermal process, P buried layer 410 diffuses upward until it merges with the down-diffusing P isolation region 404 at a location (indicated by the dashed line) below the bottom of trenches 408A and 408B. FIG. 13B shows an embodiment where the merger of P isolation region 404 and P buried layer 410 occurs in the mesa between the trenches 408A and 408B. FIG. 13C shows an embodiment where the P region is a P well 412, used to form a connection between the surface of N epi layer 402 and P substrate 400, instead of an isolation region. The P well 412 generally has a lower concentration and a lower implant dose than the comparable isolation diffusion, and often has a sufficiently low surface concentration to integrate devices, such as an NPN bipolar transistor or a PMOS, inside the well. Implant doses ranging from $1E12$ cm$^{-2}$ to $5E13$ cm$^{-2}$ are commonly used in well formation, but with the same possible range in implant energies reported for isolation implants. Since the doping concentration in a well is generally lighter than the doping concentration in an isolation region, the well diffusion may require 20% to 60% longer diffusion times (or equivalent temperature-time) to reach the targeted depth.

Figure 13D:
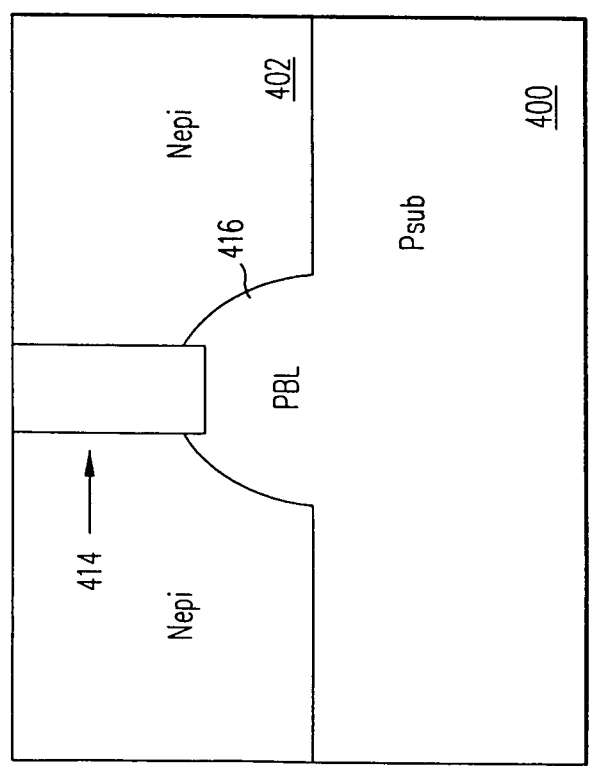

FIG. 13D shows a variation in which a single trench 414 is used, and a P buried layer 416 is diffused upward until P buried layer 416 overlaps with trench 414. If this variation is chosen, care must be taken to ensure that trench 414 is deep enough and P buried layer 416 diffuses upward enough such that P buried layer 416 in fact overlaps with trench 414. Also this variant by itself does not provide an electrical connection between the substrate and the wafer's topside as do the trench-constrained junction isolation forms.

Figure 14:
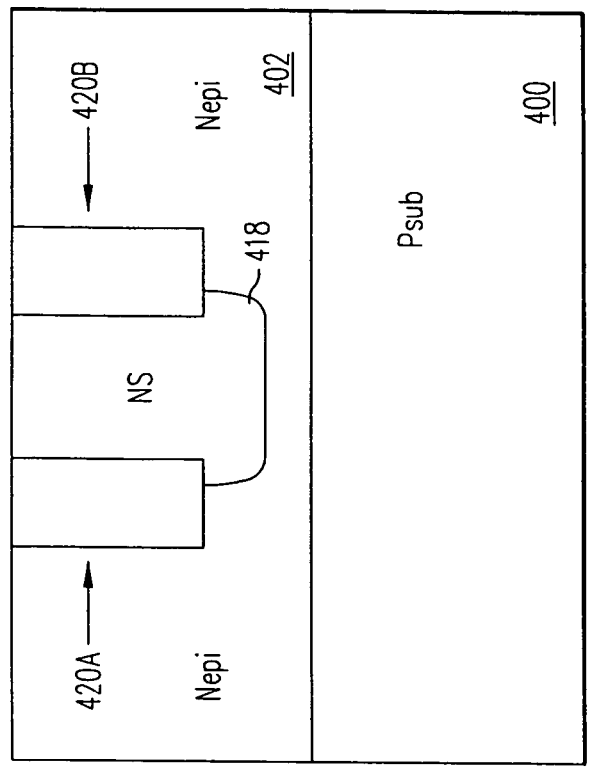
FIG. 14 illustrate a trench-constrained sinker diffusion formed in an epitaxial layer of the same conductivity type as the sinker diffusion.

As shown in FIG. 14, the technique of this invention can also be used to form a sinker region in an epi layer of the same conductivity type as the sinker region. An N sinker 418 has been implanted and diffused downward between trenches 420A and 420B, which limit the lateral spreading of N sinker 418. The dopant may be phosphorus. The implant characteristics and implant dose ranges are similar to those of the P-type (boron) implant except that phosphorus implantation requires 2.5 to 3 times the energy to reach the same depth as a boron implant. Diffusivities are also comparable to boron, but exact conditions must be considered to calculate specific cases. If the phosphorus implant is being used only to introduce the dopant as a shallow junction (but not to determine the depth of the junction), implant energies of 60 keV to 120 keV are common, with 90 keV being a typical value.

For the point of completeness, the depth of N sinker 418 in FIG. 14 is not that of a P-N junction (as in the case of P isolation diffusion 404 in FIG. 12). Since a diffused N-type region does not form a P-N junction in an N-type epitaxial layer, the "junction" is a virtual junction, one between two touching or overlapping N-type regions where the concentration differs. Typically a change of 10 to 15% in concentration can be considered as a virtual junction.

Figure 15A:
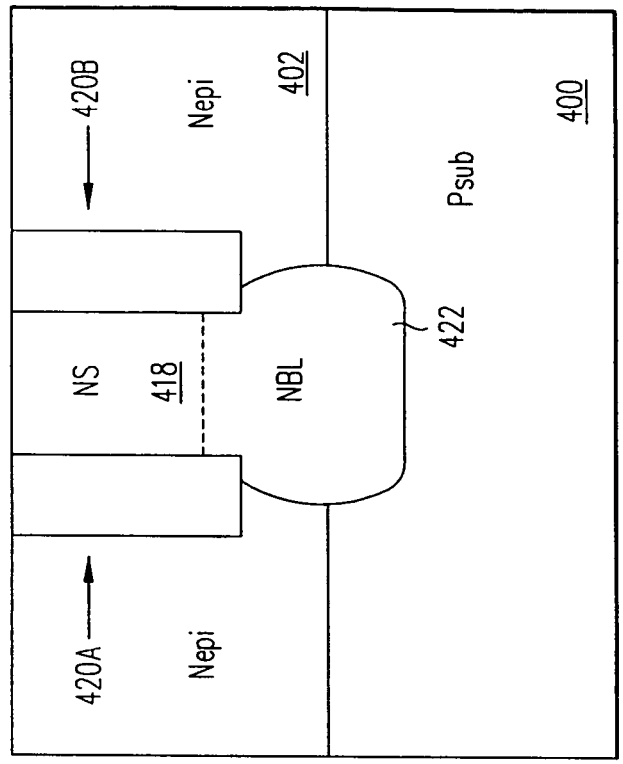
FIGS. 15A-15E illustrate several variations of the trench-constrained sinker diffusion shown in FIG. 14.
Figure 15B:
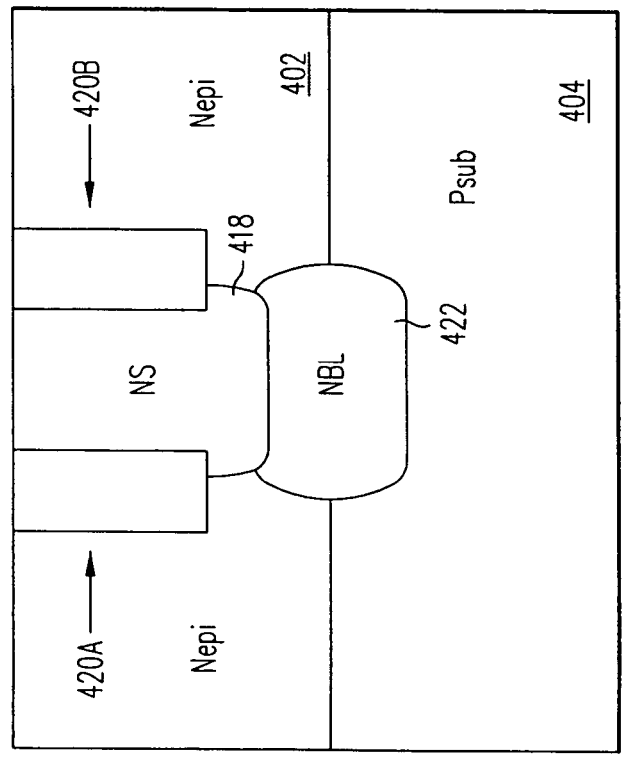
Figure 15C:
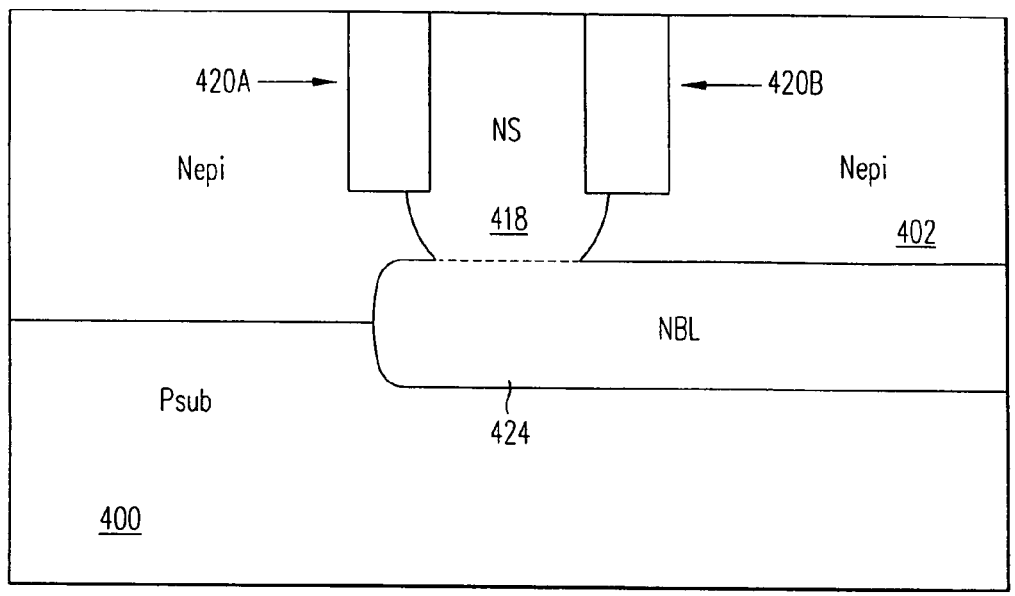
Figure 15D:
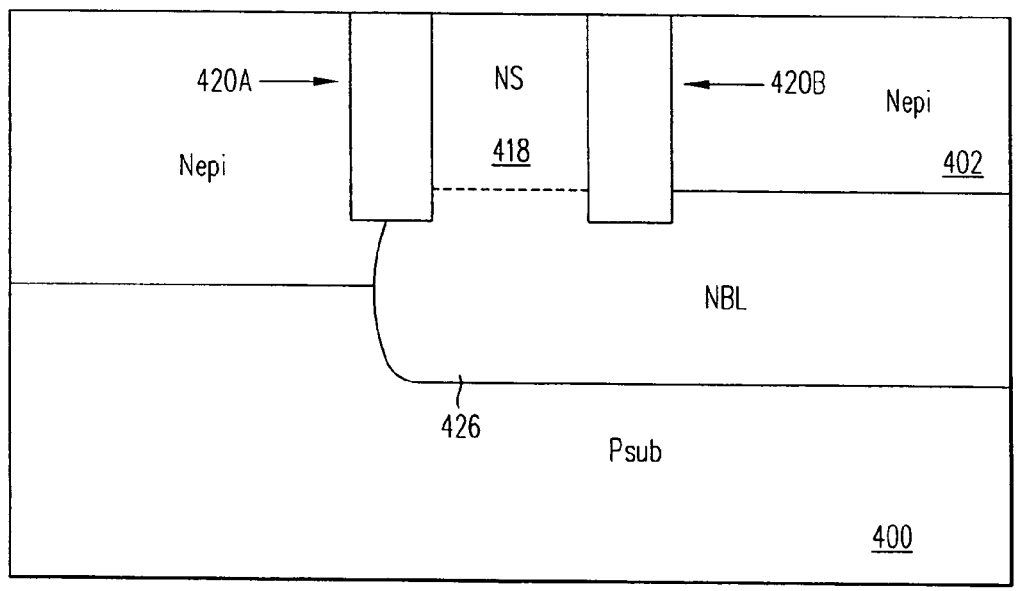
Figure 15E:
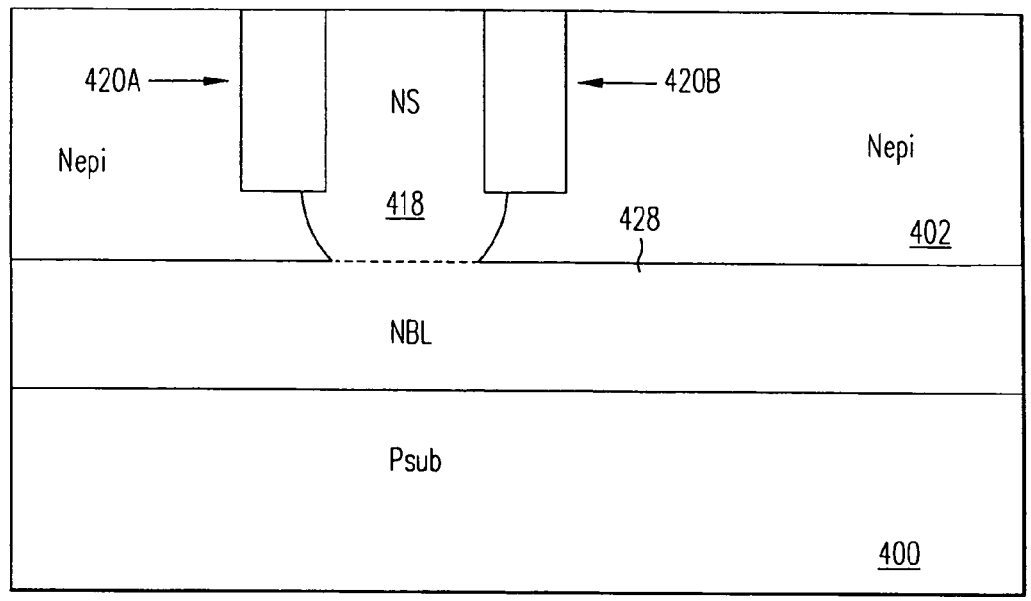

FIGS. 15A and 15B are comparable to FIGS. 13A and 13B, respectively, and show that an N buried layer 422 may diffuse upwards and merge with N sinker 418 either below the bottom of trenches 420A and 420B (FIG. 13A) or in the mesa between trenches 420A and 420B (FIG. 13B). FIGS. 15C and 15D show that the N buried layer need not be restricted to the area directly below the N sinker but may extend laterally in one or several directions. N buried layer 424 in FIG. 15C merges with N sinker 418 below the bottom of trenches 420A and 420B; N buried layer 426 in FIG. 15D merges with N sinker 418 in the mesa between trenches 420A and 420B. FIG. 15E shows an N buried layer 428 which extends laterally in two (or more) directions and merges with N sinker 418. N buried layer 422, 424, 426, and 428 may be arsenic, antimony or phosphorus implanted at 60 keV to 180 keV and at a dose ranging from $1E12$ cm$^{-2}$ to $5E15$ cm$^{-2}$ (but typically from $5E14$ cm$^{-2}$ to $3E15$ cm$^{-2}$). The N buried layer should be diffused prior to epitaxial growth to prevent outgasing and lateral autodoping during epitaxy. Aforementioned prior art diffusion cycles typical to prior art buried layer formation are applicable and adequate for preparing for epitaxial growth. N buried layers 424, 426 and 428 more commonly comprise a slow diffusing dopant such as arsenic or antimony to prevent updiffusion and loss of the "flat zone" of epitaxial thickness 402.

N buried layers 422, 424, 426 or 428 may also be implanted at a much higher dose (e.g. over $5E15$ cm$^{-2}$) but must be annealed at high temperatures to remove the formation of crystal defects and stacking faults during epitaxial growth.

Figure 16A:
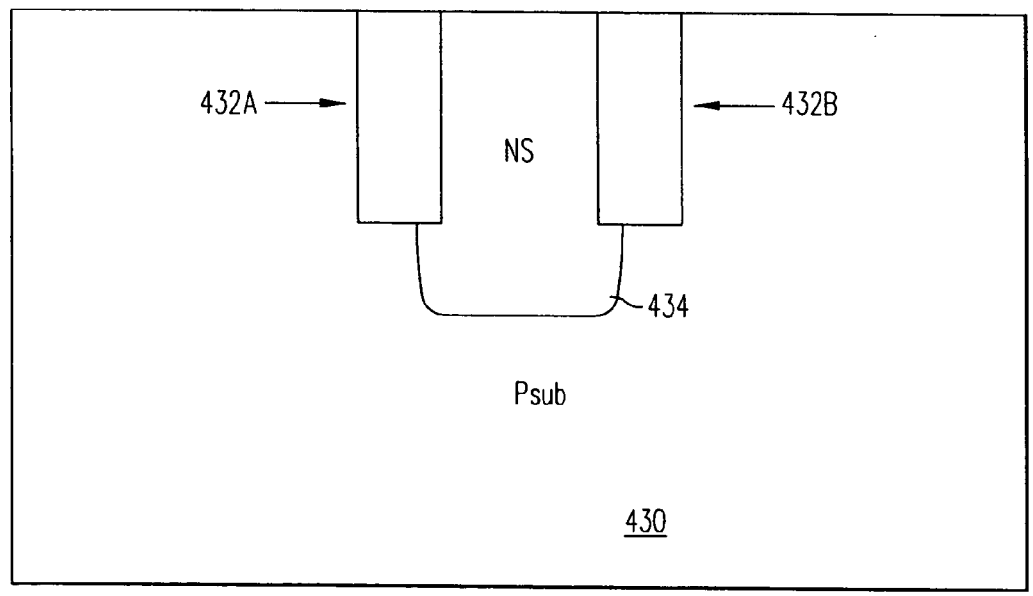
FIG. 16A illustrates a trench-constrained N-type sinker in a P-type substrate.
Figure 16B:
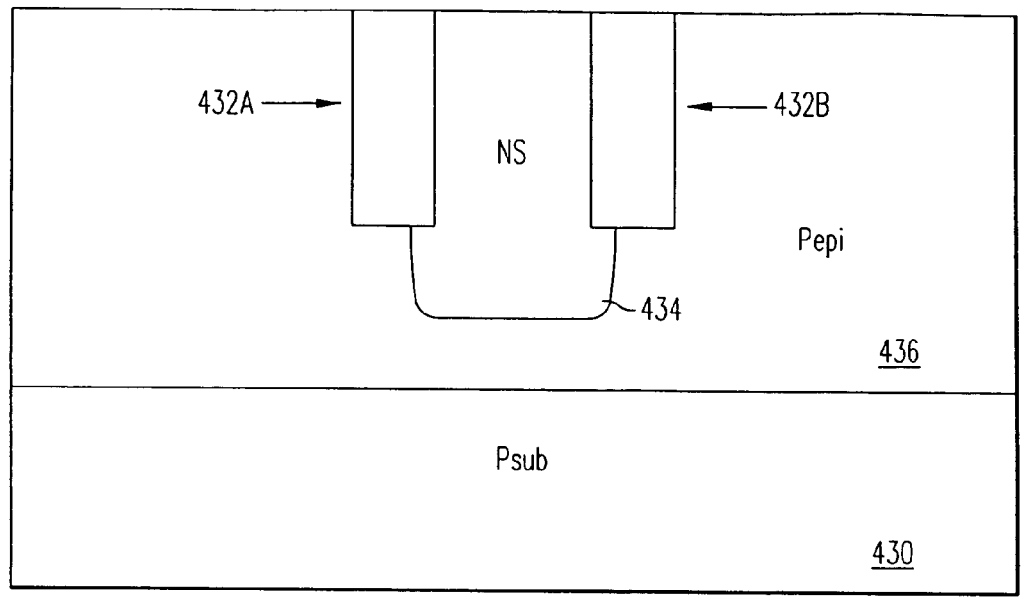
FIG. 16B illustrates a trench-constrained N-type sinker in a P-type epitaxial layer.
Figure 16C:
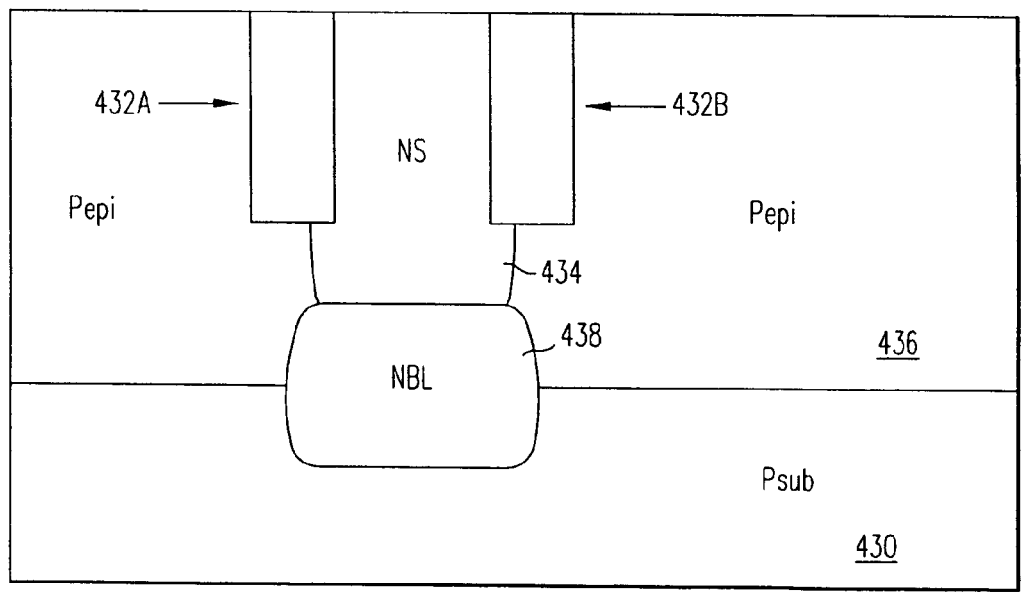
FIG. 16C illustrates a trench-constrained N-type sinker merging with an underlying N buried layer.
Figure 16D:
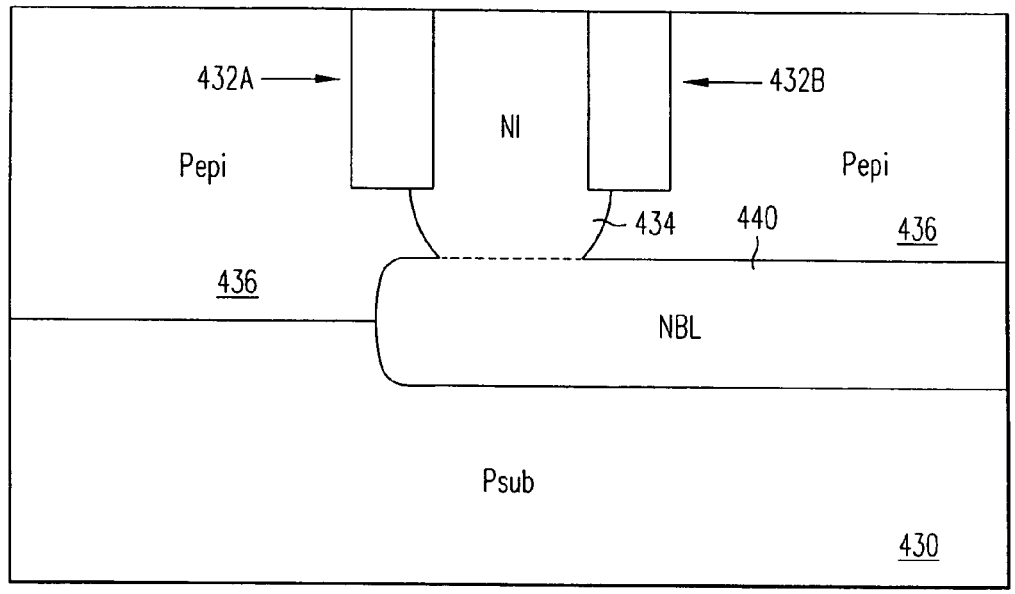
FIGS. 16D and 16E illustrate a trench-constrained N-type sinker formed as part of a wraparound isolation structure.
Figure 16E:
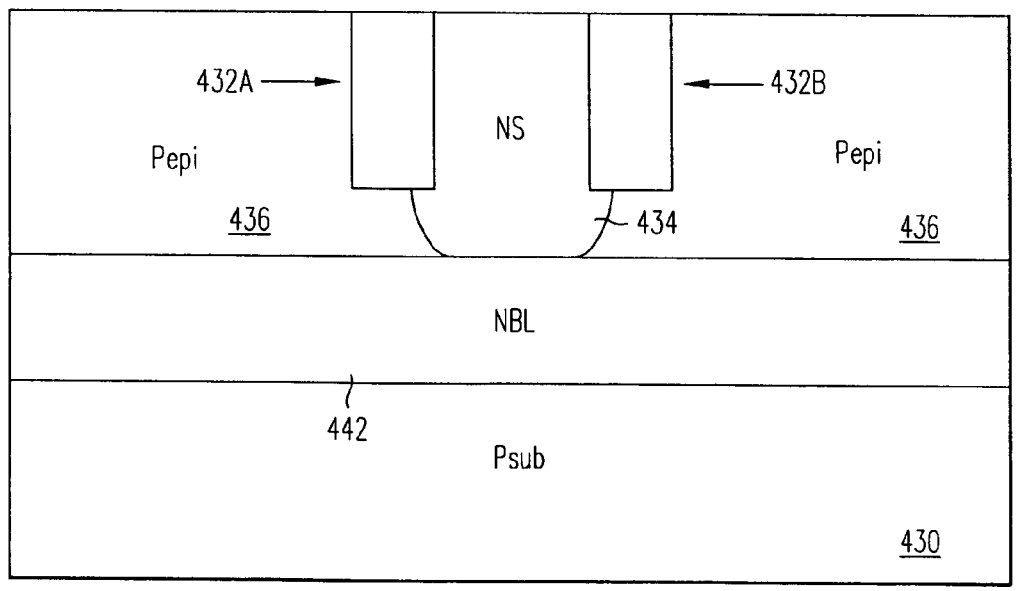

FIG. 16A shows an embodiment that includes an N sinker 434 between trenches 432A and 432B in a P substrate 430. Its formation is similar to the N sinker 418 of FIG. 14, except that it is formed in P-type material rather than in an N-type epitaxial layer. FIG. 16B is similar to FIG. 16A, except that trenches 432A and 432B and N sinker 434 are formed in a P epi layer 436 instead of P substrate 430. FIG. 16C is similar to FIG. 16B but shows N sinker 434 merging with a P buried layer 438, which is formed at the interface between P substrate 430 and P epi layer 436 and diffuses upward to merge with N sinker 434. FIG. 16D shows N sinker 434 merging with an N buried layer 440 that extends laterally in one direction, forming a wraparound isolation structure around the portion of P epi layer 436 to the right of trench 432B. FIG. 16E shows a structure similar to that shown in FIG. 16D, but N buried layer 442 extends in two (or more) directions to create a number of isolated pockets within P epi layer 436.

Figure 17:
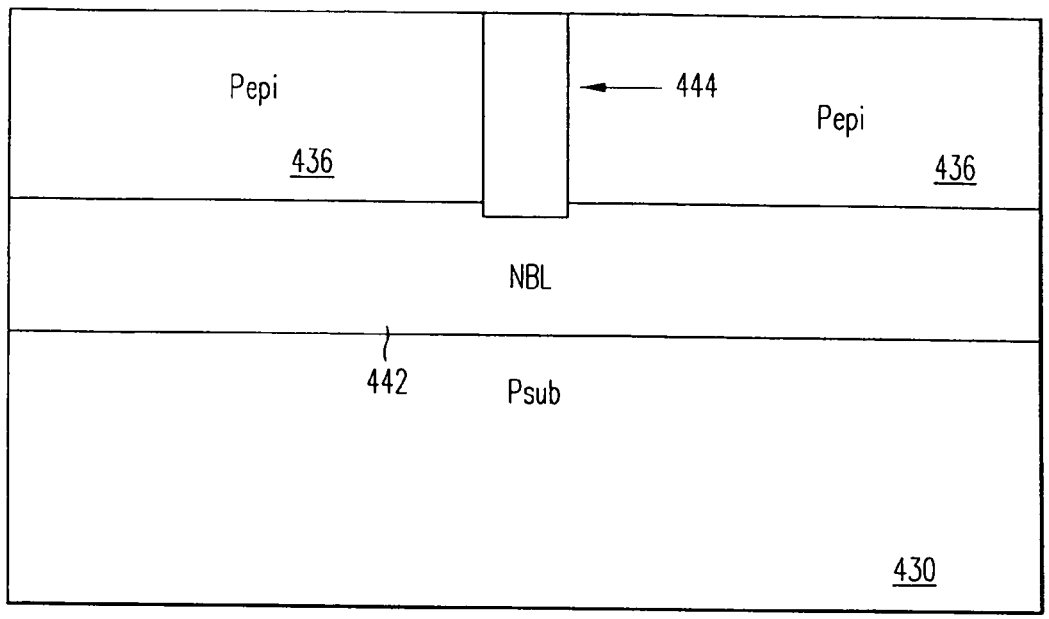
FIG. 17 illustrates an isolation structure including a dielectric-filled trench that extends into an N buried layer.

In FIG. 17, isolated pockets of P epi layer 436 are formed by causing N buried layer to diffuse upward until N buried layer 442 overlaps a dielectric-filled trench 444.

Figure 18:
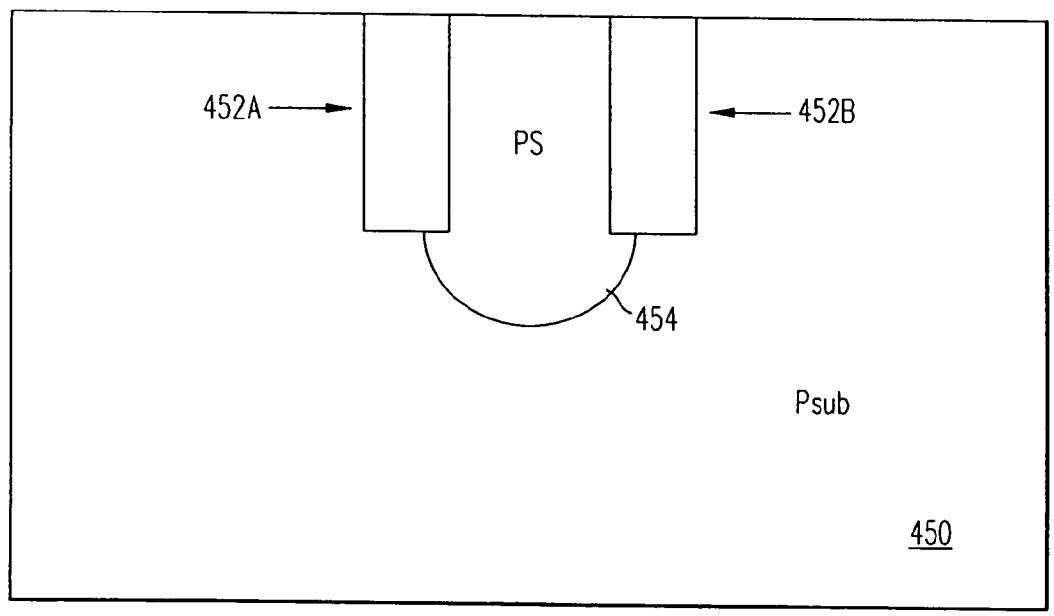
FIG. 18 illustrates a P-type trench-constrained sinker formed in a P-type substrate.
Figure 19:
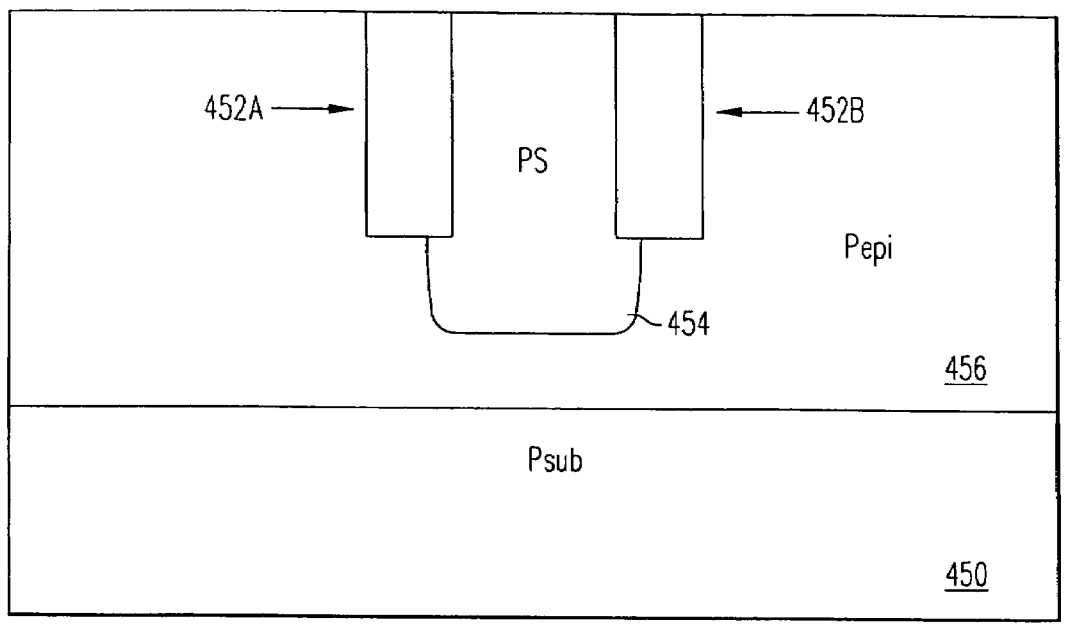
FIG. 19 illustrates a P-type trench-constrained sinker formed in a P-type epitaxial layer.

FIG. 18 shows an embodiment that includes a P sinker 454 between trenches 452A and 452B in a P substrate 450. This embodiment, with a P sinker being formed in P-type material or epi, is analogous to the arrangement of an N sinker in an N-epi layer shown in FIG. 14, except that all P-type and N-type regions are swapped. FIG. 19 is similar to FIG. 18, except that trenches 452A and 452B and P sinker 454 are formed in a P epi layer 456 instead of P substrate 450.

Figure 20:
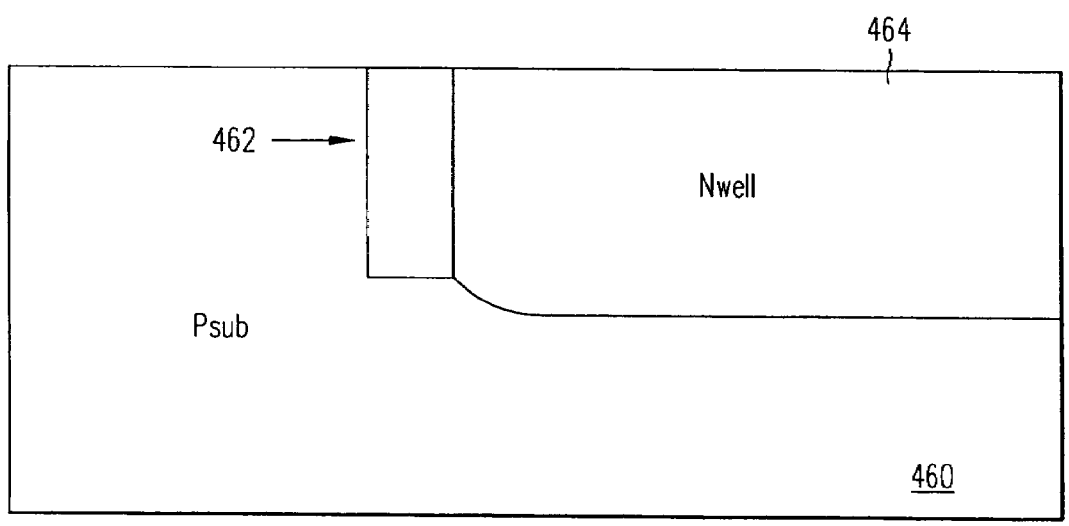
FIG. 20 illustrates a trench-constrained N well formed in a P substrate.
Figure 21:
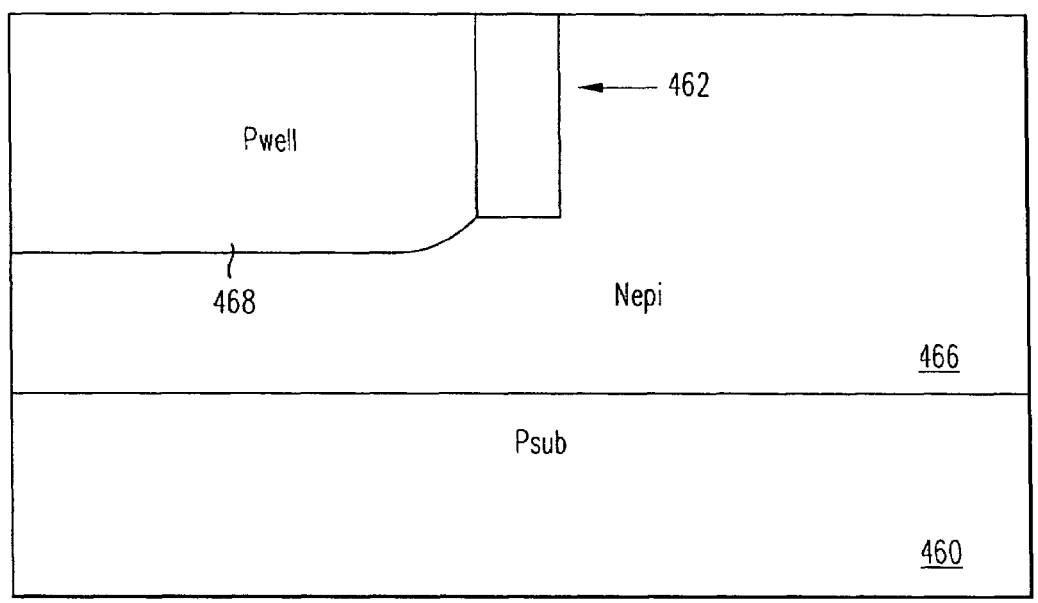
FIG. 21 illustrates a trench-constrained P well formed in an N epitaxial layer.

FIG. 20 shows a single dielectric-filled trench 462 formed in a P substrate 460, and an N well 464 diffused into P substrate 460, with the trench 462 preventing N well 464 from diffusing into a portion of P substrate 460 located to the left of trench 462. FIG. 21 shows trench 462 formed in an N epi layer 466 grown on top of P substrate 460, with trench 462 preventing P well 468 from diffusing into a portion of N epi layer 466 located to the right of trench 462. In either case, this structure offers two benefits: it prevents any PN junction from being formed at the surface, where the doping concentration is high;

and it minimizes lateral diffusion at the well edge. Note that some enhanced diffusion and increased junction depth may occur at the well edge.

Figure 22B:
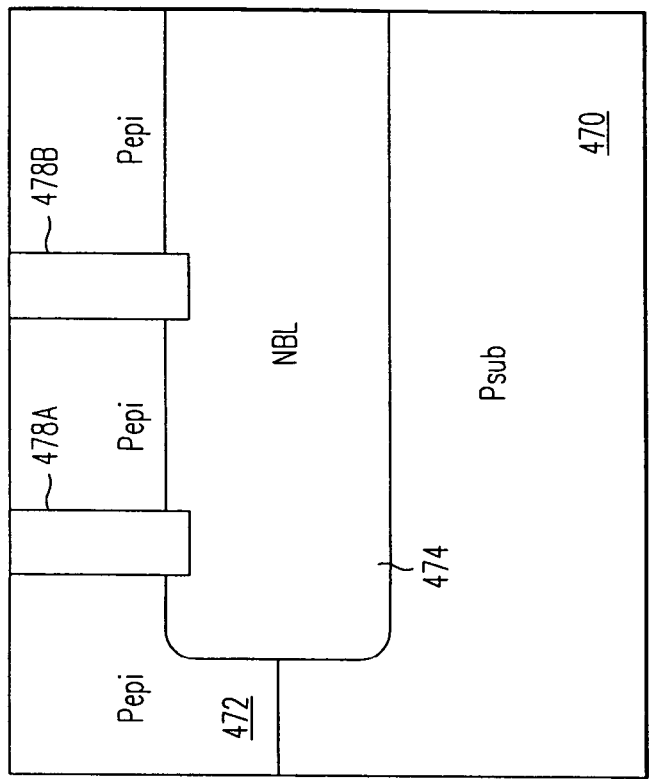
FIGS. 22A and 22B illustrate the formation of isolated pockets of a P epitaxial layer using a dielectric-filled trench and an N buried layer.
Figure 22A:
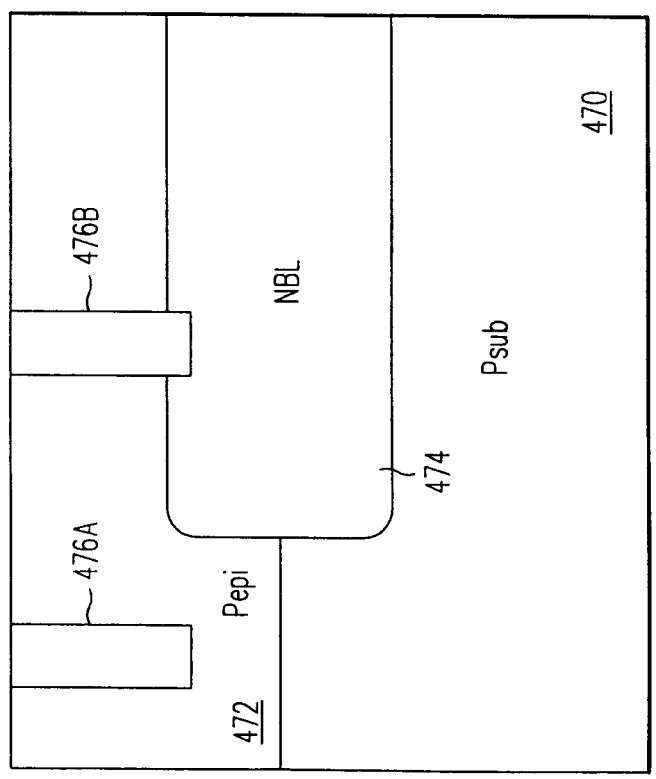

FIGS. 22A and 22B show how trenches formed in a P epi layer 472 can be used in conjunction with an N buried layer 474 to form isolated pockets of P epi layer 472. In FIG. 22A only trench 476B extends into N buried layer 474; trench 476A does not. In FIG. 22B both of trenches 478A and 478B extend into N buried layer 474. In both cases the same trenches may be used to form trench-constrained diffusions as isolation, wells or sinker regions.

Figure 23B:
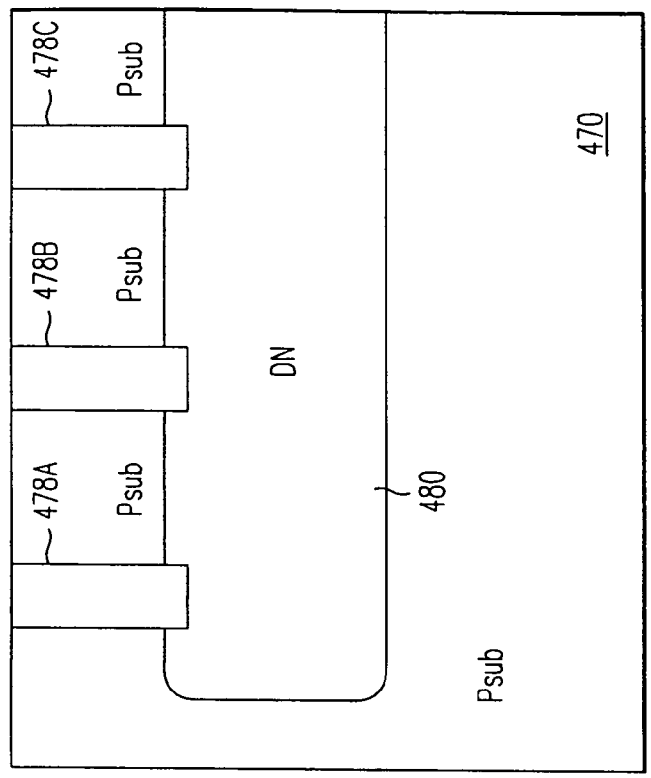
FIGS. 23A and 23B illustrate the formation of isolated pockets of a P substrate using a dielectric-filled trench and an implanted deep N region.
Figure 23A:
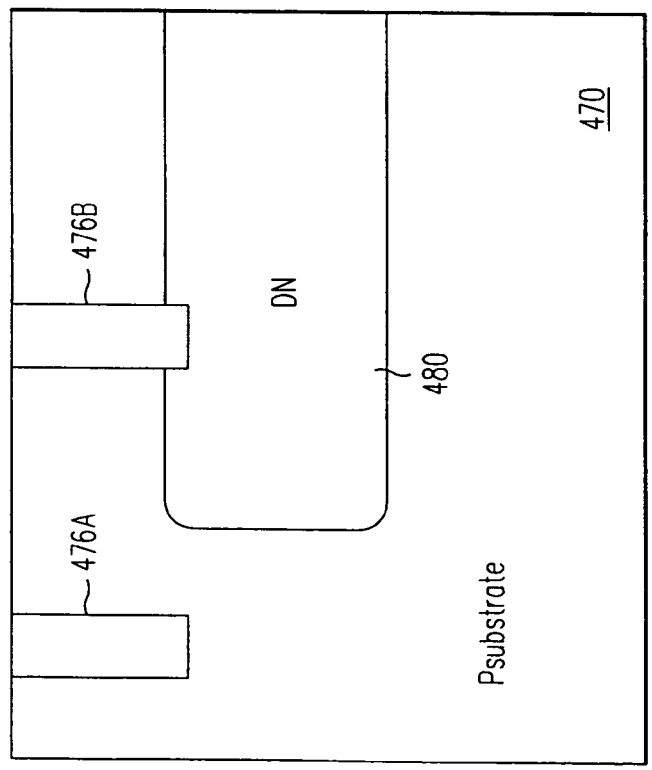

FIGS. 23A and 23B are similar to FIGS. 22A and 22B except that here, instead of an N buried layer formed by diffusion at the interface of P substrate 470 and P epi layer 472, a deep N region 480 is formed by implanting N-dopant into P substrate 470, as described in greater detail in application Ser. No. 10/218,668, filed on Aug. 14, 2002, which is incorporated herein by reference in its entirety. In FIG. 23A only trench 476B extends into deep N region 480; trench 476A does not. In FIG. 22B trenches 478A, 478B and 478C all extend into deep N region 480. The trenches may also be used to form trench-constrained diffusions, either as sinkers, isolation, or wells.

Figure 24B:
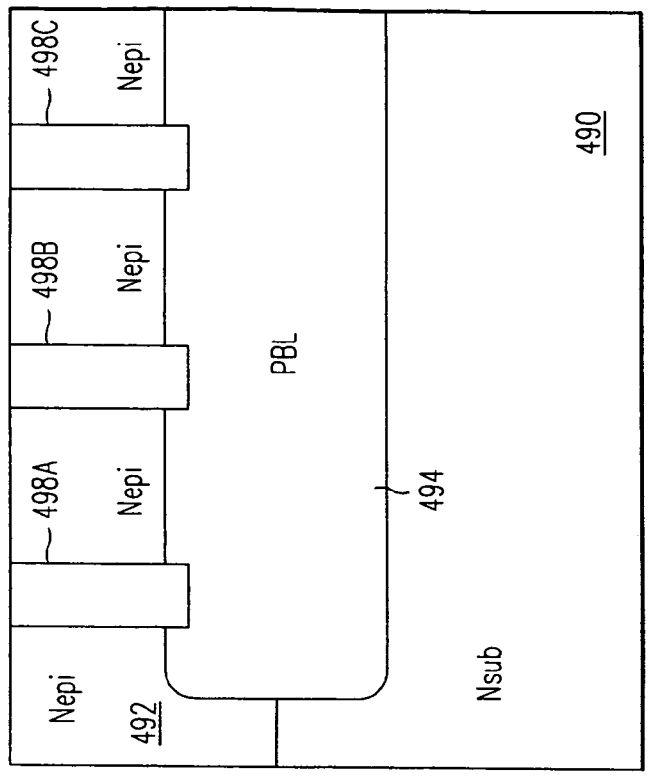
FIGS. 24A and 24B illustrate the formation of isolated pockets of an N epitaxial layer using a dielectric-filled trench and a P buried layer.
Figure 24A:
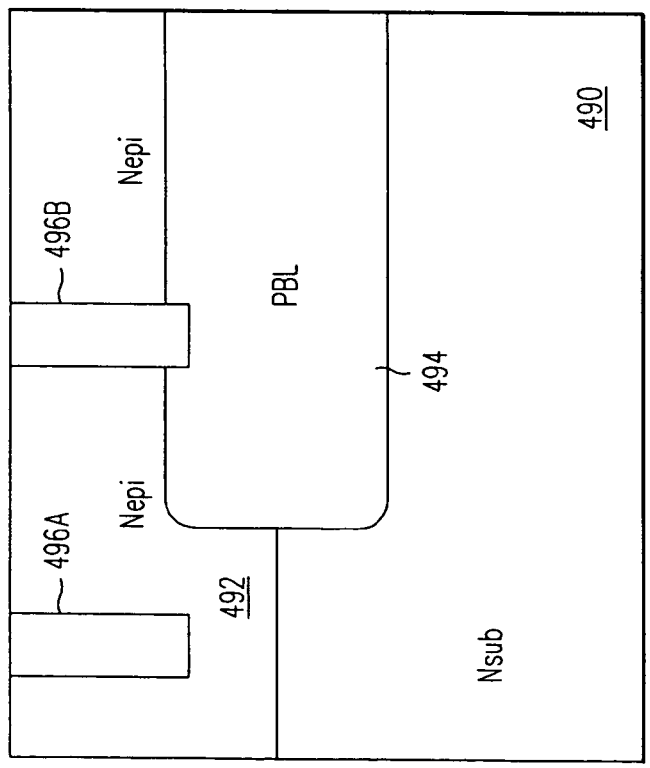

FIGS. 24A and 24B show how trenches formed in an N epi layer 492 can be used in conjunction with a P buried layer 494 to form isolated pockets of N epi layer 492. In FIG. 24A only trench 496B extends into P buried layer 494; trench 496A does not. In FIG. 24B trenches 498A, 498B and 498C all extend into P buried layer 494. The trenches may also be used to form trench-constrained diffusions, either as sinkers, isolation, or wells.

Figure 25B:
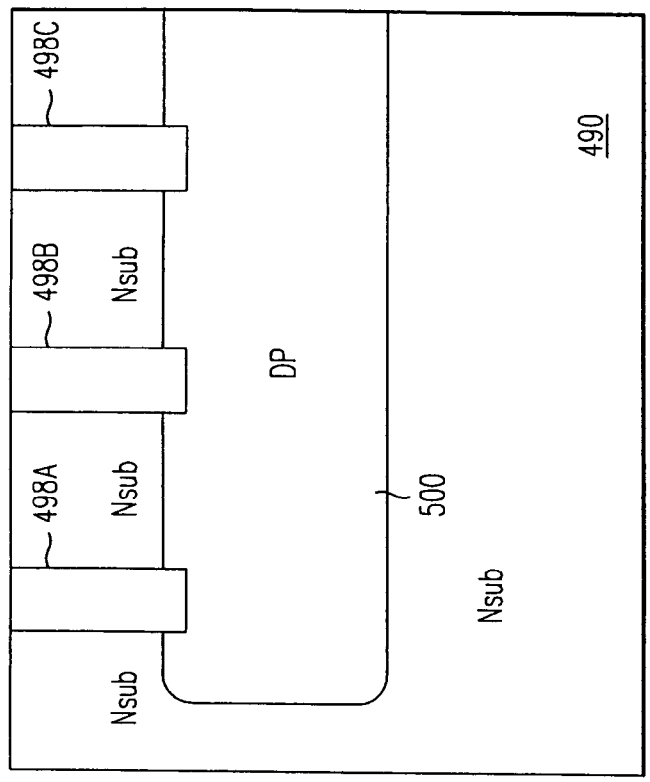
FIGS. 25A and 25B illustrate the formation of isolated pockets of an N substrate using a dielectric-filled trench and an implanted deep P region.
Figure 25A:
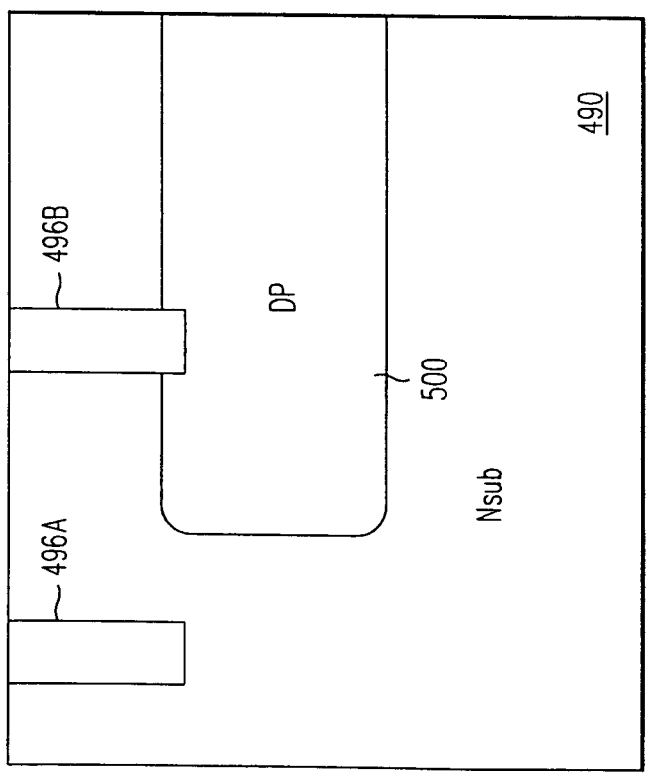

FIGS. 25A and 25B are similar to FIGS. 24A and 24B except that here, instead of a P buried layer formed by diffusion at the interface of N substrate 490 and N epi layer 492, a deep P region 500 is formed by implanting P-dopant into N substrate 490, as described in the above-referenced application Ser. No. 10/218,668. In FIG. 25A only trench 496B extends into deep P region 500; trench 496A does not. In FIG. 25B trenches 498A, 498B and 498C all extend into deep P region 500. The trenches may also be used to form trench-constrained diffusions, either as sinkers, isolation, or wells.

Figure 26B:
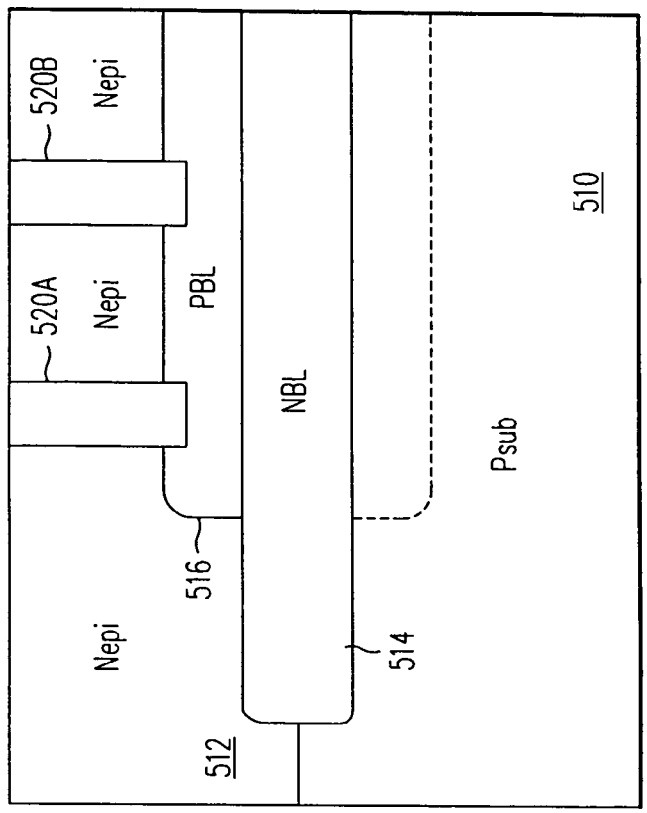
FIGS. 26A and 26B illustrate the formation of isolated pockets of an N epitaxial layer using a dielectric-filled trench and a P buried layer, with the P buried layer being isolated from a P substrate by an N buried layer.
Figure 26A:
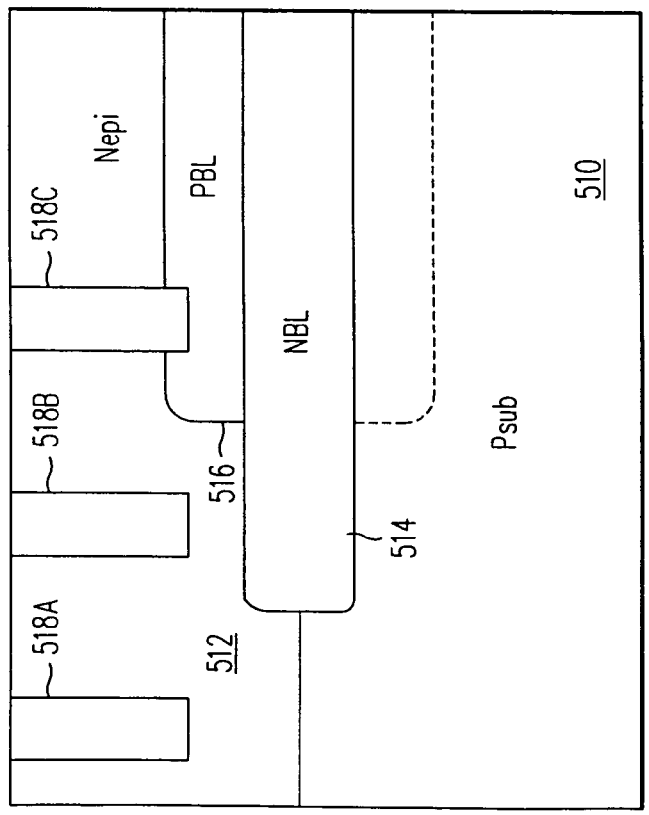

FIGS. 26A and 26B show a structure that includes an N buried layer 514 and a P buried layer 516 formed at an interface between a P substrate 510 and an N epi layer 512. P buried layer 516 has diffused upward beyond the upper edge of N buried layer 514. This, in combination with the fact that N buried layer 514 extends laterally beyond P buried layer 516, produces a portion of P buried layer 516 that is above N buried layer 514 and is isolated from P substrate 510. The trenches may also be used to form trench-constrained diffusions, either as sinkers, isolation, or wells.

N epi layer 512 can be divided into isolated pockets by dielectric-filled trenches that extend downward from the surface of N epi layer 512. In FIG. 26A, a dielectric-filled trench 518C divides N epi layer 512 into isolated pockets. In FIG. 26B, each of dielectric-filled trenches 520A and 520B divides N epi layer 512 into isolated pockets. Normally, the dielectric-filled trenches should extend into P buried layer 516, but in order to permit current to flow laterally throughout P buried layer 516 the trenches should not extend through P buried layer 516 and into N buried layer 514. The trenches may also be used to form trench-constrained diffusions, either as sinkers, isolation, or wells.

It is important here to re-iterate the difference between trench constrained diffusions (and more generally as trench constrained junctions), and deep trench oxide isolation. Deep trench isolation (DTI) uses a trench that completely cuts through the epitaxial layer and into the underlying substrate. Therefore in a DTI process, in any cross section where the trench is present, lateral current flow (in wells, diffused junctions and even buried layers) is cut off, i.e. interrupted by the presence of the trench. For example when it is desirable to completely isolate unrelated devices from one another, like the collectors of two adjacent bipolar devices, the depth of a DTI-type trench is useful. But in the cross section of a bipolar, lateral current flow between the base and the collector cannot be cutoff by a deep trench, meaning a DTI-type trench cannot be used "inside" the bipolar but only between bipolars. Consider for example the structure of FIG. 26B, where trenches 520S and 520B extend into, but not completely through, P buried layer 516. Because the PBL layer 516 is not "cut", current can flow laterally in said layer, facilitating contact to the layer in locations other than those where active devices may be constructed. Also, electrical contact to N buried layer 514 may also be made anywhere along a device's lateral extent, including the edge, and N buried layer 514 will still be biased to a common potential, allowing lateral current flow (parallel to the wafer's surface) in NBL 514. If a DTI trench were used, the N buried layer would be cut into separate islands, each one requiring its own electrical contact. A similar argument holds for the trenches overlapping N buried layer 479 in FIG. 22B.

FIGS. 27A-27I illustrate a possible process for forming a dielectric-filled trench. The trench is shown as being formed in an epi layer that is grown on a substrate. As indicated above, the epi layer and substrate could be of the same electrical conductivity type (either N or P) or of different conductivity types. Moreover, as indicated in FIGS. 23A and 23B, for example, in some embodiments the trench may be formed in a substrate without an epitaxial layer. The process would remain essentially the same in those conditions except the criteria for trench depth may differ.

As shown in FIG. 27A, a hard mask layer 534 of a material such as an oxide or nitride (or a sandwich thereof) is formed on the surface of epi layer 532. Hard mask layer 534 is masked with a photoresist layer 536, and etched to form an opening 358. As shown in FIG. 27B, a trench 540 is etched, typically using a reactive ion etch (RIE). While in processes for producing trench-gated MOSFETs photoresist layer 536 is often removed before the RIE, here it may be desirable to leave photoresist layer 536 in place during the RIE, since the trench may be deeper (e.g., 2-4 μm deep) than the trenches commonly used for trench gated vertical power MOSFETs. Alternatively, the thickness of the hard mask layer 534 can be increased to survive the silicon trench etching process.

Figure 27F:
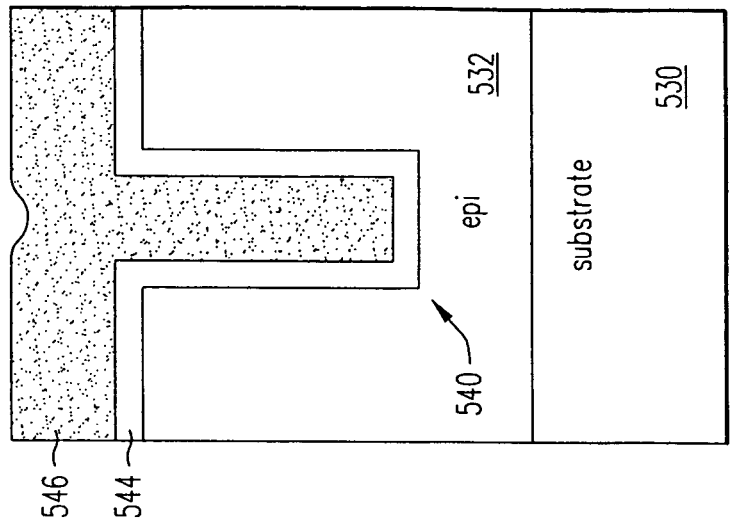
Figure 27E:
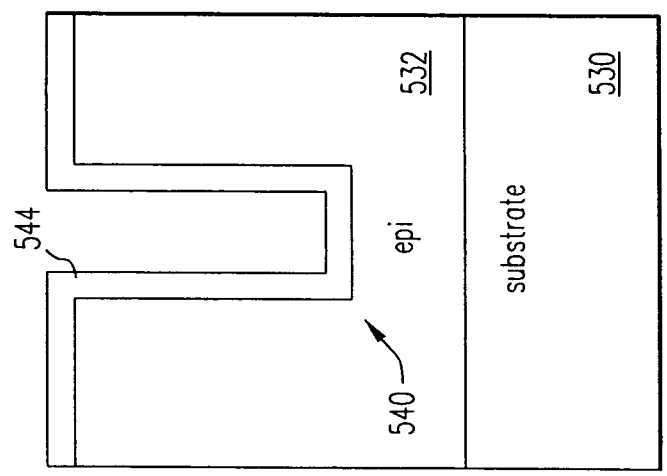
Figure 27D:
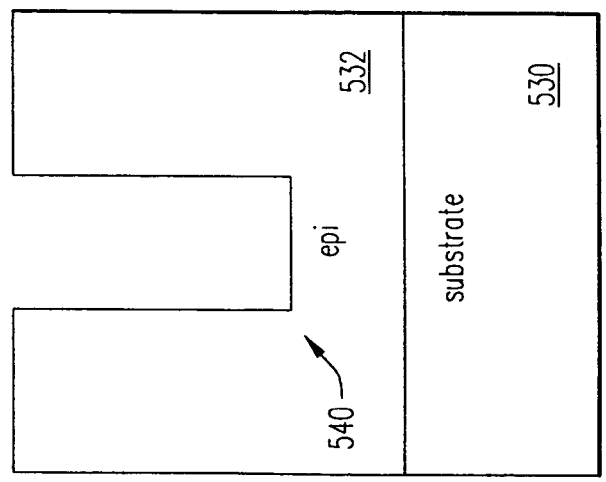

Hard mask layer 534 and photoresist layer 536 are removed (or with a mask selectively removed) and, optionally, a sacrificial oxide layer 542 is formed on the walls of trench 540, as shown in FIG. 27C, and removed, as shown in FIG. 27D. This serves to repair the crystal damage that ordinarily occurs during an RIE process. An oxide liner 544 is grown on the walls of trench 540, as shown in FIG. 27E, and a dielectric 546 such as a TEOS oxide is deposited in trench 540 and over the surface of epi layer 532, as shown in FIG. 27F. Oxide liner 544 acts as a shield against dopants, such as boron and/or phosphorus, that may be included in dielectric 546 to make dielectric 546 flow and fill into trench 540 more readily. The electrical characteristics of the devices could be altered if such dopants were allowed enter epi layer 532. In some cases it may be possible to omit the oxide liner, possibly by first depositing an undoped oxide into the trench.

Figure 27I:
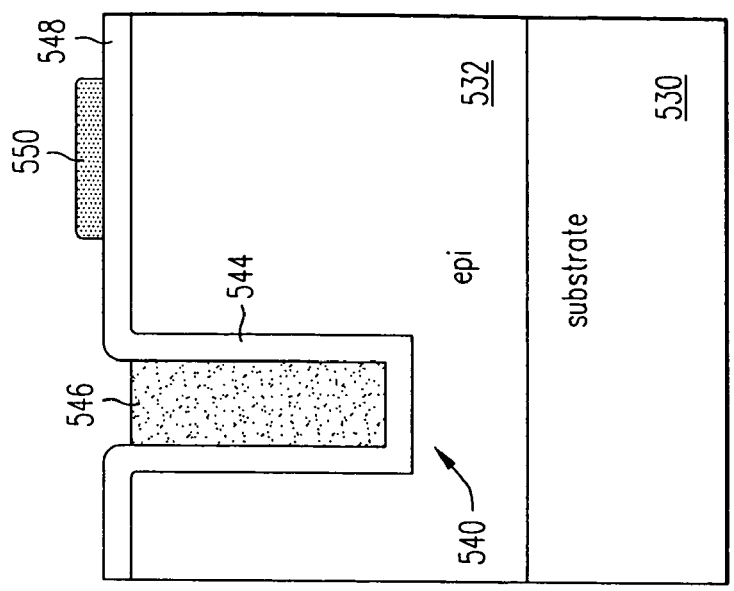
Figure 27H:
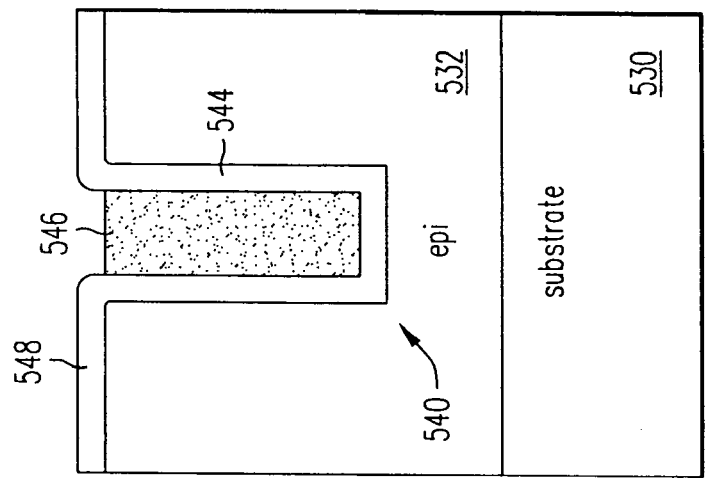
Figure 27G:
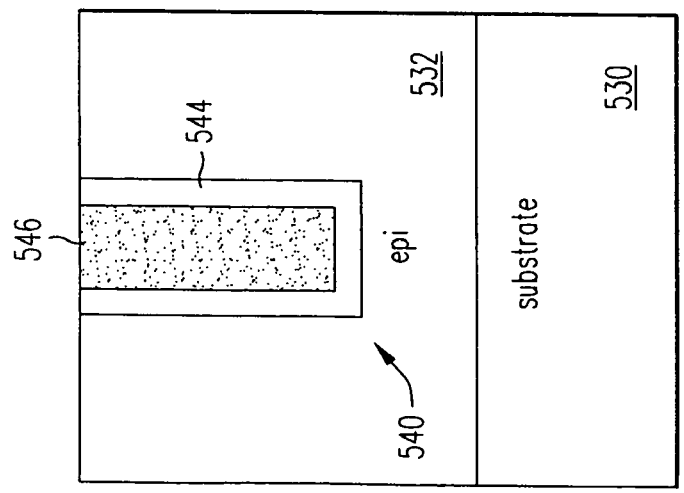

Next, the top surface of the structure can be planarized by chemical-mechanical polishing (CMP) to form a semi-flat surface as shown in FIG. 27G. The surface of epi layer 532 is re-oxidized to form an oxide layer 548, as shown in FIG. 27H. Since the oxidation process consumes part of epi layer 532 but not the oxide 546 (which is already oxidized), an indentation is produced over trench 540. Alternatively, a portion of oxide liner 544 may be left on the top surface of epi layer 532 in the planarization process, in which case the re-oxidation step shown in FIG. 27H may be unnecessary.

An alternative is to perform an etchback of the glass 546 in FIG. 27F, which will not produce as planar a surface as shown in FIG. 27G. Some indentation over the trench is likely since deposited oxides tend to etch faster. Next, a silicon nitride layer may be deposited and planarized using CMP methods to cap or seal the top of the trench with nitride.

As shown in FIG. 27I, a polysilicon layer 550 can be deposited and patterned on oxide layer 548 for use in forming a resistor or capacitor. If a capacitor is to be formed between polysilicon layer 550 and epi layer 532, the thickness of oxide layer 548 is critical and it may be desirable to grow oxide layer 548 by thermal means rather than depositing oxide layer 548, since thermal processes generally provide greater control over the thickness of an oxide layer than deposition processes. This factor is not important if polysilicon layer 550 is to be used either as a resistor or as a capacitor with another, overlying polysilicon layer.

Figure 28:
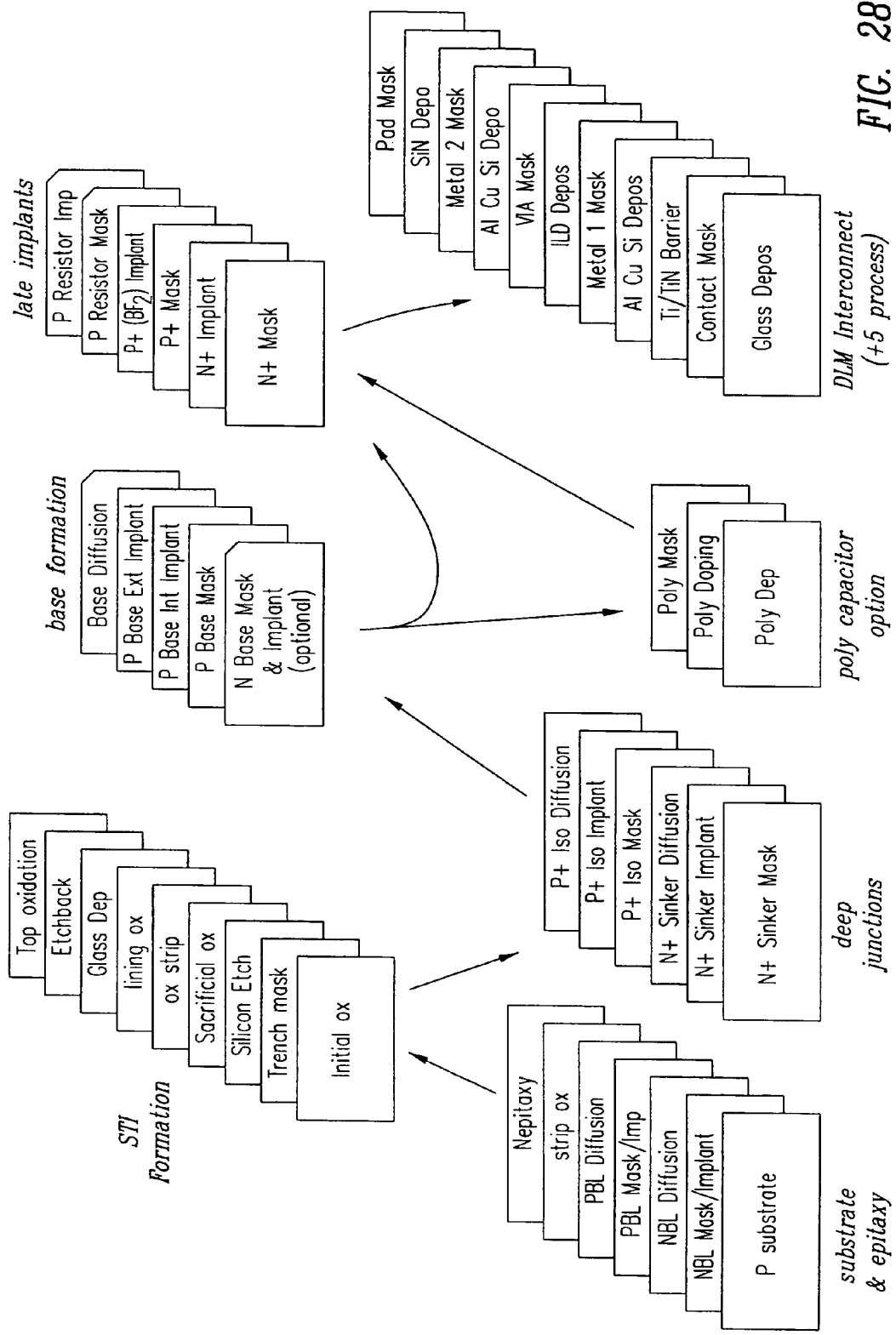
FIG. 28 illustrates a process flow for the construction of complementary analog bipolar transistors.

The process steps described in FIGS. 12-27 are building blocks that can be used in the fabrication of a wide variety of semiconductor devices, including but not limited to bipolar transistors, MOSFETs, diodes, and the like. These process steps include integration of structures using trench constrained diffusions and junctions. FIGS. 28 and 29 illustrate the use of this invention in the construction of complementary (i.e. integration of both NPN and PNP) analog bipolar transistors, but the description of this specific embodiment should not be interpreted as indicating that the invention is so limited. The term "analog" is included only to identify that the purpose of the technology is to produce bipolar devices capable of making high quality current sources (high Early voltage devices) and high breakdown voltages, e.g. greater than 3 or 5V without suffering the problem of BVceo snapback to a sustaining voltage lower than the supply voltage. Of course, the trench constrained diffusion techniques are not limited to the fabrication of analog bipolars, and may be used for digitally optimized bipolars as well.

FIG. 28 provides a general overview of the process. Each of the "cards" represents a process step. Generally speaking, the cards with clipped corners denote steps that are optional, although other steps may also be omitted in particular situations.

The process starts with a series of implants and diffusions into the substrate and the growth of an epitaxial layer on the substrate. Next steps relating to the construction of medium-depth partial trench isolation (PTI) regions are performed. Deep junctions are implanted and diffused ideally using layouts benefiting from trench constrained diffusion, and the base regions of the bipolar transistors are formed. Optionally, a polysilicon capacitor may be constructed. Then come the "late" implants, which form the emitter and collector regions of the transistors. Finally, a double layer metal (DLM) interconnect structure is built above the silicon for providing connections to the regions in the silicon. The so-called "+5 process" refers to the entire DLM interconnect sequence using 5 masks, one to define and etch the contact to the silicon, another for metal 1, a third for the via etch of interlayer dielectric between metal 1 and metal 2, a fourth mask for metal 2, and lastly a mask to etch the passivation layer for bonding pads. So after silicon processing is complete a "+3 process" produces single layer metal (SLM), the so-called "+5 process" results in dual layer metal (DLM), and a "+7 process" results in triple layer metal interconnects. All of these interconnect options are compatible with the process flow as shown, and are mutually compatible with the use of trench constrained junctions and diffusions.

Figure 29A:
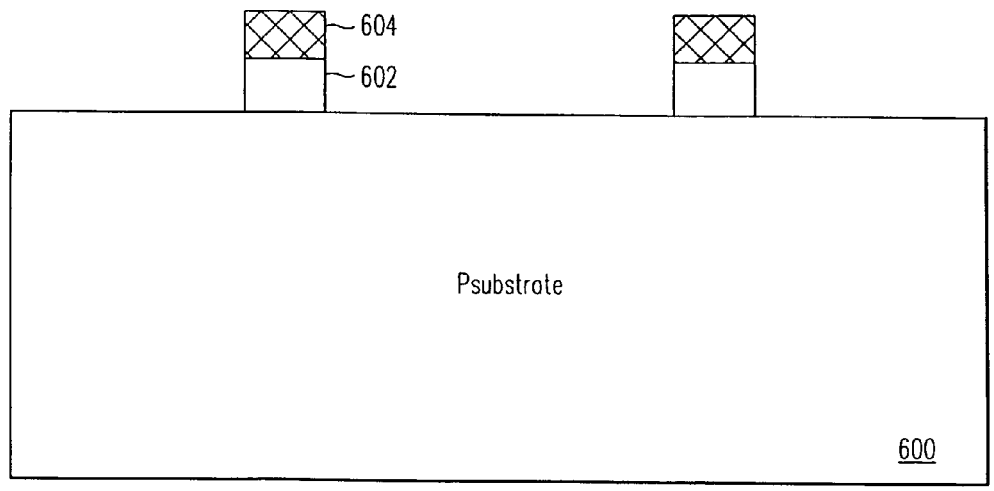
FIGS. 29A-29M illustrate the steps of the process outlined in FIG. 28.
Figure 29B:
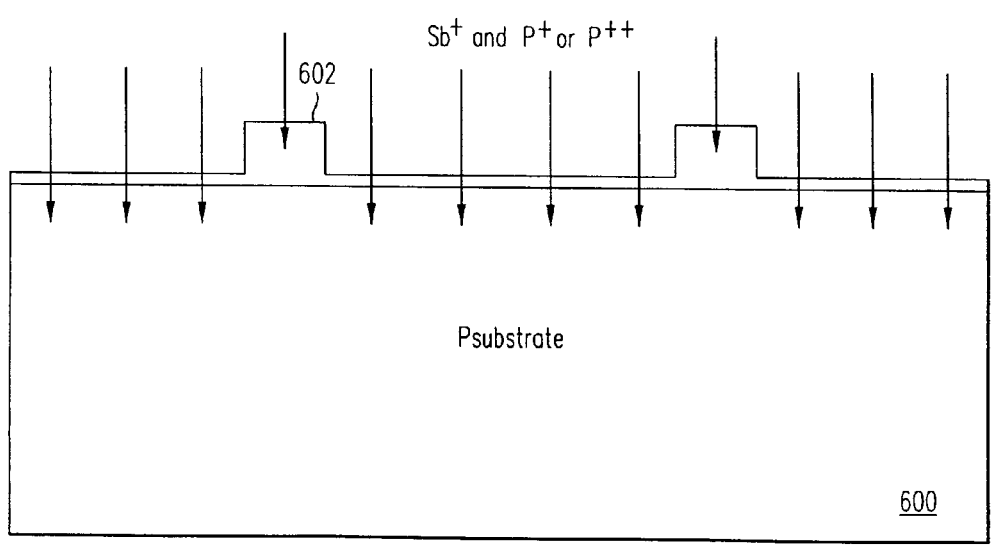

Referring to FIG. 29A, an oxide layer 602 and a photoresist layer 604 are deposited in succession on a P substrate 600, and photoresist layer 604 is patterned and oxide layer 602 is etched through openings in the photoresist layer 604. Photoresist layer 604 is removed, and antimony and single- or double-ionized phosphorus (or a combination of both) are implanted (using conditions comparable to those described above) through the openings in oxide layer 602, as shown in FIG. 29B.

Oxide layer 602 is removed, and the antimony and phosphorus are driven-in for an extended period of time. This causes a new oxide layer 606 to form on the surface of P substrate 600, and an N buried layer 608, broken into sections 608A, 608B and 608C, is formed below the surface of P substrate 600. Sections 608A, 608B and 608C are separated at the locations where oxide layer 602 remained after oxide layer 602 was etched through the openings in photoresist layer 604.

Figure 29C:
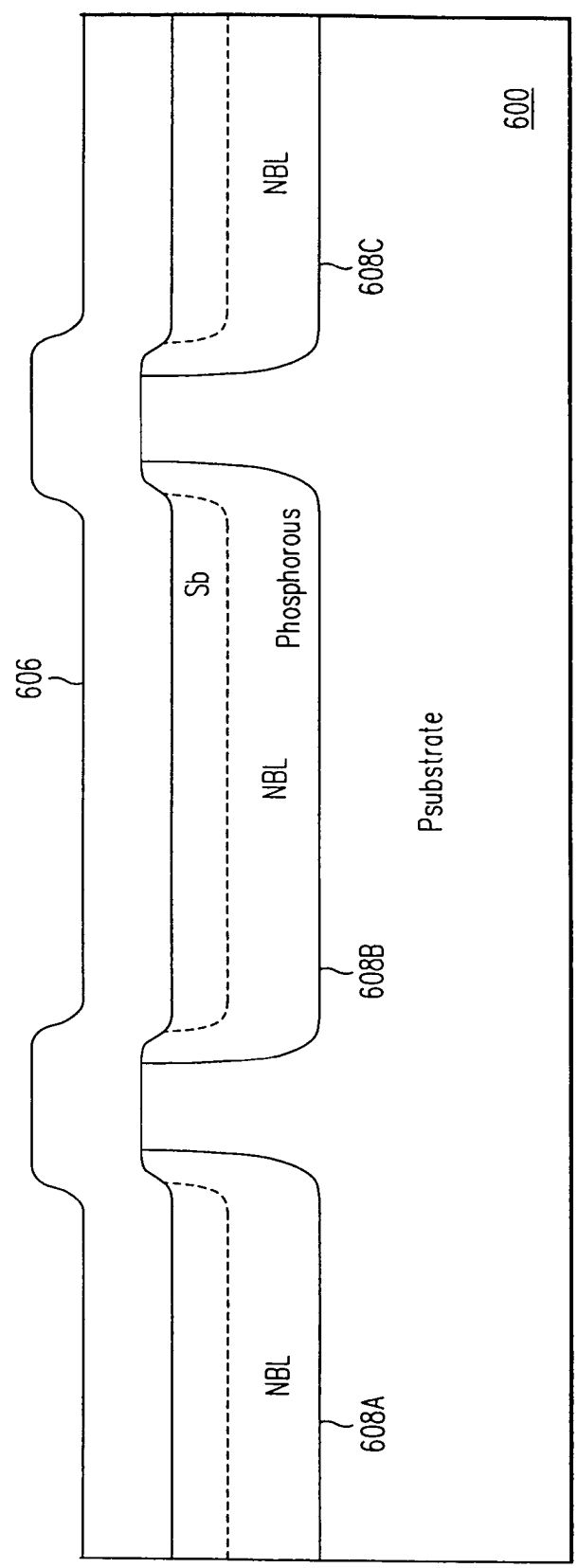
Figure 29D:
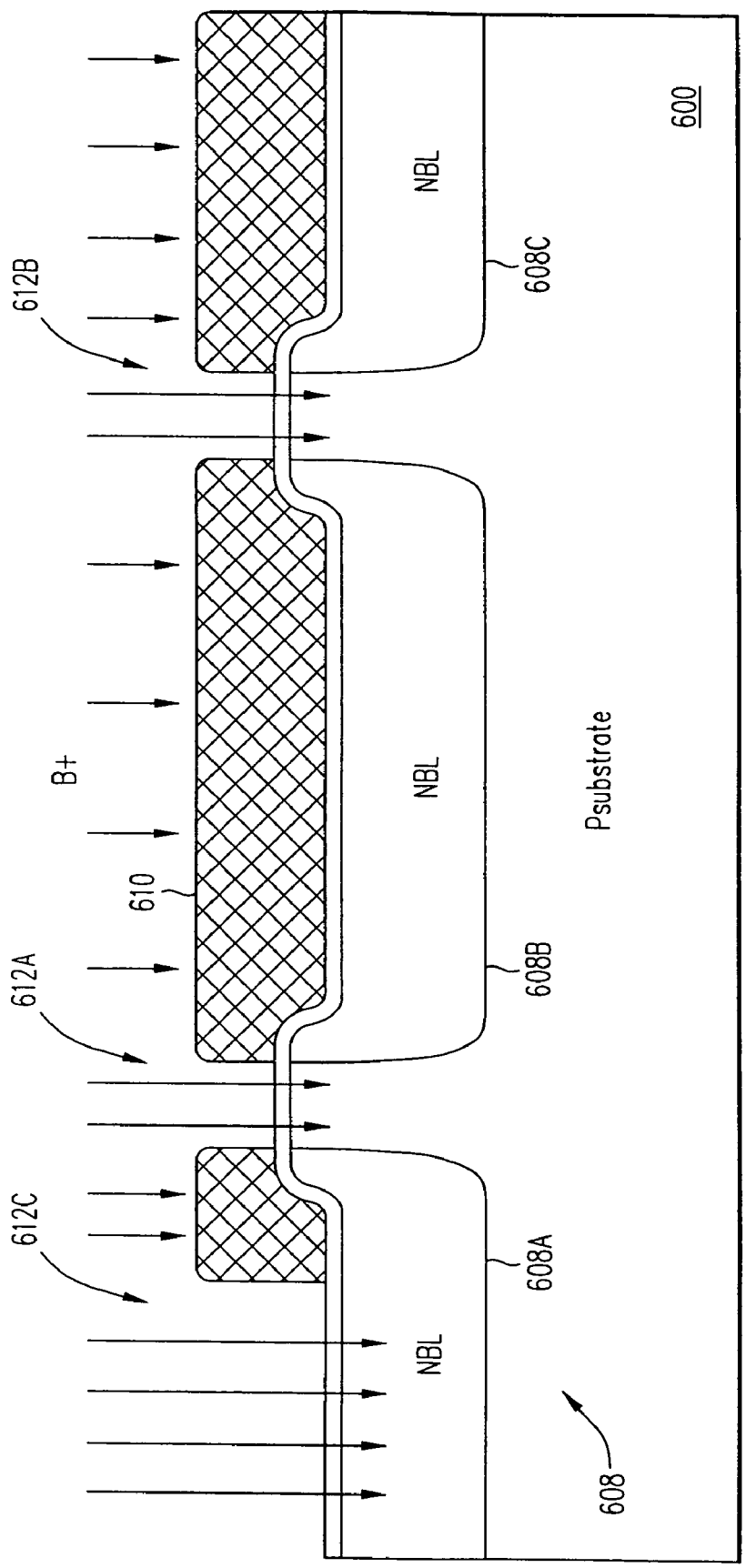

As shown in FIG. 29D, oxide layer 606 is removed, and a photoresist layer 610 is deposited and patterned. Openings 612A and 612B are formed in photoresist layer 610 above gaps separating sections 608A, 608B and 608C of N buried layer 608 and an opening 612C is formed in photoresist layer 610 above section 608A of N buried layer 608. Boron is implanted through openings 612A, 612B and 612C to form sections 614A and 614B of a P buried layer 614 in P substrate 600 (see FIG. 29E). Since phosphorus was used to form N buried layer 608, the dose of the boron implant should be fairly high (e.g., 3E14 to 7E15 $cm^{-2}$) to ensure that the boron overcomes the phosphorus doping in the overlap regions. If only a slow-diffusing dopant such as antimony or arsenic were used to form N buried layer 608, the dose of the boron implant could be reduced possibly to a dose as low as 8E13 $cm^{-2}$. The boron dopant that passes through opening 612C does not counterdope the phosphorus and antimony in N buried layer section 608A and thus is not shown in FIG. 29E.

Figure 29E:
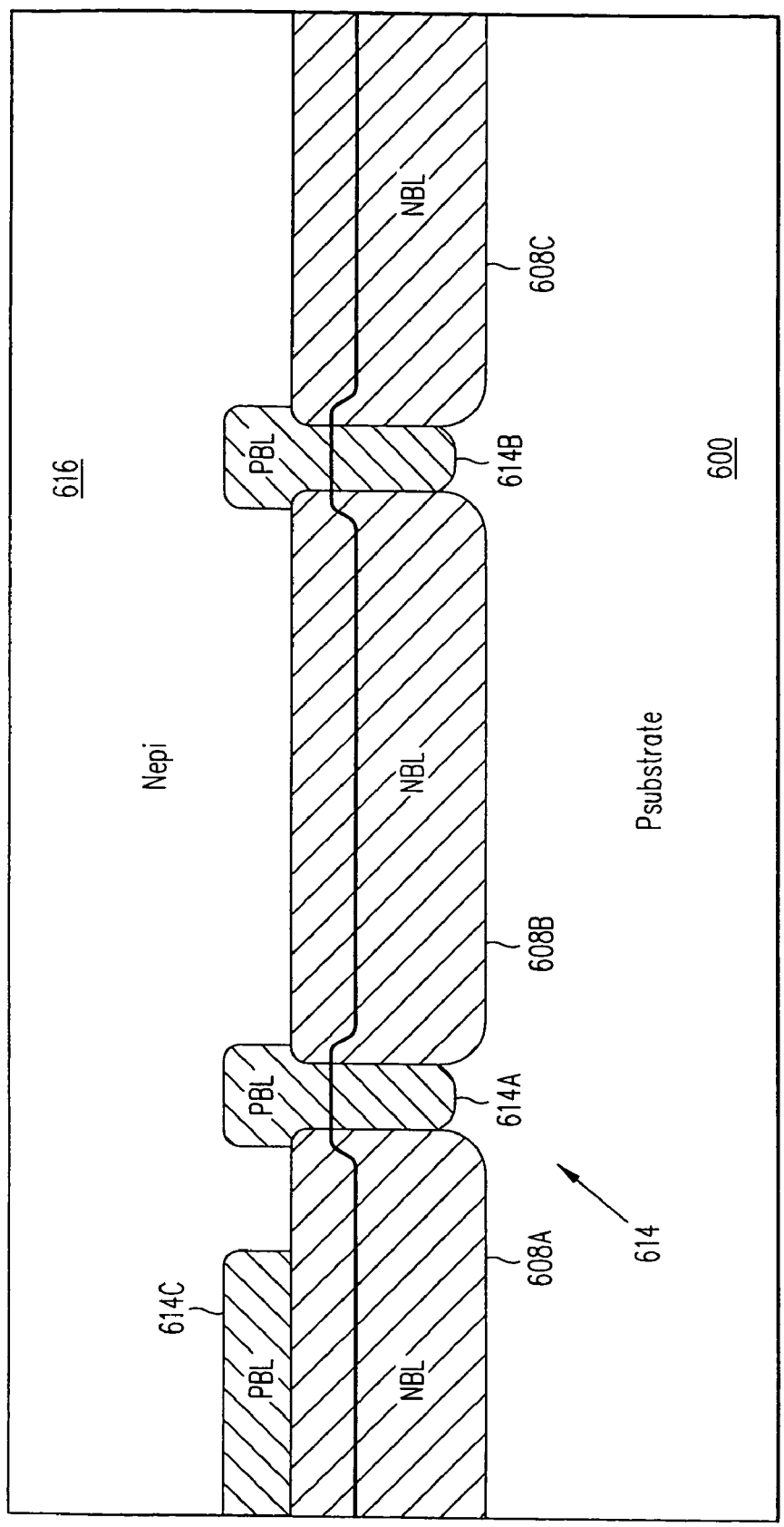

As shown in FIG. 29E, an N epitaxial (epi) layer 616 is grown on top of P substrate 600. During this process, N buried layer 608 and P buried layer 614 diff-use upwards into N epi layer 616. No additional diffusion is required to form this junction since the epitaxial deposition process itself occurs at a high temperature. Since N buried layer 608 includes the fast-diffusing dopant phosphorus, the peak dopant concentration in N buried layer 608 moves substantially downward during the drive-in of the phosphorus and antimony implants in the diffusion performed prior to the epitaxial growth. Therefore, during the updiffusion into N epi layer 616, the boron generally moves ahead of the phosphorus (the boron having both a higher concentration and a higher diffusivity), and P buried layer 614 reaches higher into N epi layer 616 than the phosphorus and antimony dopants of N buried layer 614. Conversely, as shown in FIG. 29E, P buried layer 614 does not extend below the phosphorus/antimony diffusions in P substrate 600. This is important in the case of section 614C of P buried layer 614, since if P buried layer section 614C extends below N buried layer section 608A, the breakdown voltage of the well (to be enclosed by N buried layer section 608A) to the underlying substrate would be reduced (see FIG. 29M).

Figure 29F:
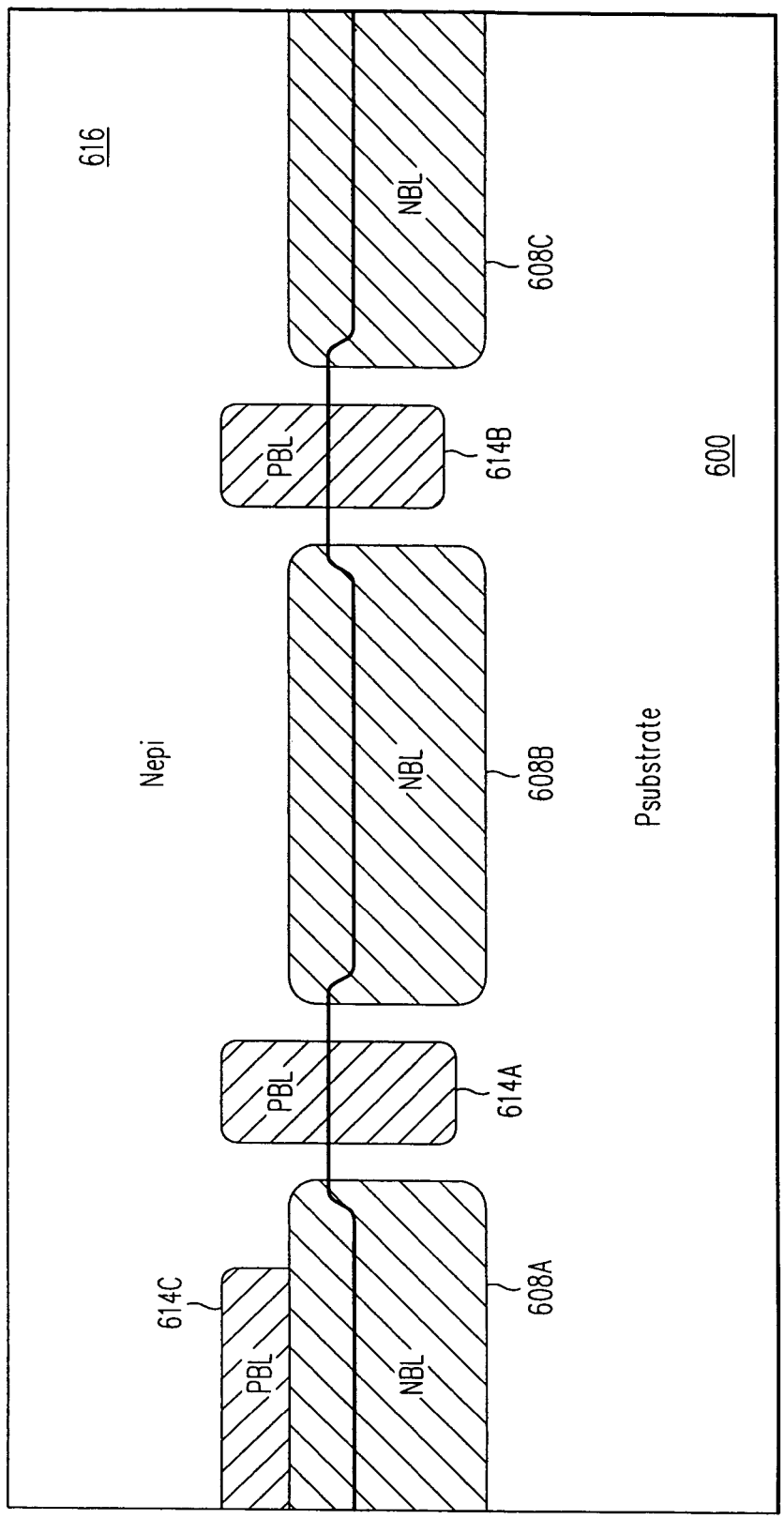

Sections 614A and 614B of P buried layer 618 may touch sections 608A, 608B and 608C of N buried layer 608, as shown in FIG. 29E, or sections 614A and 614B of P buried layer 618 may be separated from sections 608A, 608B and 608C of N buried layer 608, as shown in FIG. 29F. The spacing, or lack thereof, between sections 614A and 614B of P buried layer 618 and sections 608A, 608B and 608C of N buried layer 608 is controlled by varying the width of openings 612A and 612B in photoresist layer 610 (see FIG. 29D). In the remainder of this discussion it will be assumed that the width of openings 612A and 612B was set so as to yield the embodiment shown in FIG. 29F.

Figure 29G:
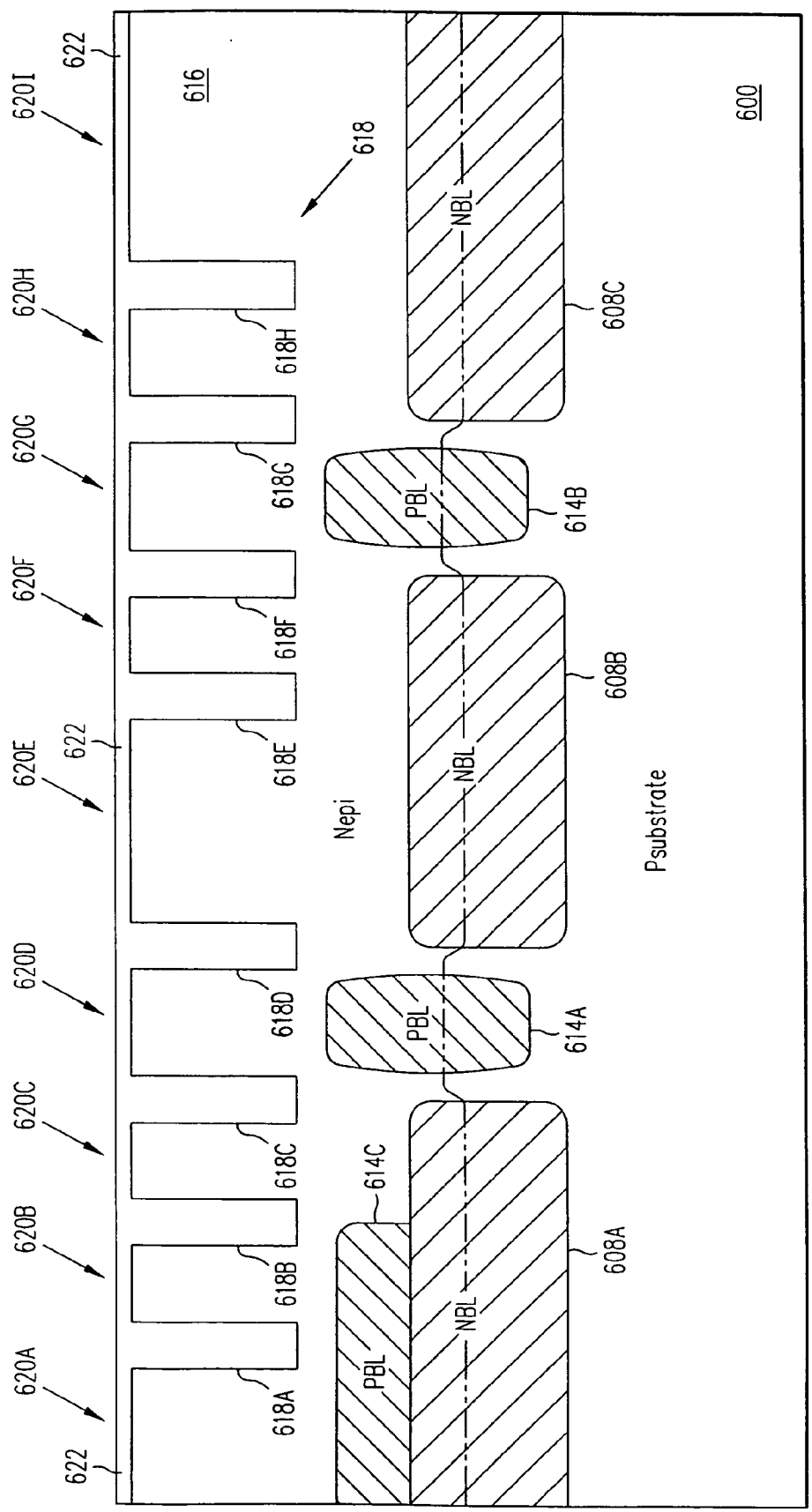

As shown in FIG. 29G, trenches 618 are formed in N epi layer 616 and filled with an oxide layer 622, preferably using the process shown in FIGS. 27A-27I. Trenches 618 form intervening mesas 620A-620I in N epi layer 616. In this embodiment, trenches 618 do not extend as deep as the upper boundary of P buried layer 614. In other embodiments, the trenches could extend into P buried layer 614, but they should not extend entirely through P buried layer 614 or entirely through N epi layer 616 into the P substrate 600. Trenches 618 are preferably in the range of 0.8 to 1.2 μm wide although more narrow trenches may be used.

As is evident from FIG. 29G, some of trenches 618 are aligned to the vertical edge of sections 614A, 614B and 614C of P buried layer 614. In particular, trench 618B is aligned to an edge of section 614A, trenches 618C and 618D are aligned to the opposite edges of section 614B, and trenches 618F and 618G are aligned to the opposite edges of section 614C. Consequently, mesa 620B is above section 614C, mesa 620D is above section 614A, and mesa 620G is above section 614B. These alignments are made using indentations formed in the top surface of P substrate 600 by the oxide layers that are grown during the implanting of the buried layers. The "image" of these indentations can be seen through the thin epitaxial layer by mask aligner machines, using infrared light at a frequency where silicon is somewhat transparent. While the "image" is somewhat blurred from the dispersal of the epitaxial layer, it is sufficiently clear to achieve good mask-to-buried layer alignment. FIG. 29C, for example, shows edges formed in P substrate 600 during the formation of N buried layer 608 prior to epi growth. These edges, while covered by silicon during the growth of N epi layer 616, still can be seen at the bottom edge of the epi, at the substrate-epi interface, by infrared light. The techniques employed in aligning features on the surface of an epi layer to buried layers are well known to those skilled in the art and thus will not be described in further detail here.

The depth of trench 618 as shown in FIG. 29G is illustrated to be roughly half the thickness of epi layer 616, but it may extend deeper or be made more shallow according to the process requirements. Most importantly, it does not extend completely through the epitaxial layer, i.e. the trench is not as deep as the epitaxy is thick, and so it should not be considered as deep trench isolation or an equivalent thereof. As shown in FIG. 29G, the trench at the time it is etched and filled has a depth that nearly overlaps onto but in fact is spaced from P buried layer 614C. Later in subsequent thermal processing the PBL 614C layer will updiffuse and may overlap with trench 618, although that outcome is not mandated by the process flow.

Figure 29H:
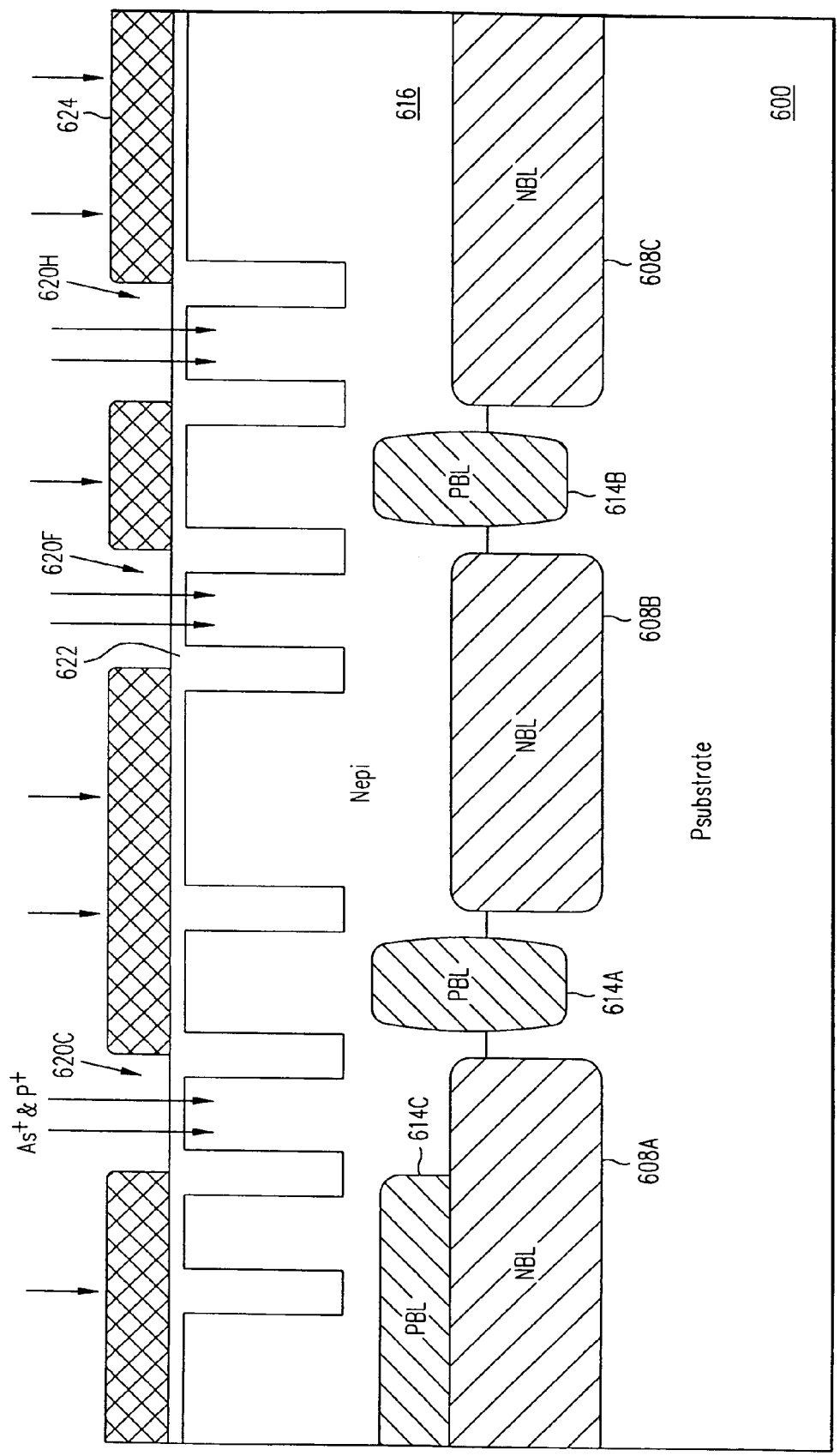
Figure 29I:
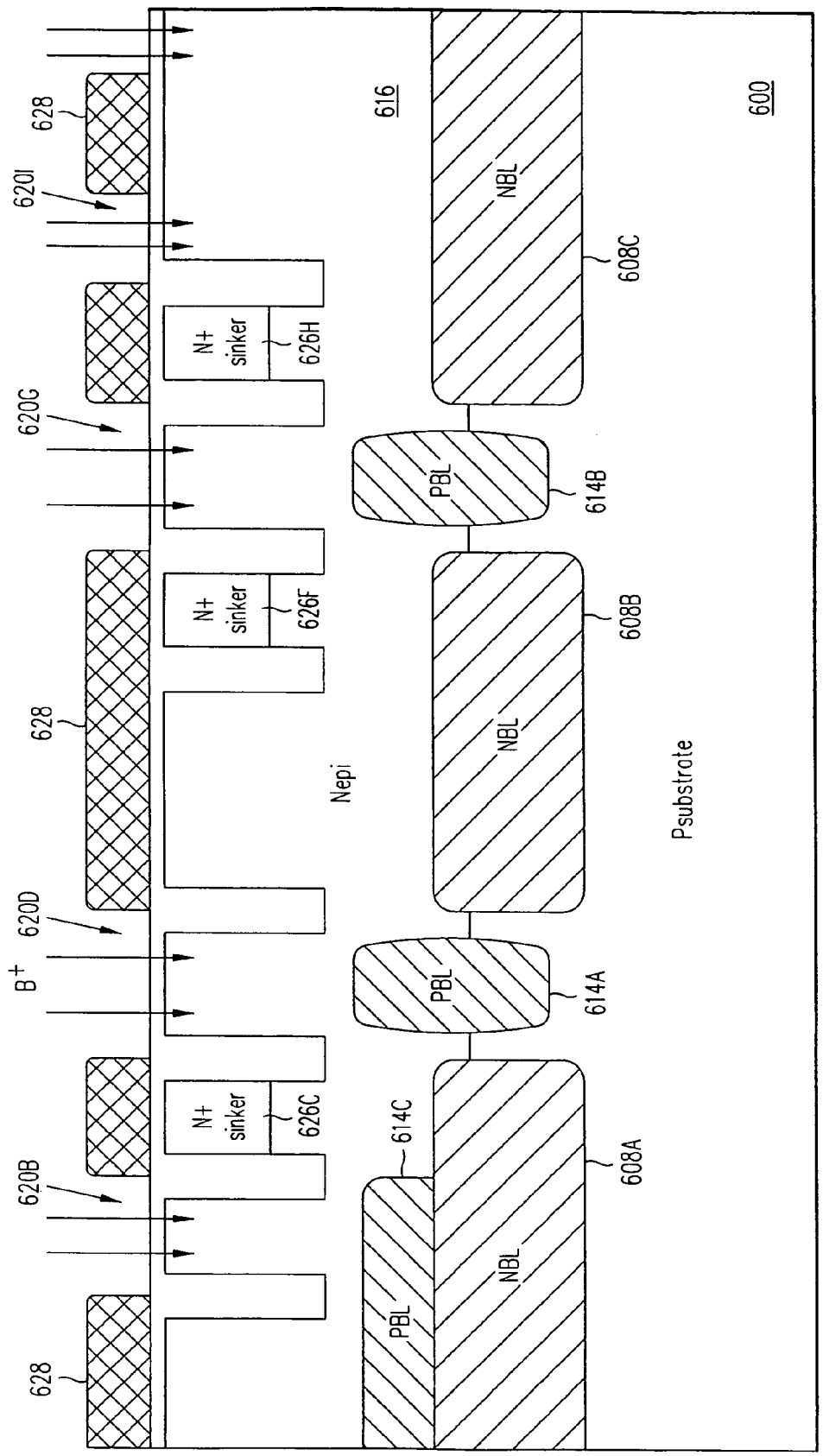

As shown in FIG. 29H, a photoresist layer 624 is formed on the surface of oxide layer 622 and patterned with openings over mesas 620C, 620F and 620H. Arsenic and phosphorus are implanted through the openings in photoresist layer 624 to form N+ sinkers 626C, 626F and 626H in mesas 620C, 620F and 620H, respectively, as shown in FIG. 29I. The phosphorus diffuses rapidly and the arsenic diffuses more slowly and thus the combination of these two dopants levels out the dopant profile of N+ sinkers 626C, 626F and 626H. The hybrid implant comprising both arsenic and phosphorus involves two dopants with substantially different diffusivities. The faster phosphorus may be more lightly doped than the arsenic (e.g. at 7E13 cm$^{-2}$ instead of 2E15 cm$^{-2}$) so that the phosphorus does not extend too deeply into the silicon during the subsequent thermal processing.

Photoresist layer 624 is then stripped, and the N-type sinker diffusant may be partially diffused using a high temperature diffusion process at 1000° C. to 1200° C. but preferably at between 1100° C. and 1150° C. for 1 to 7 hours. Alternatively, the diffusion can be skipped altogether, or the implant and anneal replaced by a predeposition of phosphorus (using a gaseous source such as POCL$_3$). Predeposition is known in the art and will not be further elaborated upon herein.

Next, a photoresist layer 628 is formed on the surface of oxide layer 622 and patterned with openings over mesas 620B, 620D, 620G and 620I. Boron is implanted through the openings in photoresist layer 628 to form P+ isolation regions 630B, 630D, 630G and 630I/630I' in mesas 620B, 620D, 620G and 620I, respectively. Photoresist layer 628 is removed.

The structure is now annealed to drive in the N+ and P+ dopants (herein referred to as the isolation diffusion). As a result of the anneal, P+ isolation region 630B merges with P buried layer 614C, N+ sinker 626C merges with N buried layer 608A, P+ isolation region merges with P buried layer 614A, N+ sinker 626F merges with N buried layer 608B, P+ isolation region 630G merges with P buried layer 614B, and N+ sinker 626H merges with N buried layer 608C. P+ isolation regions 630I and 630I' diffuse downward but do not merge with any other regions. The combination of P+ isolation region 630D and P buried layer 614A and the combination of P+ isolation region 630G and P buried layer 614B form columns of P-type dopant, laterally constrained at the top by trenches 618 that extend into P substrate 600 and isolate the devices formed in N epi layer 616 from each other. The resulting structure is shown in FIG. 29J (except that the PB region 638 and NB region 632 has not yet been formed).

In this process flow, the order of the boron isolation, the phosphorus sinkers and the various drive-in diffusions may be changed without substantially changing the resulting device (so long as the total thermal budget, temperature-time cycle, up to this point remains fixed) For example, the boron isolation can precede the N sinker implants which may (or may not) employ a post implant partial drive diffusion.

Another alternative is to implant the isolation or the sinker or both using high energy ion implantation with implants up to 3 MeV (but preferably with several implants of differing energy from 0.5 MeV up to 2 MeV), whereby the deeper junction after implantation (already more than 2.5 μm) requires less diffusion time and temperature than the low-implant energy deep-diffused version of the same.

Figure 29J:
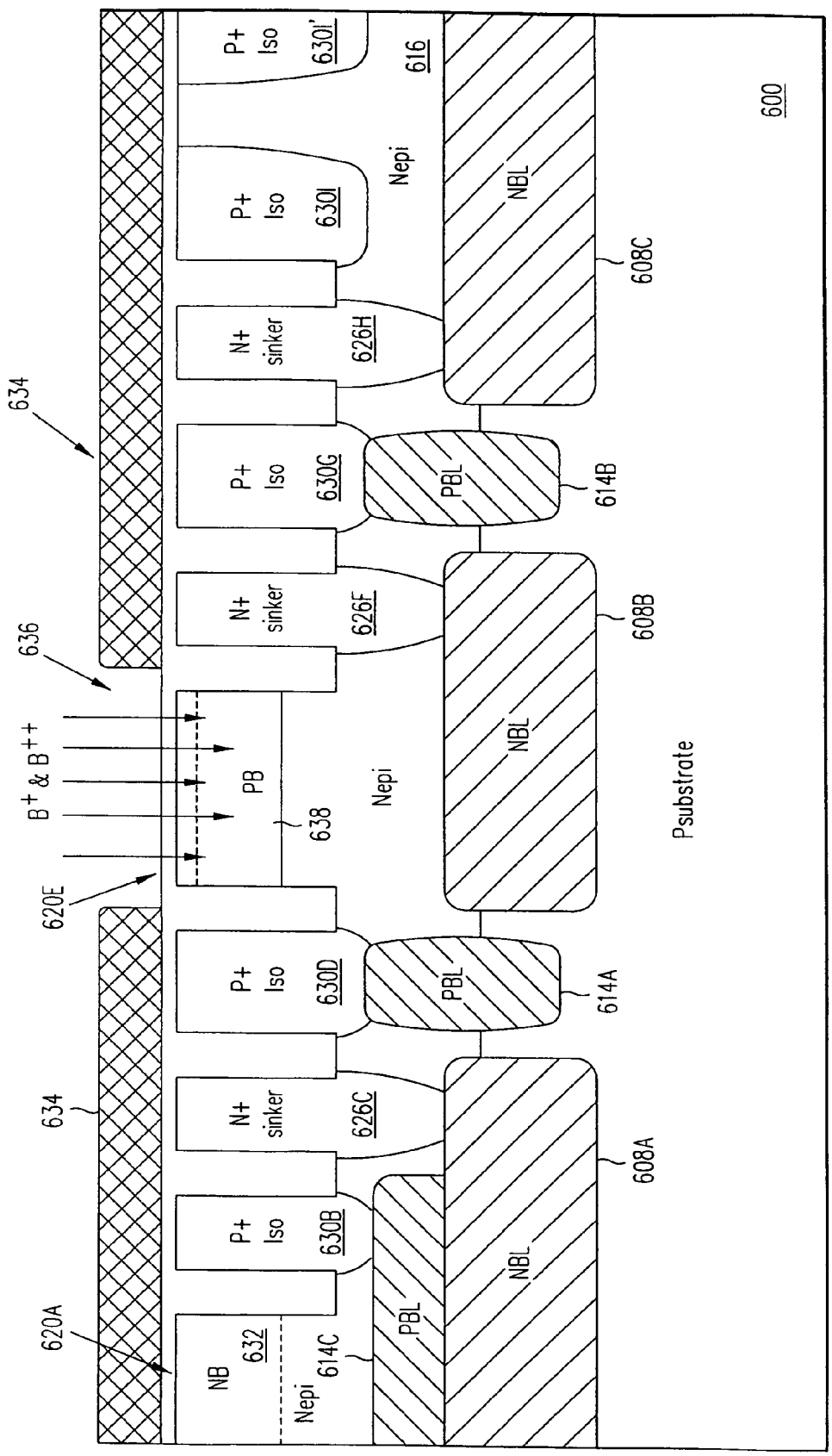

In FIG. 29J the N-type diffusions (N sinkers and N buried layers) are shown as spaced from the P-type diffusions (P isolation regions and P buried layers). Even if there were contact between the N-type diffusions and P-type diffusions (as in the embodiment shown in FIG. 29E), this contact could only take place below trenches 618, where the doping concentrations are relatively low. The breakdown voltage of any PN junctions formed in this way would be relatively high, especially compared to the surface junction that would be formed if the trench were not there. In other words, the N sinkers and P isolation regions are separated by trenches 618 near the surface of N epi layer 616, where the doping concentrations of these diffusions are high enough to create low breakdown voltages. Lower in N epi layer 616, where there could be contact between the N sinkers and P isolation regions (or the corresponding N and P buried layers), the doping concentrations of these diffusions are relatively low (and more graded or diffuse) and hence the breakdown voltages across any PN junctions that might be formed would be relatively high.

The surface of N epi layer 616 is masked (not shown) and an N-type dopant such as phosphorus is implanted through an opening in the mask to form an N base region 632, shown in FIG. 29J. The phosphorus implant can range from 60 keV to as high as 2 MeV. The lower range of implant energies typically requires either a drive-in diffusion later in the process (for a final junction depth of 0.5 µm to 2.5 µm), or the use of a polysilicon emitter (for a junction depth under 0.5 µm). Higher energy implants require little or no diffusion. Implant doses range from $3E13$ $cm^{-2}$ to $2E14$ $cm^{-2}$. The photoresist mask is stripped and photoresist layer 634 is deposited and patterned to form an opening 636. Boron ($B^+$ and/or $B^{++}$) is implanted through opening 636 to form a P base region 638 in mesa 620E. The deeper implant of boron, referred to as the intrinsic base may range in dose from $3E13$ $cm^{-2}$ to $2E14$ $cm^{-2}$ with implant energies ranging from 90 keV to 2 MeV. The lower range of implant energies typically requires either a drive-in diffusion later in the process (for a final junction depth of 0.5 µm to 2.5 µm), or the use of a polysilicon emitter (for a junction depth under 0.5 µm). Higher energy implants require little or no diffusion. Intrinsic implant doses range from $3E13$ $cm^{-2}$ to $2E14$ $cm^{-2}$.

As indicated by the dashed line, P base region 638 is preferably formed by the superposition of two implants, a low energy implant that creates a low resistance area near the surface of N epi layer 616 (called an extrinsic base implant) and a higher energy implant that penetrates deeper into N epi layer 616 (the aforementioned intrinsic base implant). The extrinsic base implant is typically a $B^+$ or $BF_2^+$ species performed at an energy of 30 to 60 keV with a dose greater than $5E14$ $cm^{-2}$. The use of the extrinsic implant has limited use if appreciable base diffusion is performed. For shallow junction devices, it greatly enhances performance.

In the event that the N base region 632 or the P base region 638 are formed using significant diffusion time at high temperatures instead of using higher implant energies, then the hot time must be removed from the sinker and isolation diffusions.

Figure 29K:
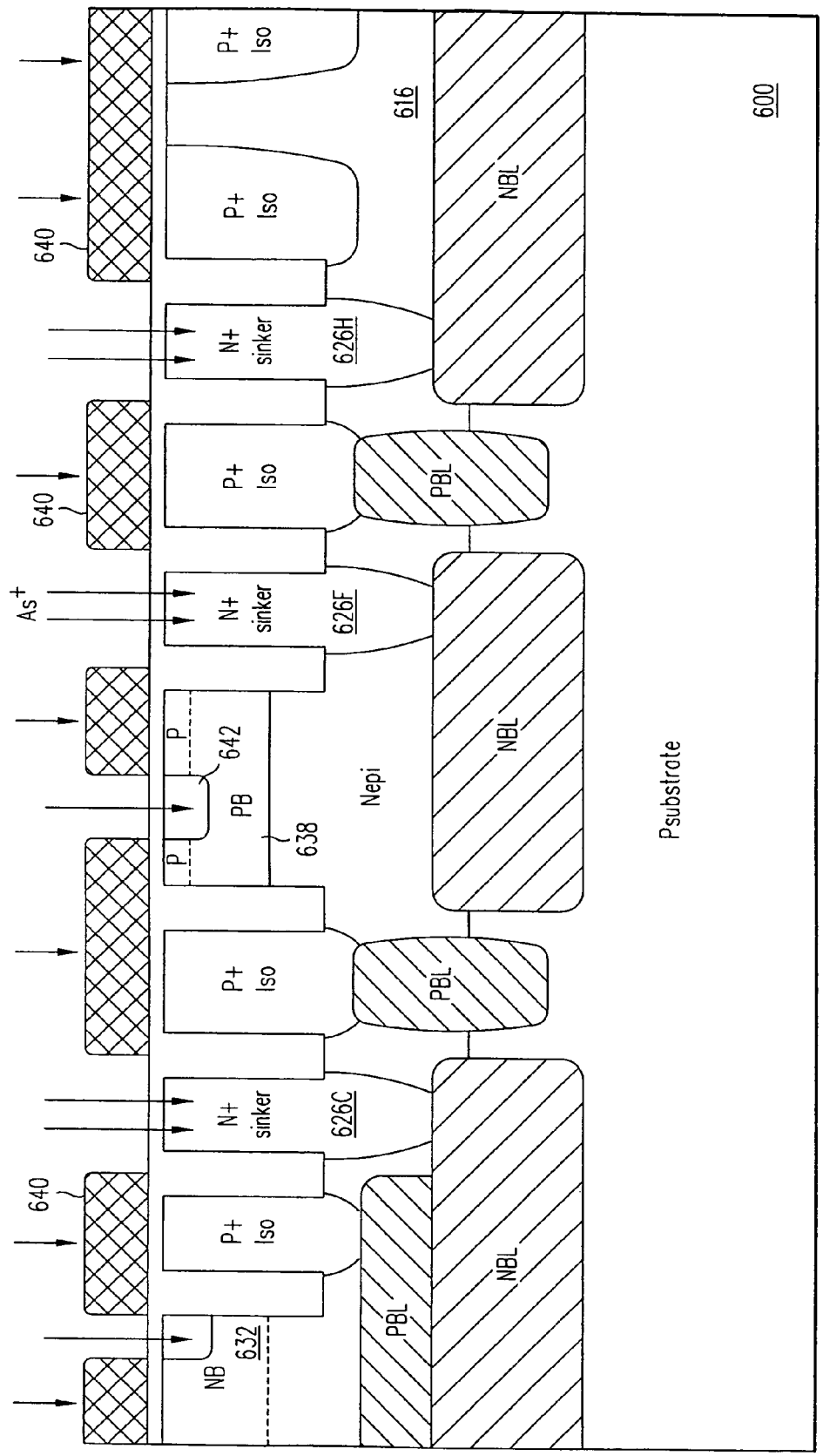

After implanting the two base regions, photoresist layer 634 is removed and a photoresist layer 640 is deposited and patterned to form a series of openings, as shown in FIG. 29K. Arsenic is implanted through the openings in photoresist layer 640 to form contact regions in N base 632 and in N sinkers 626C, 626F and 626H and to form an N emitter region 642 in P base region 638. N emitter region 642 extends below the heavily doped surface region of P base region 638 (indicated by the dashed line) so that the electrical characteristics of the base are determined by the more lightly doped portion below N emitter region 642, conducting vertically through the intrinsic base. The N+ implants may be phosphorus at 30 keV to 50 keV, or preferably arsenic at 60 keV to 120 keV, at a dose of $2E15$ $cm^{-2}$ to $7E15$ $cm^{-2}$.

Figure 29L:
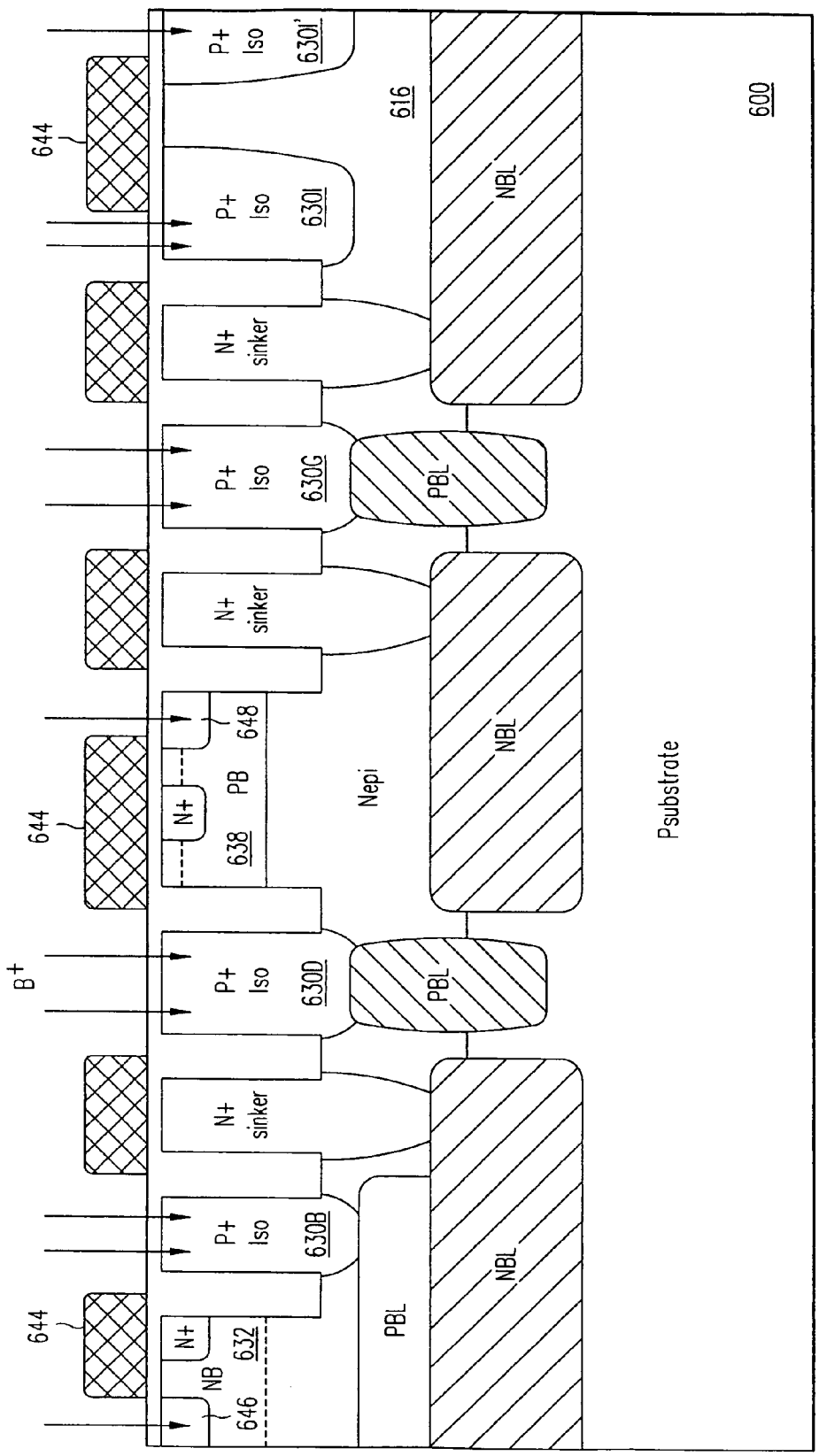

Photoresist layer 640 is removed and a photoresist layer 644 is deposited and patterned to form a series of openings, as shown in FIG. 29L. Boron is implanted through the openings in photoresist layer 644 to form contact regions in P isolation regions 630B, 630D, 630G, 630I and 630I', to form a P emitter region 646 in N base region 632, and to form a contact region 648 in P base region 638. The P+ implants may be boron at 30 keV to 50 keV, or preferably $BF_2^+$ at 60 keV to 120 keV, at a dose of $2E15$ $cm^{-2}$ to $7E15$ $cm^{-2}$. Photoresist layer 644 is then removed.

Figure 29M:
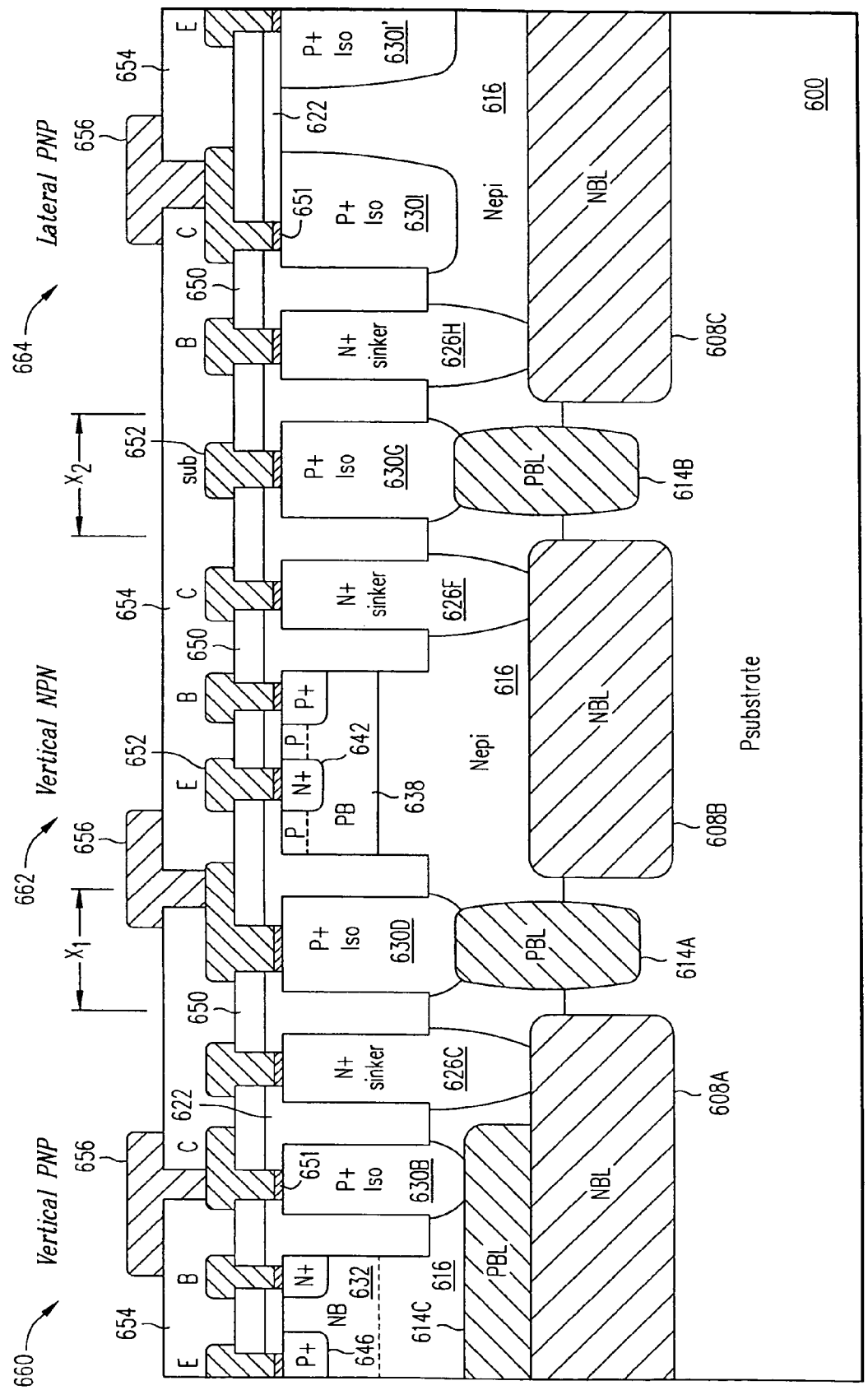

As shown in FIG. 29M, a dielectric layer 650 is deposited on oxide layer 622. Dielectric layer 650 is masked, and electric layer 650 and oxide layer 622 are etched through openings in the mask to form openings to the various regions in N epi layer 616. A Ti or TiN barrier layer 651 is deposited in the openings, and a first metal layer 652 is deposited over barrier layer 651 and patterned to form metal contacts. A second dielectric layer 654 is deposited on dielectric layer 650, and a via mask is applied with openings positioned to make contact to P isolation regions 630B, 630D and 630I. Vias are etched in dielectric layer 654 through the openings in the via mask, and a second metal layer 656 is deposited in the vias.

At the conclusion of this process a vertical PNP transistor 660, a vertical NPN transistor 662, and a lateral PNP transistor 664 have been formed in N epi layer 616. Vertical PNP transistor 660 includes the following regions:

| | |
|---|---|
| Emitter: | P+ region 646 |
| Base: | N base region 632 and a portion of N epi layer 616 |
| Collector: | P buried layer 614C and P isolation region 630B |

Vertical PNP transistor 660 is isolated from P substrate 600 by an isolation structure that includes N buried layer 608A and N sinker 626C.

Vertical NPN transistor 662 includes the following regions:

| | |
|---|---|
| Emitter: | N+ region 642 |
| Base: | P base region 638 |
| Collector: | A portion of N epi layer 616, N buried layer 608B, N sinker 626F |

Lateral PNP transistor 664 includes the following regions:

| | |
|---|---|
| Emitter: | P isolation region 630I' |
| Base: | A portion of N epi layer 616, N buried layer 608C, N sinker 626H |
| Collector: | P isolation region 630I |

In addition, vertical PNP transistor 660 is isolated from vertical NPN transistor 662 by a vertical column that includes P isolation region 630D and P buried layer 614A. Vertical NPN transistor 662 is isolated from lateral PNP transistor 664 by a vertical column that includes P isolation region 630G and P buried layer 614B.

Using prior art processes, transistors 660, 662 and 664 would typically have to be spaced from each other by tens of microns because of lateral dopant-spreading during the thermal processes. In contrast, using the laterally-constrained sinkers and isolation regions of this invention, the spacing between transistors 660 662 and 664, shown as $X_1$ and $X_2$ in FIG. 29M, can be reduced to only 3 to 4 microns. This allows a large increase in the packing density of the devices on the wafer without sacrificing the quality of the electrical isolation among the devices.

Figure 30:
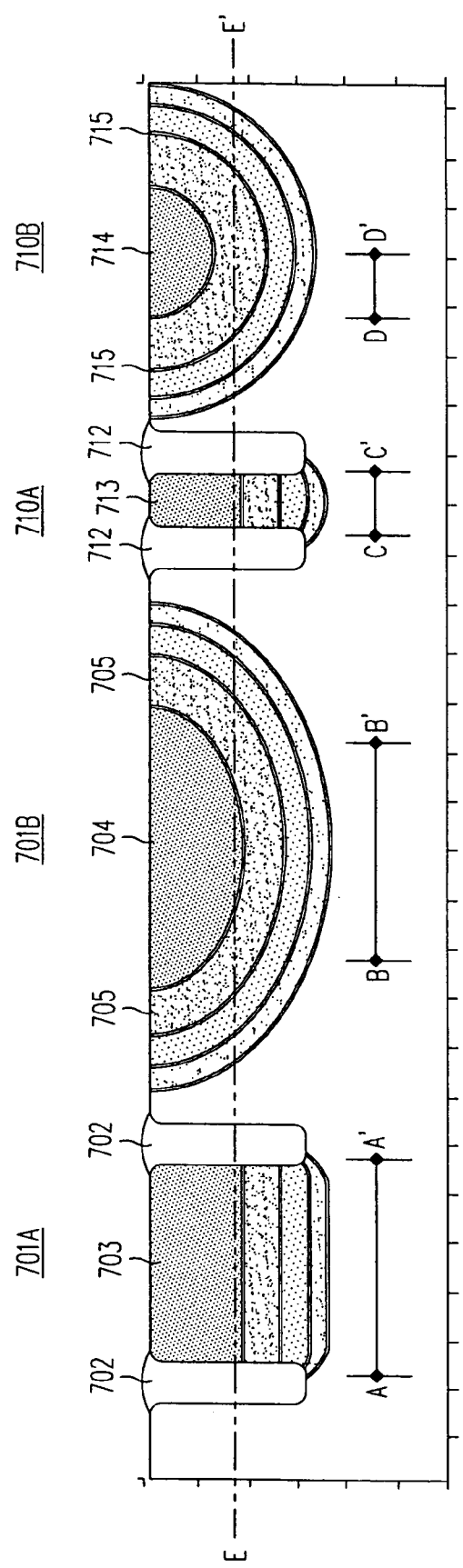
FIG. 30 compares unconstrained versus trench-constrained diffusions, for both narrow and wide feature sizes.

FIG. 30 illustrates the benefit of trench constrained diffusion for reducing lateral spacings, especially in small-featuresize deep diffusions. The drawing illustrates four diffused regions, each starting with the same shallow ion implantation (all at a dose of 8E13 cm$^{-2}$ and an energy of 80 keV) followed by identical diffusions (4 hours at 1100° C.). The marks on the vertical and lateral scales are at 0.5 µm increments. The shades of gray indicate order-of-magnitude differences in the final doping concentrations.

In wide trench-constrained diffusion 701A, the implanted region spans the width between trenches 702 resulting in diffusion 703 having a width of 2 µm (as denoted by line A-A'). The heaviest doped portion diffuses down to a depth of 1 µm, as denoted by line E-E'. Notice that the diffusion extends to just below the trench at a depth less than 2 µm, but the heavily doped portion extends only down to the E-E' line.

Diffusion 701B is an example of a wide unconstrained diffusion comprising a diffusion 704 constructed from an implant having a width of 2 µm (designated by line B-B', identical in length to line A-A'). After the high temperature drive-in, region 704 diffuses, with its heavily doped portion reaching a depth of 1 µm identified by line E-E', and with lateral diffusions 705 expanding the width of the diffusion well beyond the 2 µm width of the implant. Lateral diffusions 705 typically exhibit a lateral extent equal to 85% of the junction depth. Since the width of the opening in the mask used to define the implant is wider than the depth of the heavily-doped portion of diffusion 704, conventional diffusion 701B has essentially the same depth as the constrained diffusion 701A.

Diffusion 710A is an example of a narrow diffusion constrained by trenches 712. The implant 713 extends from trench to trench as designated by the length of line C-C', having a width of about 0.5 µm. Even though the width of the diffusion 710A is less than the depth of the diffusion, junction 713 has a depth clearly equal to (if not slightly greater than) wide diffusions 701A and 701B, and therefore does not exhibit starved diffusion. Despite its depth, trench constrained diffusion 713 also has a very narrow width.

Diffusion 710B, is an example of a narrow unconstrained diffusions, wherein the penalty of two-dimensional diffusion, so-called "starved diffusion", becomes evident. Not only does diffused region 714 spread laterally into regions 715 but the heavily doped portion of diffusion 714 does not even diffuse deep enough to cross line E-E'. In fact it is the large lateral component of diffusion that changes the diffusion from one dimensional into two dimensional, making a point source. Comparing 710A to 710B, the trench constrained diffusion is deeper, more heavily doped, and much narrower, all of which are desirable traits in implementing integrated circuit components.

We claim:

1. A semiconductor structure comprising:
   a semiconductor substrate of a first conductivity type;
   an epitaxial layer of said first conductivity type formed over said substrate;
   a trench formed in said epitaxial layer, said trench having a bottom in said epitaxial layer above an interface between said epitaxial layer and said substrate, said trench containing a dielectric material;
   a region of a second conductivity type abutting a side of said trench;
   a second trench formed in said epitaxial layer, said second trench having a bottom in said epitaxial layer above said interface between said epitaxial layer and said substrate, said second trench containing a dielectric material, said region abutting a side of said second trench; and
   a buried layer of said second conductivity type, said buried layer extending upward from said substrate and merging with said region.

2. The semiconductor structure of claim 1 where said buried layer merges with said region at a level in said epitaxial layer below a level of the bottom of each of said trenches.

3. The semiconductor structure of claim 2 wherein said buried layer extends laterally beyond one of said trenches.

4. The semiconductor structure of claim 2 wherein said buried layer extends laterally beyond both of said trenches.

5. A semiconductor structure comprising:
   a semiconductor substrate;
   an epitaxial layer of a first conductivity type formed over said substrate;
   first and second trenches formed in said epitaxial layer, each of said trenches having a bottom in said epitaxial layer above an interface between said epitaxial layer and said substrate, each of said trenches containing a dielectric material;
   a region of said first conductivity type having a doping concentration greater than a doping concentration of said epitaxial layer, said region being located between said trenches and abutting a side of each of said trenches.

6. The semiconductor structure of claim 5 wherein said region extends to a level in said epitaxial layer below a level of the bottom of each of said trenches.

7. The semiconductor structure of claim 5 wherein said substrate is of a second conductivity type.

8. The semiconductor structure of claim 5 comprising a buried layer of said first conductivity type at an interface between said epitaxial layer and said substrate.

9. The semiconductor structure of claim 8 wherein said buried layer merges with said region.

10. The semiconductor structure of claim 9 wherein a line of merger between said buried layer and said region is at a level below a level of the bottom of each of said trenches.

11. The semiconductor structure of claim 9 wherein a line of merger between said buried layer and said region is at a level above a level of the bottom of each of said trenches.

12. The semiconductor structure of claim 9 wherein said buried layer extends laterally beyond one of said trenches.

13. The semiconductor structure of claim 12 wherein a line of merger between said buried layer and said region is at a level below a level of the bottom of each of said trenches.

14. The semiconductor structure of claim 12 wherein a line of merger between said buried layer and said region is at a level above a level of the bottom of each of said trenches.

15. The semiconductor structure of claim 9 wherein said buried layer extends laterally beyond both of said trenches.

* * * * *